US010291901B2

(12) United States Patent
Ishiga

(10) Patent No.: US 10,291,901 B2
(45) Date of Patent: May 14, 2019

(54) IMAGE SENSOR, IMAGING DEVICE AND IMAGE PROCESSING DEVICE THAT GENERATE PARALLAX IMAGES IN BOTH VISIBLE AND INVISIBLE WAVELENGTH BANDS

(71) Applicant: NIKON CORPORATION, Tokyo (JP)

(72) Inventor: Kenichi Ishiga, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 200 days.

(21) Appl. No.: 15/285,050

(22) Filed: Oct. 4, 2016

(65) Prior Publication Data

US 2017/0026632 A1 Jan. 26, 2017

Related U.S. Application Data

(63) Continuation of application No. PCT/JP2015/060715, filed on Apr. 6, 2015.

(30) Foreign Application Priority Data

Apr. 4, 2014 (JP) .................................. 2014-077852
Apr. 4, 2014 (JP) .................................. 2014-077853
Apr. 4, 2014 (JP) .................................. 2014-077854

(51) Int. Cl.
*H04N 13/214* (2018.01)
*H04N 13/25* (2018.01)
(Continued)

(52) U.S. Cl.
CPC ............. *H04N 13/214* (2018.05); *G02B 7/34* (2013.01); *G03B 13/36* (2013.01);
(Continued)

(58) Field of Classification Search
CPC .......... G02B 5/201; G02B 7/34; G03B 13/36; G03B 35/08; H01L 27/14623;
(Continued)

(56) References Cited

U.S. PATENT DOCUMENTS 5,541,653 A 7/1996 Peters et al.
7,236,628 B2 6/2007 Chen et al.
(Continued)

FOREIGN PATENT DOCUMENTS

JP 2003-7994 A 1/2003
JP 2011-50049 A 3/2011
(Continued)

OTHER PUBLICATIONS

Oct. 24, 2017 Office Action Issued in Japanese Patent Application No. 2016-511655.
(Continued)

*Primary Examiner* — Francis Geroleo
(74) *Attorney, Agent, or Firm* — Oliff PLC

(57) ABSTRACT

Reception of the invisible light wavelength band in an incident luminous flux has not been considered. In view of this, an image sensor is provided, the image sensor including: a visible parallax pixel that is associated with a visible range light-receiving photoelectric conversion pixel having any of a plurality of types of aperture mask each including an aperture that is positioned to allow passage, to a photoelectric converting element, of a mutually different partial luminous flux of an incident luminous flux in a visible light wavelength band; and an invisible parallax pixel that is associated with an invisible range light-receiving photoelectric conversion pixel having any of a plurality of types of aperture mask each including an aperture positioned to allow passage, to the photoelectric converting element, of a mutually different partial luminous flux in an incident luminous flux in an invisible light wavelength band.

20 Claims, 14 Drawing Sheets

(51) Int. Cl.
*H04N 13/257* (2018.01)
*H04N 13/296* (2018.01)
*G02B 7/34* (2006.01)
*G03B 13/36* (2006.01)
*H04N 5/33* (2006.01)
*H01L 27/146* (2006.01)
*H04N 13/207* (2018.01)
*H04N 13/271* (2018.01)
*G03B 35/08* (2006.01)
*G02B 5/20* (2006.01)

(52) U.S. Cl.
CPC .. *H01L 27/14623* (2013.01); *H01L 27/14627* (2013.01); *H04N 5/33* (2013.01); *H04N 13/207* (2018.05); *H04N 13/25* (2018.05); *H04N 13/257* (2018.05); *H04N 13/271* (2018.05); *H04N 13/296* (2018.05); *G02B 5/201* (2013.01); *G03B 35/08* (2013.01)

(58) Field of Classification Search
CPC ............ H01L 27/14627; H04N 13/207; H04N 13/214; H04N 13/25; H04N 13/257; H04N 13/271; H04N 13/296; H04N 5/33
See application file for complete search history.

(56) References Cited

U.S. PATENT DOCUMENTS

| | | | |
|---|---|---|---|
| 7,957,588 | B2 | 6/2011 | Ishiga |
| 8,259,213 | B2 | 9/2012 | Ishiga |
| 2011/0069189 | A1* | 3/2011 | Venkataraman ............................. H01L 27/14618 348/218.1 |
| 2014/0055576 | A1* | 2/2014 | Shibazaki .............. G03B 35/10 348/49 |
| 2014/0300750 | A1 | 10/2014 | Nagamune |
| 2014/0375673 | A1 | 12/2014 | Ishiga et al. |
| 2015/0002634 | A1 | 1/2015 | Ishiga et al. |
| 2015/0062307 | A1 | 3/2015 | Ishiga et al. |
| 2015/0103144 | A1 | 4/2015 | Shibazaki et al. |

FOREIGN PATENT DOCUMENTS

| | | |
|---|---|---|
| JP | 2013-175807 A | 9/2013 |
| JP | 2013-255144 A | 12/2013 |
| JP | 2014-060694 A | 4/2014 |
| WO | WO-2012153504 A1 * | 11/2012 ............. G03B 35/10 |

OTHER PUBLICATIONS

Jun. 16, 2015 Written Opinion issued in International Patent Application No. PCT/JP2015/060715.
Jun. 16, 2015 International Search Report issued in International Patent Application No. PCT/JP2015/060715.
Jul. 31, 2018 Office Action issued in Chinese Patent Application No. 20150018356.0.

* cited by examiner

IMAGE SENSOR, IMAGING DEVICE AND IMAGE PROCESSING DEVICE THAT GENERATE PARALLAX IMAGES IN BOTH VISIBLE AND INVISIBLE WAVELENGTH BANDS

The contents of the following patent applications are incorporated herein by reference:
2014-077852 filed in JP on Apr. 4, 2014;
2014-077853 filed in JP on Apr. 4, 2014;
2014-077854 filed in JP on Apr. 4, 2014; and
PCT/JP2015/060715 filed on Apr. 6, 2015

BACKGROUND

1. Technical Field

The present invention relates to an image sensor, an imaging device and an image processing device.

2. Related Art

An imaging device that generates, with a single imaging operation, left and right parallax images having parallaxes relative to one another by using a single imaging optical system is known.

PRIOR ART DOCUMENT

Patent Document

[Patent Document 1] Japanese Patent Application Publication No. 2003-7994

In this type of imaging device, reception of the invisible light wavelength band in an incident luminous flux has not been considered.

SUMMARY

An image sensor according to a first aspect of the present invention is an image sensor including:
a visible parallax pixel that is associated with a visible range light-receiving photoelectric conversion pixel having any of a plurality of types of aperture mask each including an aperture that is positioned to allow passage, to a photoelectric converting element, of a mutually different partial luminous flux of an incident luminous flux in a visible light wavelength band; and
an invisible parallax pixel that is associated with an invisible range light-receiving photoelectric conversion pixel having any of a plurality of types of aperture mask each including an aperture positioned to allow passage, to the photoelectric converting element, of a mutually different partial luminous flux in an incident luminous flux in an invisible light wavelength band.

An imaging device according to a second aspect of the present invention is an imaging device into which the above-mentioned image sensor is incorporated, the imaging device including:
one optical system that guides the incident luminous flux, wherein
the image sensor has a control unit that performs auto focus control for a main subject captured by visible light at a focal position of the optical system.

An imaging device according to a third aspect of the present invention is an imaging device comprising:
the above-mentioned image sensor; and
an image processing unit that generates, from an output of the image sensor, a plurality of visible parallax image data having parallaxes relative to one another; and a plurality of invisible parallax image data having parallaxes relative to one another.

An image processing device according to a fourth aspect of the present invention is an image processing device including:
an input unit that receives an input of visible image data and invisible image data generated from a pixel signal output from a single plane of an image sensor with a single imaging operation; and
an image processing unit that newly calculates one of the visible image data and the invisible image data by using another one of the visible image data and the invisible image data.

An image processing device according to a fifth aspect of the present invention is an image processing device, wherein
the image processing device receives an input of: a visible non-parallax image from a reference direction viewpoint in a visible light wavelength band of a subject image; a visible first parallax image and a visible second parallax image from a first viewpoint and a second viewpoint that are different from the reference direction viewpoint in a visible light wavelength band; an invisible non-parallax image from a reference direction viewpoint in an invisible light wavelength band of a subject image; and an invisible first parallax image and an invisible second parallax image from a first viewpoint and a second viewpoint in an invisible light wavelength band, and calculates a newly calculated pixel value of the visible first parallax image such that a difference between: the newly calculated pixel value of the visible first parallax image; and a pixel value of the visible non-parallax image maintains a correlation with at least a difference between: a pixel value of the invisible first parallax image; and a pixel value of the invisible second parallax image to output a new visible first parallax image.

An image processing device according to a sixth aspect of the present invention is an image processing device, wherein
the image processing device receives an input of: a visible non-parallax image from a reference direction viewpoint in a visible light wavelength band of a subject image; a visible first parallax image and a visible second parallax image from a first viewpoint and a second viewpoint that are different from the reference direction viewpoint in a visible light wavelength band; an invisible non-parallax image from a reference direction viewpoint in an invisible light wavelength band of a subject image; and an invisible first parallax image and an invisible second parallax image from a first viewpoint and a second viewpoint in an invisible light wavelength band, and calculates a newly calculated pixel value of the invisible first parallax image such that a difference between: the newly calculated pixel value of the invisible first parallax image; and a pixel value of the invisible non-parallax image maintains a correlation with at least a difference between: a pixel value of the visible first parallax image; and a pixel value of the visible second parallax image
to output a new invisible first parallax image.

An image processing device according to a seventh aspect of the present invention is an image processing device, wherein
the image processing device receives an input of: a visible non-parallax image from a reference direction viewpoint in a visible light wavelength band of a subject image; a visible first parallax image and a visible second parallax image from a first viewpoint and a second viewpoint that are different from the reference direction viewpoint in a visible light wavelength band; an invisible non-parallax image from a reference direction viewpoint in an invisible light wavelength band of a subject image; and an invisible first parallax image and an invisible second parallax image from a first viewpoint and a second viewpoint in an invisible light wavelength band, and calculates a newly calculated pixel value of the visible first parallax image such that a ratio defined between: the newly calculated pixel value of the visible first parallax image; and a pixel value of the visible non-parallax image maintains a correlation with at least a ratio defined between a pixel value of the invisible first parallax image and a pixel value of the invisible second parallax image to output a new visible first parallax image.

An image processing device according to an eighth aspect of the present invention is an image processing device, wherein the image processing device receives an input of: a visible non-parallax image from a reference direction viewpoint in a visible light wavelength band of a subject image; a visible first parallax image and a visible second parallax image from a first viewpoint and a second viewpoint that are different from the reference direction viewpoint in a visible light wavelength band; an invisible non-parallax image from a reference direction viewpoint in an invisible light wavelength band of a subject image; and an invisible first parallax image and an invisible second parallax image from a first viewpoint and a second viewpoint in an invisible light wavelength band, and calculates a newly calculated pixel value of the invisible first parallax image such that a ratio defined between: the newly calculated pixel value of the invisible first parallax image; and a pixel value of the invisible non-parallax image maintains a correlation with at least a ratio defined between a pixel value of the visible first parallax image and a pixel value of the visible second parallax image to output a new invisible first parallax image.

A image processing device according to a ninth aspect of the present invention is an image processing device comprising:

an input unit that receives an input of visible image data and invisible image data generated from a pixel signal output from a single plane of an image sensor with a single imaging operation; and an image processing unit that superposes a parallax component included at least one of the visible image data and the invisible image data onto another one of the visible image data and the invisible image data.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

A digital camera according to the present embodiment which is one form of imaging devices is configured to be able to generate, with a single imaging operation about one scene, an image corresponding to the visible light wavelength band and an image corresponding to the invisible light wavelength band. In addition, a digital camera is in some cases configured to be able to generate, with a single imaging operation about one scene, images the number of which corresponds to a plurality of viewpoints. Respective images from different viewpoints from each other are called parallax images. In the present embodiment, in particular, a case where parallax images from two viewpoints corresponding to a right eye and a left eye are generated is explained. As described in detail later, a digital camera in the present embodiment can generate, together with parallax images, a non-parallax image which does not have a parallax from a central viewpoint as a reference direction viewpoint. A parallax pixel from a left-viewpoint is in some cases denoted as a parallax Lt pixel or a left parallax pixel, a parallax pixel from a right-viewpoint is in some cases denoted as a parallax Rt pixel or a right parallax pixel, and a non-parallax pixel is in some cases denoted as an N pixel. A parallax image from a left-viewpoint is in some cases denoted as a parallax Lt image or a left parallax image, a parallax image from a right-viewpoint is in some cases denoted as a parallax Rt image or a right parallax image, and a non-parallax image is in some cases denoted as an N image. Also, a pixel that performs photoelectric conversion on the visible light wavelength band in an incident luminous flux is in some cases denoted as a visible pixel, and a pixel that performs photoelectric conversion on the invisible light wavelength band in an incident luminous flux is in some cases denoted as an invisible pixel.

Figure 1:
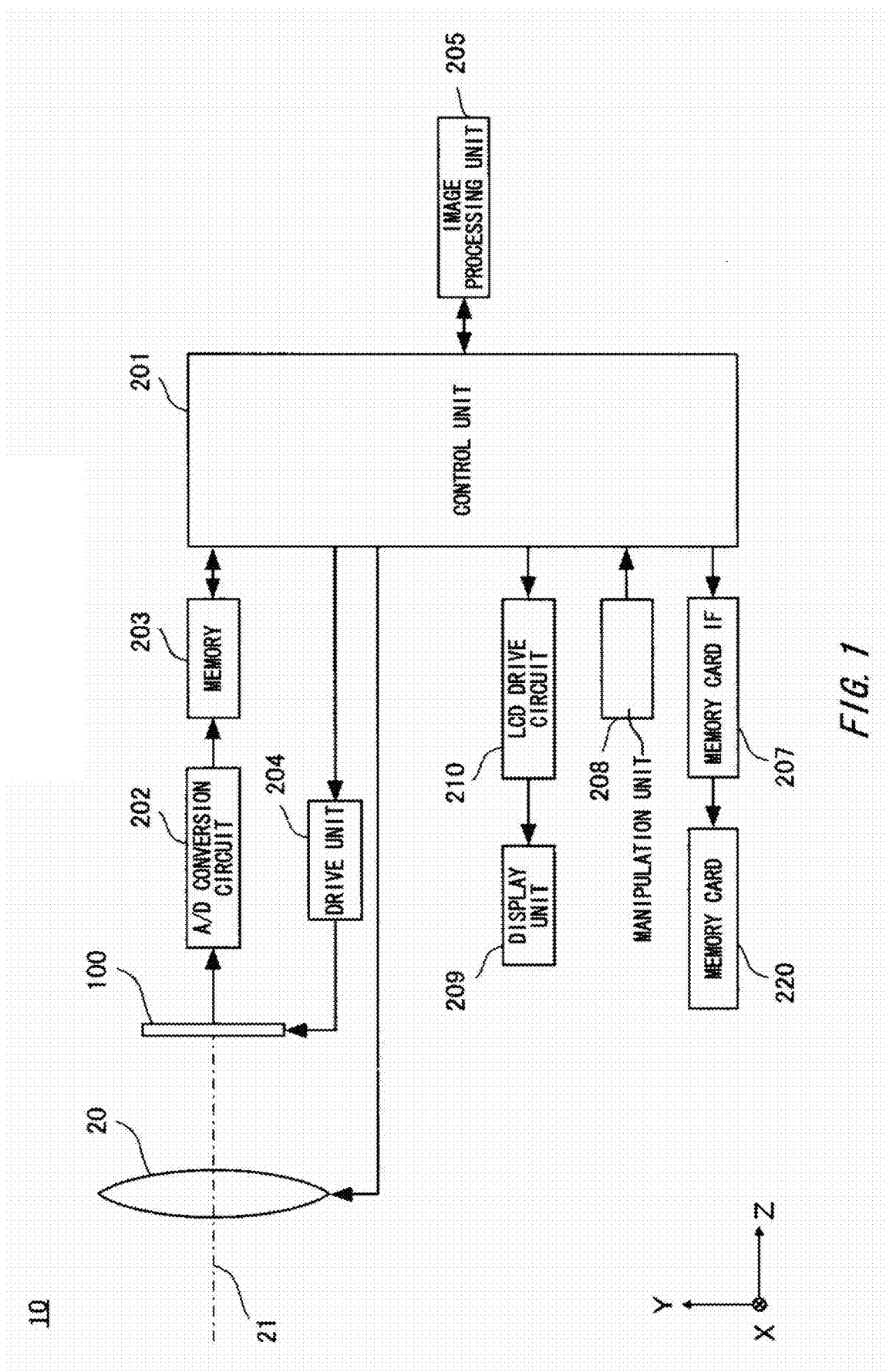
FIG. 1 is a figure for explaining a configuration of a digital camera.

FIG. 1 is a figure for explaining a configuration of a digital camera 10 according to the present embodiment. The digital camera 10 includes an imaging lens 20 as an imaging optical system and an image sensor 100. The imaging lens 20 guides, to the image sensor 100, a subject luminous flux that is incident thereon along an optical axis 21. As described in detail later, in a stage preceding the image sensor 100, an infrared ray cut filter is not arranged at least at a position corresponding to an invisible pixel within the image sensor 100. The digital camera 10 includes, in addition to the imaging lens 20 and the image sensor 100, a control unit 201, an A/D conversion circuit 202, a memory 203, a drive unit 204, an image processing unit 205, a memory card IF 207, a manipulation unit 208, a display unit 209 and an LCD drive circuit 210.

As illustrated in the figure, the direction that is toward the image sensor 100 and parallel with the optical axis 21 is defined as the +Z-axis direction, and on a plane orthogonal to the Z-axis, the direction toward the depth direction on the sheets of paper is defined as the +X-axis direction and the direction upward on the sheets of paper is defined as the +Y-axis direction. In a relationship with a composition in imaging, the X-axis lies in the horizontal direction, and the Y-axis lies in the vertical direction. In some of the following figures, the coordinate axes are displayed so that one can understand the orientations of the respective figures by using the coordinate axes of FIG. 1 as a reference.

The imaging lens 20 is configured with a plurality of optical lens groups, and forms, in the vicinity of its focal plane, an image of subject luminous fluxes from a scene. The imaging lens 20 may be a replaceable lens that can be attached to and detachable from the digital camera 10. In FIG. 1, the imaging lens 20 is shown representatively with a single virtual lens arranged in the vicinity of the pupil, for convenience of explanation.

The image sensor 100 is arranged in the vicinity of the focal plane of the imaging lens 20. The image sensor 100 is an image sensor such as a CCD or CMOS formed with a plurality of pixels being arrayed two-dimensionally. The image sensor 100 is timing-controlled by the drive unit 204, and converts a subject image formed on a light-receiving surface into an image signal and outputs it to the A/D conversion circuit 202. The image signal output to the A/D conversion circuit 202 includes an image signal corresponding to the visible light wavelength band and an image signal corresponding to the invisible light wavelength band.

The A/D conversion circuit 202 converts the image signal output by the image sensor 100 into a digital image signal, and outputs it to the memory 203. The image processing unit 205 uses the memory 203 as a workspace to perform various types of image processing to generate image data. Other than this, the image processing unit 205 also serves a function of image processing in general to, for example, adjust image data according to a selected image format. The generated image data is converted into a display signal by the LCD drive circuit 210, and displayed on the display unit 209. Also, it is recorded in a memory card 220 mounted to the memory card IF 207.

A series of imaging sequence is initiated upon acceptance of a user manipulation by the manipulation unit 208, and output of a manipulation signal to the control unit 201. Various types of operation such as AF or AE that accompany the imaging sequence are executed under control of the control unit 201.

Figure 2:
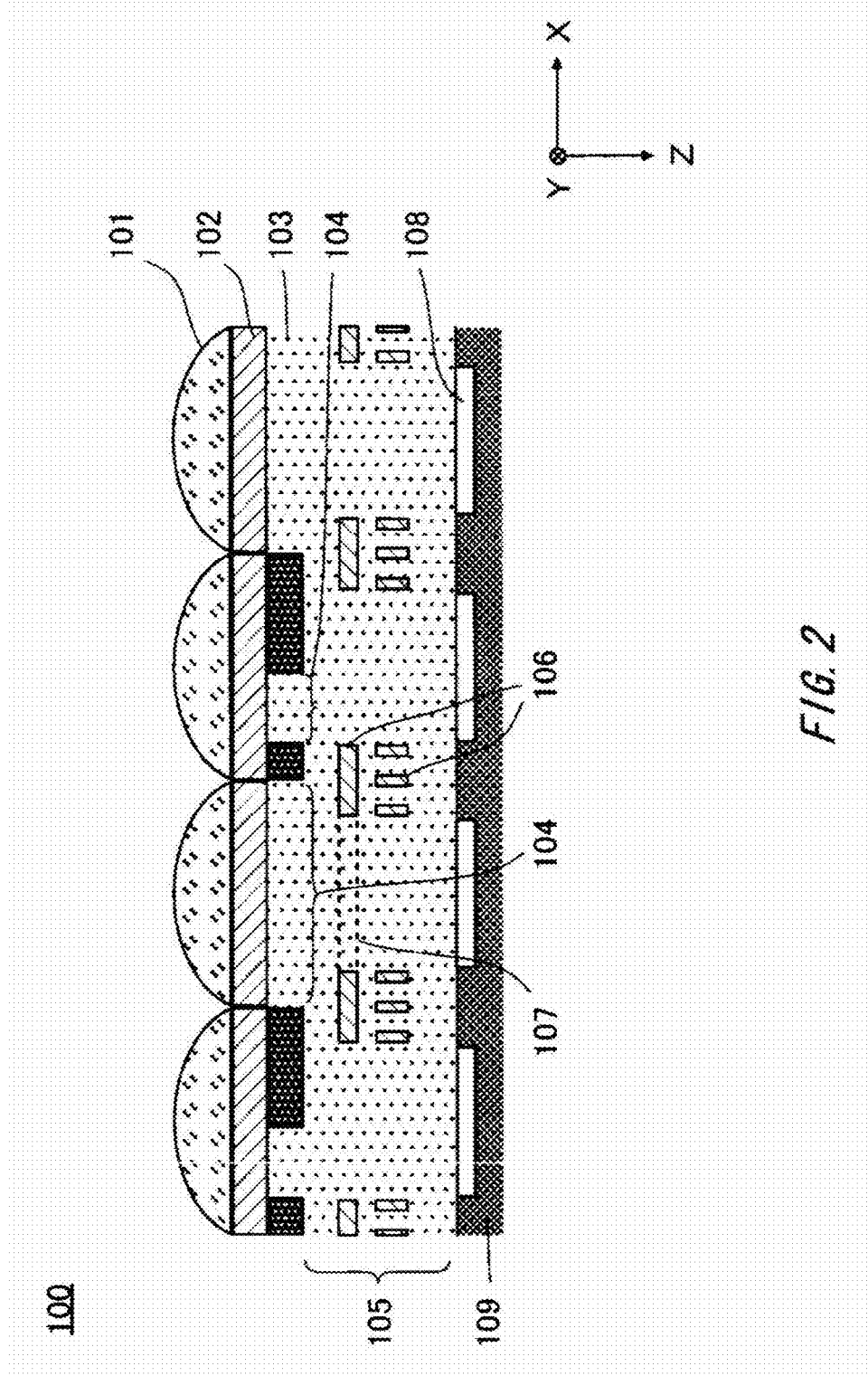
FIG. 2 is a figure for explaining a configuration of a cross-section of an image sensor.

Next, one example of a configuration of the image sensor 100 is explained. FIG. 2 is a schematic diagram showing a cross-section of the image sensor 100.

The image sensor 100 is configured with microlenses 101, optical filters 102, aperture masks 103, a wiring layer 105 and photoelectric converting elements 108 being arrayed in this order from the subject side. The photoelectric converting elements 108 are configured with photodiodes that convert incident light into electrical signals. A plurality of the photoelectric converting elements 108 are arrayed two-dimensionally on a front surface of a substrate 109.

An image signal obtained through conversion by a photoelectric converting element 108, a control signal for controlling a photoelectric converting element 108 and the like are transmitted and received via wires 106 provided in the wiring layer 105. Also, the aperture masks 103 having aperture portions 104 that are provided corresponding to each photoelectric converting element 108 in a one-to-one relationship and are arrayed repeatedly two-dimensionally are provided in contact with the wiring layer 105. As described later, the aperture portions 104 are shifted among the corresponding photoelectric converting elements 108, and their relative positions are strictly determined. As described in detail later, due to an action of the aperture masks 103 provided with these aperture portions 104, parallaxes are generated to subject luminous fluxes received by the photoelectric converting elements 108.

On the other hand, the aperture masks 103 are not present on photoelectric converting elements 108 which do not cause parallaxes. In other words, it can also be said that aperture masks 103 having aperture portions 104 that do not limit subject luminous fluxes being incident on a corresponding photoelectric converting element 108, that is, allows passage of the entire incident luminous fluxes are provided. Because although an aperture 107, which is formed by the wires 106, never generates a parallax, but substantially regulates incident subject luminous fluxes, the wires 106 can be regarded as aperture masks that do not generate parallaxes, but allow passage of the entire incident luminous fluxes. The aperture masks 103 may be arrayed separately independently corresponding to each photoelectric converting element 108, or may be formed collectively for the plurality of photoelectric converting elements 108 in a similar manner to a manufacturing process of the optical filters 102.

The optical filters 102 are provided on the aperture masks 103. Color filters are provided as the optical filters 102 to visible pixels that receive light in the visible light wavelength range. The color filters are filters that are colored so as to transmit light in a particular wavelength band to each photoelectric converting element 108, and are provided corresponding to each of the photoelectric converting elements 108 in a one-to-one relationship. To output a color image, at least two mutually different types of color filter have to be arrayed, but to acquire a higher image quality color image, three or more types of color filter may be arrayed. For example, a red filter (R filter) that transmits light in the red color wavelength band, a green filter (G filter) that transmits light in the green color wavelength band, and a blue filter (B filter) that transmits light in the blue color wavelength band may be arrayed in a lattice. Color filters are not limited to only a combination of primary colors RGB, but may be a combination of YCM complementary color filters. When a monochrome image signal is to be output, color filters are not provided. A bandpass filter for near-infrared light is provided as an optical filter 102 to an invisible pixel that receives light in the invisible light wavelength range. As described in detail later, at least two mutually different types of bandpass filter are preferably arrayed.

The microlenses 101 are provided on the optical filters 102. The microlenses 101 are condensing lenses for guiding a larger number of incident subject luminous fluxes to the photoelectric converting elements 108. The microlenses 101 are provided corresponding to each of the photoelectric converting elements 108 in a one-to-one relationship. The microlenses 101 preferably have optical axes that are shifted such that a larger number of subject luminous fluxes is guided to the photoelectric converting elements 108 considering a relative positional relationship between the pupil center of the imaging lens 20 and the photoelectric converting elements 108. Furthermore, together with the positions of the aperture portions 104 of the aperture masks 103, the arrangement position may be adjusted such that a larger number of particular subject luminous fluxes, which are described later, is incident.

In this manner, one unit which is formed by an aperture mask 103, an optical filter 102 and a microlens 101 provided corresponding to each of the photoelectric converting elements 108 in a one-to-one relationship is called a pixel. In particular, a pixel to which an aperture mask 103 to generate a parallax is provided is called a parallax pixel, and a pixel to which an aperture mask 103 to generate a parallax is not provided is called a non-parallax pixel.

In a case of an image sensor having good light-collecting efficiency and/or photoelectric conversion efficiency, the microlenses 101 do not have to be provided. Also, in a case of a back-illuminated image sensor, the wiring layer 105 is provided on the side opposite to the photoelectric converting elements 108. Also, if an aperture portion 104 of an aperture mask 103 is provided with a color component or a band component, a corresponding optical filter 102 and aperture mask 103 can be formed integrally.

Also, although in the present embodiment, the aperture masks 103 and the wires 106 are provided as separate bodies, the function of the aperture masks 103 in parallax pixels may be served by the wires 106. That is, defined aperture shapes may be formed by the wires 106, incident luminous fluxes may be limited by the aperture shapes, and only particular partial luminous fluxes may be guided to the photoelectric converting elements 108. In this case, the wires 106 that form the aperture shapes are preferably closest to the photoelectric converting elements 108 side in the wiring layer 105.

Also, the aperture masks 103 may be formed by a transmission prevention film provided overlapping the photoelectric converting elements 108. In this case, the aperture masks 103 for example are a transmission prevention film formed by sequentially laminating a SiN film and a SiO$_2$ film, and is formed by removing, by etching, regions corresponding to the aperture portions 104. Furthermore, regions of the photoelectric converting elements 108 themselves may be formed to correspond to the aperture portions 104 of the aperture masks 103.

<Parallax Pixels and Blurring Characteristics>

A concept of defocusing in a case where parallax Lt pixels and parallax Rt pixels receive light is explained. First, a concept of defocusing in non-parallax pixels is explained briefly.

Figure 3:
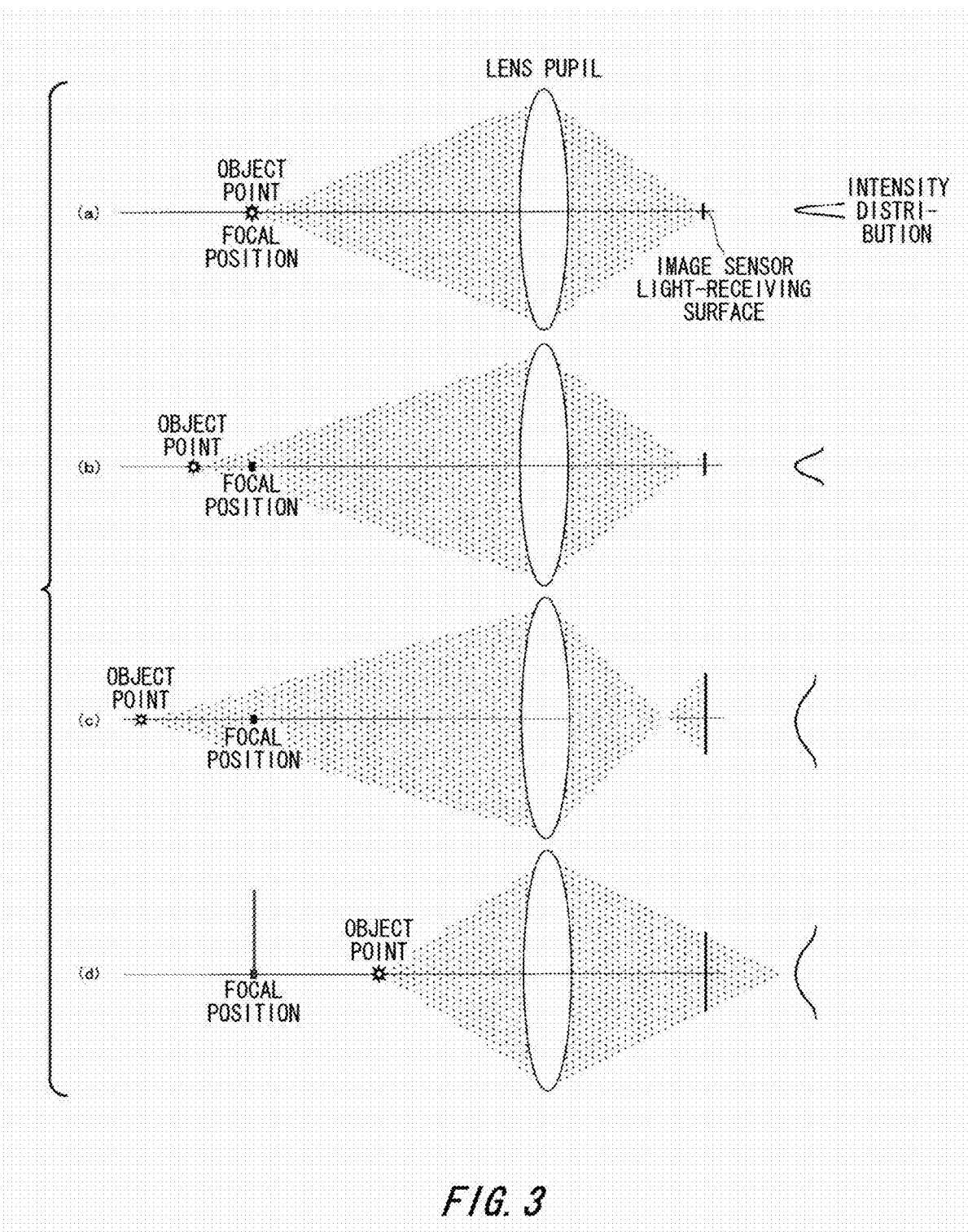
FIG. 3 is a figure for explaining a concept defocusing in non-parallax pixels.

FIG. 3 is a figure for explaining the concept of defocusing in non-parallax pixels. As illustrated in (a) of FIG. 3, if an object point which is a subject is at a focal position, subject luminous fluxes that reach an image sensor light-receiving surface through a lens pupil show a steep optical intensity distribution with a pixel of a corresponding image point as its center. That is, if non-parallax pixels that receive entire effective luminous fluxes passing through the lens pupil are arrayed in the vicinity of the image point, the output value of a pixel corresponding to the image point is highest, and the output values of pixel arrayed in the periphery lower rapidly.

On the other hand, as illustrated in (b) of FIG. 3, if the object point is shifted from the focal position in a direction away from an image sensor light-receiving surface, the subject luminous fluxes show a less steep optical intensity distribution on an image sensor light-receiving surface as compared with a case where the object point is at the focal position. That is, the distribution shows a lowered output value of the pixel of the corresponding image point, and additionally output values of peripheral pixels that are farther away from the center.

As illustrated in (c) of FIG. 3, if the object point is shifted farther from the focal position, the subject luminous fluxes show a still less steep optical intensity distribution on an image sensor light-receiving surface. That is, the distribution shows a still lowered output value of the pixel of the corresponding image point, and additionally output values of peripheral pixels that are still farther away from the center.

As illustrated in (d) of FIG. 3, also if the object point is shifted from the focal position in a direction toward an image sensor light-receiving surface, the subject luminous fluxes show an optical intensity distribution similar to the one in a case where the object point is shifted in a direction away from an image sensor light-receiving surface.

Figure 4:
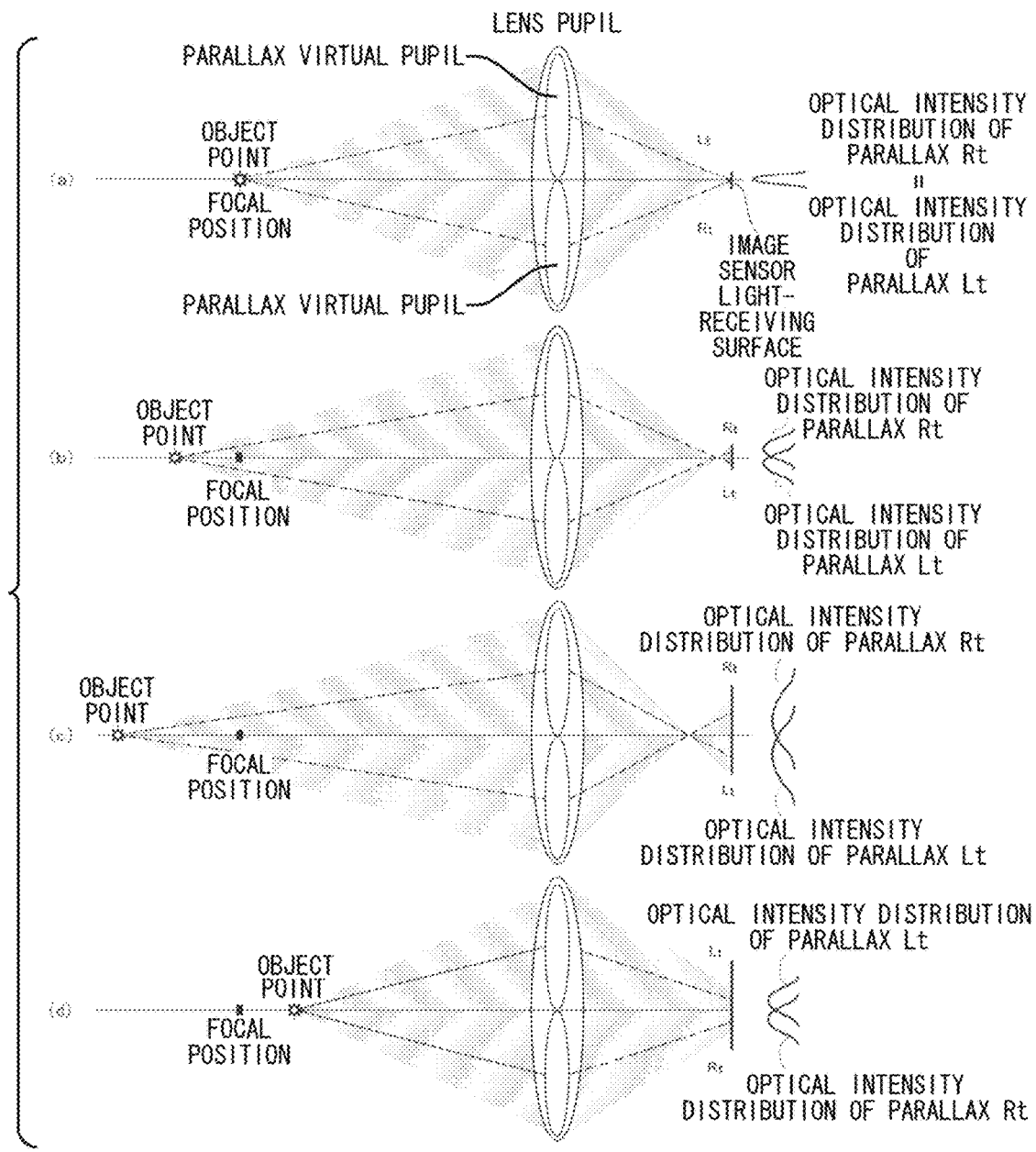
FIG. 4 is a figure for explaining a concept of defocusing in parallax pixels.

FIG. 4 is a figure for explaining a concept of defocusing in parallax pixels. Parallax Lt pixels and parallax Rt pixels receive subject luminous fluxes that reach from either of two parallax virtual pupils that are respectively set, as partial ranges of the lens pupil, symmetrically about the optical axis. In the present specification, the system to capture a parallax image by receiving subject luminous fluxes that reach from mutually different virtual pupils in a single lens pupil is called a monocular pupil-divided imaging system.

As illustrated in (a) of FIG. 4, also if an object point, which is a subject, is at a focal position, no matter which of the parallax virtual pupils subject luminous fluxes have passed, they show a steep optical intensity distribution with a pixel of a corresponding image point as its center. If a parallax Lt pixel is arrayed near the image point, the output value of a pixel corresponding to the image point is the highest, and the output values of pixels arrayed in the periphery lower rapidly. Also, also if a parallax Rt pixel is arrayed near the image point, the output value of a pixel corresponding to the image point is the highest, and the output values of pixels arrayed in the periphery lower rapidly. That is, no matter which of parallax virtual pupils subject luminous fluxes pass, the distributions show the highest output values at the pixels corresponding to the image point and rapidly lowered output values at pixels arrayed in the peripheries, and the respective distributions coincide with each other.

On the other hand, as illustrated in (b) of FIG. 4, if the object point is shifted from the focal position in a direction away from an image sensor light-receiving surface, the peak of the optical intensity distribution exhibited by parallax Lt pixels occurs at a position at a distance in one direction from the pixel corresponding to the image point, and its output value is lowered, as compared with a case where the object point is at the focal position. Also, the width of pixels having output values increases. That is, point images widen in the horizontal direction of an image sensor light-receiving surface, and so the blur amount increases. The peak of the optical intensity distribution exhibited by parallax Rt pixels occurs at a position at a distance, from the pixel corresponding to the image point, equal to that for the parallax Lt pixels in the direction opposite to the above-mentioned one direction for the parallax Lt pixels, and similarly the output value lowers. Also, similarly, the width of pixels having output values increases. That is, identical optical intensity distributions that are less steep as compared with a case where the object point is at the focal position occur at an equal distance from the pixel corresponding to the image point. The amount of shift between the peaks of the optical intensity distributions exhibited by the parallax Lt pixels and the parallax Rt pixels corresponds to the parallax amount.

Also, as illustrated in (c) of FIG. 4, if the object point is shifted farther from the focal position, identical optical intensity distributions that are still less steep occur at longer distances from each other as compared with the state in (b) of FIG. 4. Because the widening of point images further increases, the blur amount increases. Also, because the degree of shift between the peaks of the optical intensity distributions exhibited by the parallax Lt pixels and the parallax Rt pixels has increased, the parallax amount increases. That is, it can be said that as the degree of shift of an object point from a focal position increases, the blur amount and the parallax amount increase.

As illustrated in (d) of FIG. 4, if the object point is shifted from the focal position in a direction toward an image sensor light-receiving surface, the peak of the optical intensity distribution exhibited by the parallax Rt pixels occurs at a position at a distance from the pixel corresponding to the image point in the above-mentioned one direction, contrary to the state of (c) of FIG. 4. The peak of the optical intensity distribution exhibited by the parallax Lt pixels occurs at a position at a distance in a direction opposite to the one direction for the parallax Rt pixels. That is, the direction of shift of the object point determines the directions in which the peaks of the optical intensity distributions exhibited by the parallax Lt pixels and the parallax Rt pixels are at positions at distances from the pixel corresponding to the image point.

Figure 5:
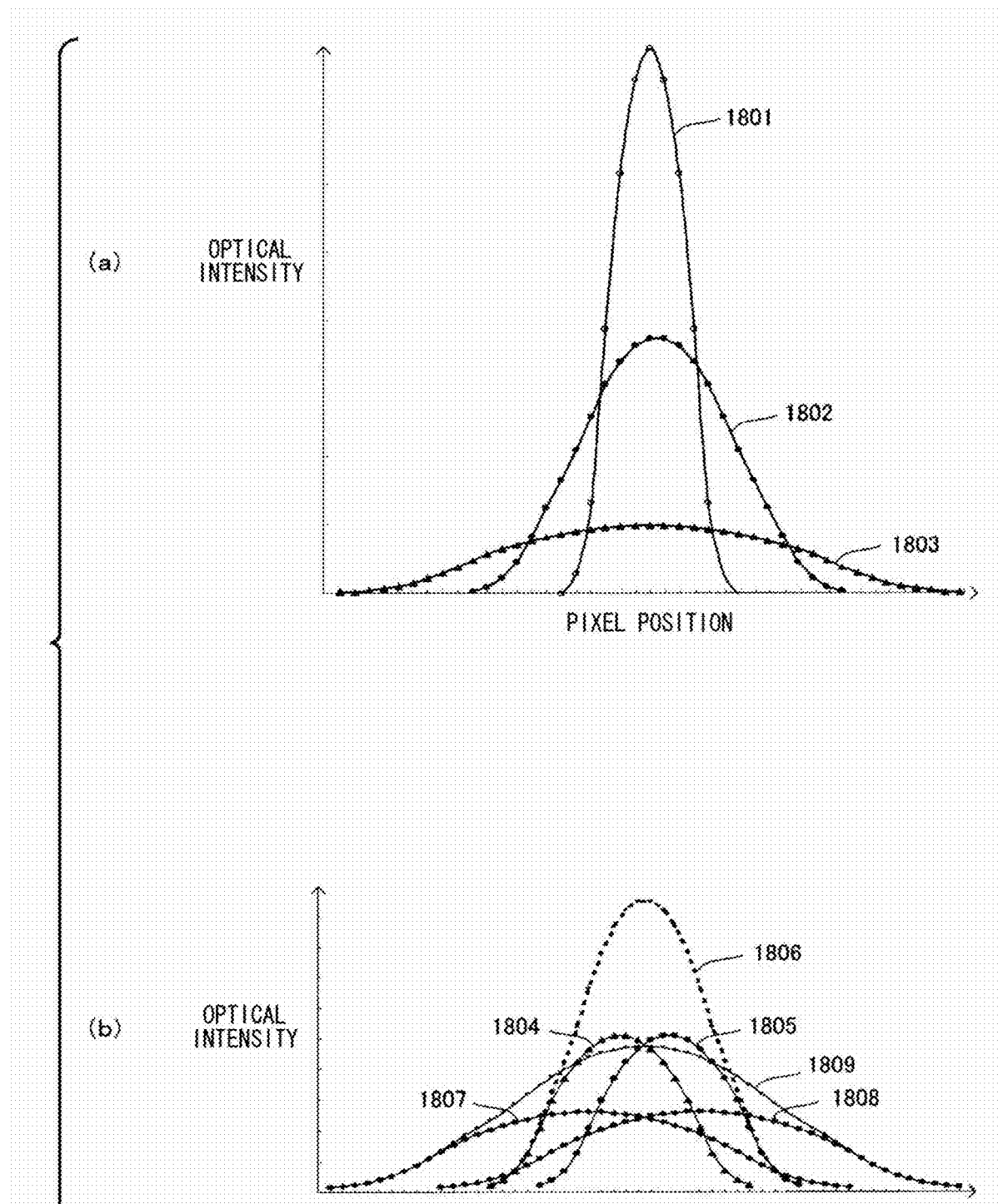
FIG. 5 is a figure that illustrates optical intensity distributions of non-parallax pixels and parallax pixels.

Changes in the optical intensity distributions explained with reference to FIG. 3 and changes in the optical intensity distributions explained with reference to FIG. 4 are, when they are respectively plotted in graphs, expressed as shown in FIG. 5.

FIG. 5 is a figure that illustrates optical intensity distributions of non-parallax pixels and parallax pixels. In the figure, the horizontal axes indicate pixel positions, and the center positions are the pixel position corresponding to the image point. The vertical axes indicate the output value of each pixel, and this output value is substantially proportional to the optical intensity, and so is indicated as the optical intensity in the figure.

Because, as described above, the optical intensity distribution exhibited if the object point is shifted from the focal position in a direction toward an image sensor light-receiving surface is similar to the optical intensity distribution exhibited if the object point is shifted in a direction away from an image sensor light-receiving surface, changes in the optical intensity distribution if the object point is shifted in a direction toward an image sensor light-receiving surface are omitted in the figure. Because the peaks of the optical intensity distributions exhibited by the parallax Lt pixels and the parallax Rt pixels if the object point is shifted from the focal position in a direction toward an image sensor light-receiving surface also are similar to the peaks of the optical intensity distributions exhibited by the parallax Lt pixels and the parallax Rt pixels if the object point is shifted in a direction away from an image sensor light-receiving surface, the former peaks are omitted.

(a) of FIG. 5 is a graph showing changes in the optical intensity distribution explained with reference to FIG. 3. A distribution curve 1801 shows an optical intensity distribution corresponding to (a) of FIG. 3, and illustrates the steepest state. A distribution curve 1802 shows an optical intensity distribution corresponding to (b) of FIG. 3, and also a distribution curve 1803 shows an optical intensity distribution corresponding to (c) of FIG. 3. It can be seen that as compared with the distribution curve 1801, the latter two curves have gradually lowered peak values, and are wider.

(b) of FIG. 5 is a graph showing changes in the optical intensity distribution explained with reference to FIG. 4. A distribution curve 1804 and a distribution curve 1805 show the optical intensity distribution of parallax Lt pixels and the optical intensity distribution of parallax Rt pixels shown in (b) of FIG. 4, respectively. As can be seen in the figure, the shapes of these distributions are axially symmetric about their center positions. Also, a synthetic distribution curve 1806 obtained by adding together the curves shows a similar shape to the distribution curve 1802 corresponding to (b) of FIG. 3 which represents a defocused state equivalent to (b) of FIG. 4.

A distribution curve 1807 and a distribution curve 1808 show the optical intensity distribution of parallax Lt pixels and the optical intensity distribution of parallax Rt pixels shown in (c) of FIG. 4, respectively. As can be seen in the figure, the shapes of these distributions also are axially symmetric about their center positions. Also, a synthetic distribution curve 1809 obtained by adding together the curves shows a similar shape to the distribution curve 1803 corresponding to (c) of FIG. 3 which represents a defocused state equivalent to (c) of FIG. 4. Because the optical intensity distribution of parallax Lt pixels and the optical intensity distribution of parallax Rt pixels in (d) of FIG. 4 are those obtained by swapping the positions of the optical intensity distribution of parallax Lt pixels and the optical intensity distribution of parallax Rt pixels in (c) of FIG. 4, they correspond to the distribution curve 1808 and the distribution curve 1807, respectively.

Figure 6:
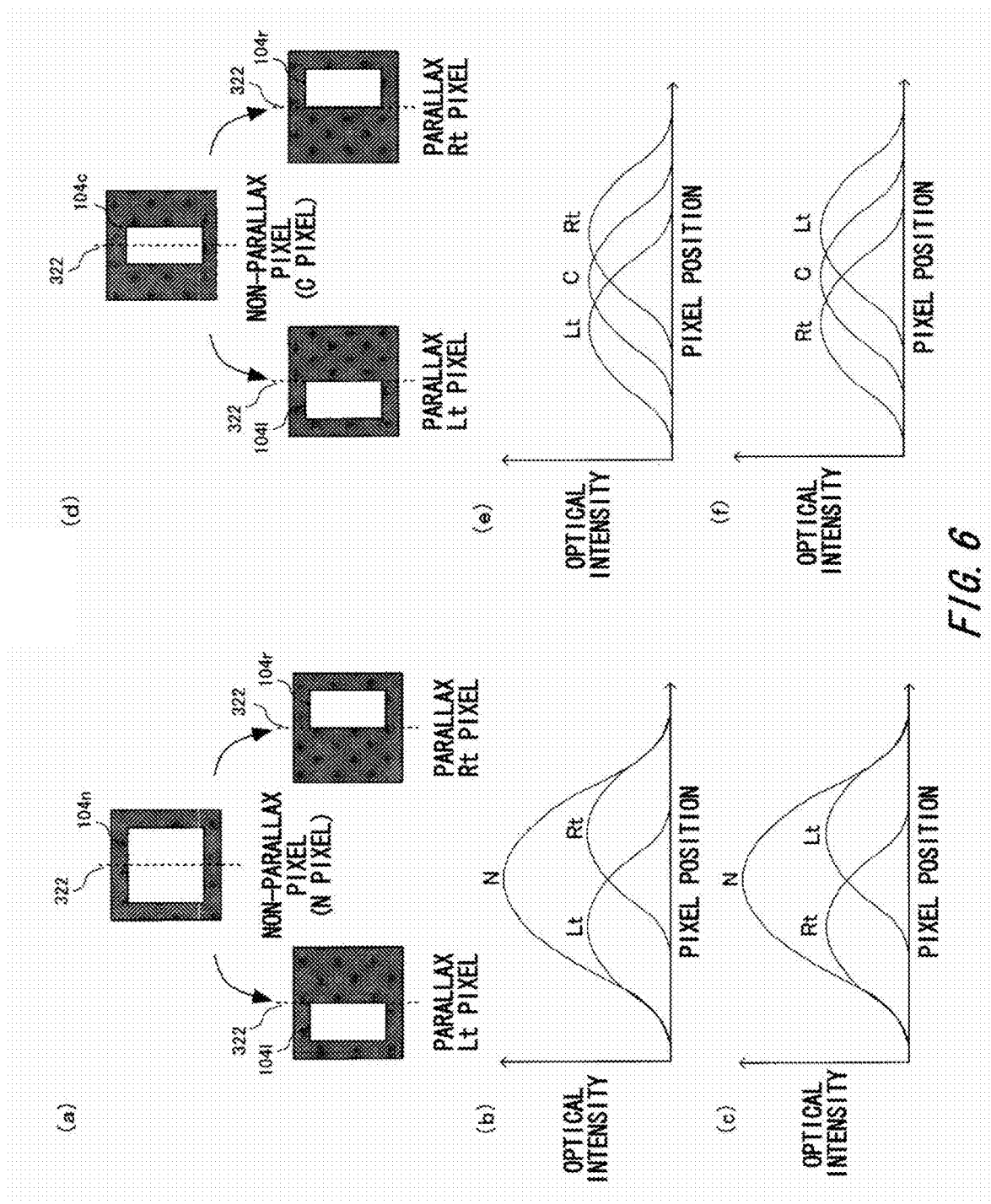
FIG. 6 is a figure for explaining aperture shapes of aperture portions in a case where there are two types of parallax pixel.

FIG. 6 is a figure for explaining aperture shapes of the aperture portions 104 in a case where there are two types of parallax pixel. (a) of FIG. 6 illustrates an example where the shape of an aperture portion 104l of a parallax Lt pixel and the shape of an aperture portion 104r of a parallax Rt pixel are the same as the respective shapes obtained by dividing the shape of an aperture portion 104n of a non-parallax pixel along a centerline 322. That is, in (a) of FIG. 6, the area of the aperture portion 104n of the non-parallax pixel is the sum of the area of the aperture portion 104l of the parallax Lt pixel and the area of the aperture portion 104r of the parallax Rt pixel. In this case, the aperture portion 104n of the non-parallax pixel is referred to as a full-open aperture portion, and the aperture portion 104l and the aperture portion 104r are referred to as half-open aperture portions. If an aperture portion is positioned at the center of a photoelectric converting element, this state is referred to as that the aperture portion is oriented in the reference direction. The aperture portion 104l of the parallax Lt pixel and the aperture portion 104r of the parallax Rt pixel are shifted, in mutually opposite directions, from the virtual centerlines 322 that pass the centers (pixel centers) of respectively corresponding photoelectric converting elements 108. Accordingly, the aperture portion 104l of the parallax Lt pixel and the aperture portion 104r of the parallax Rt pixel respectively generate parallaxes in one direction relative to the centerline 322 and in the other direction opposite to the one direction.

(b) of FIG. 6 shows optical intensity distributions of pixels respectively having the aperture portions shown in (a) of FIG. 6 in a case where an object point is shifted from a focal position in a direction away from an image sensor light-receiving surface. In the figure, the horizontal axis indicates pixel positions, and the center position is a pixel position corresponding to an image point. The vertical axis indicates optical intensities. Also, a curve Lt corresponds to the distribution curve 1804 in (b) of FIG. 5, and a curve Rt corresponds to the distribution curve 1805 in (b) of FIG. 5. A curve N corresponds to non-parallax pixels, and shows a similar shape to the synthetic distribution curve 1806 in (b) of FIG. 5. Also, the respective aperture portion 104n, aperture portion 104l and aperture portion 104r serve a function as an aperture diaphragm. Accordingly, the blur width of non-parallax pixels having the aperture portion 104n which has an area twice the area of the aperture portion 104l (aperture portion 104r) is about the same as the blur width of the curve obtained by adding together parallax Lt pixels and parallax Rt pixels, which is illustrated by the synthetic distribution curve 1806 in (b) of FIG. 5.

(c) of FIG. 6 shows optical intensity distributions of pixels respectively having the aperture portions shown in (a) of FIG. 6 in a case where an object point is shifted from a focal position in a direction toward an image sensor light-receiving surface. In the figure, the horizontal axis indicates pixel positions, and the center position is a pixel position corresponding to an image point. The vertical axis indicates optical intensities. A curve Lt and a curve Rt in (c) of FIG. 6 have a reversed positional relationship relative to the curve Lt and the curve Rt in (b) of FIG. 6 while maintaining a relationship that the blur width of non-parallax pixels having the aperture portion 104n is about the same as the blur width of the curve obtained by adding together parallax Lt pixels and parallax Rt pixels.

(d) of FIG. 6 illustrates an example where the shape of the aperture portion 104l of a parallax Lt pixel, the shape of the aperture portion 104r of a parallax Rt pixel and the shape of an aperture portion 104c are all the same. In this case, the pixel provided with the aperture portion 104c is a pixel that has an aperture portion corresponding to a reference direction and is not shifted relative to the center, although it guides only subject luminous fluxes having a center portion of the pupil as their partial ranges to photoelectric converting elements 108. Thus, it can be regarded as a non-parallax pixel (C pixel). Also, the aperture portion 104l, the aperture portion 104r and the aperture portion 104c have areas half the area of the aperture portion 104n illustrated in (a) of FIG. 6. Similar to the case explained with reference to (a) of FIG. 6, the aperture portions 104l and 104r respectively abut on the virtual centerlines 322 passing the centers (pixel centers) of photoelectric converting elements 108.

(e) of FIG. 6 shows optical intensity distributions of pixels respectively having the aperture portions shown in (d) of FIG. 6 in a case where an object point is shifted from a focal position in a direction away from an image sensor light-receiving surface. In the figure, the horizontal axis indicates pixel positions, and the center position is a pixel position corresponding to an image point. The vertical axis indicates optical intensities. A curve Lt corresponds to the distribution curve 1804 in (b) of FIG. 5, and a curve Rt corresponds to the distribution curve 1805 in (b) of FIG. 5. Also, the respective aperture portion 104c, aperture portion 104l and aperture portion 104r have a function of an aperture diaphragm. Accordingly, the blur width of non-parallax pixels having the aperture portion 104c which has the same shape and area as those of the aperture portion 104l and the aperture portion 104r is about the same as the blur width of parallax Lt pixels and parallax Rt pixels.

(f) of FIG. 6 shows optical intensity distributions of pixels respectively having the aperture portions shown in (d) of FIG. 6 in a case where an object point is shifted from a focal position in a direction toward an image sensor light-receiving surface. In the figure, the horizontal axis indicates pixel positions, and the center position is a pixel position corresponding to an image point. The vertical axis indicates optical intensities. A curve Lt and a curve Rt in (f) of FIG. 6 have a reversed positional relationship relative to the curve Lt and the curve Rt in (e) of FIG. 6.

Next, a system that performs stereoscopic imaging of a range from the visible light range to the invisible light range in a monocular stereoscopic imaging system is explained. Principles and array configurations are explained first, and development processing methods are explained by referring to Example 1 and Example 2.

<Multi-Band Compatibility to Include Invisible Range and Stereoscopic Imaging>

If imaging not only of the visible light wavelength band of a subject image, but also of the invisible light wavelength band therein is possible, complementary rich information can be obtained. By utilizing information of the invisible light wavelength band, a spectroscopic device with new spatial resolution can be provided. At that time, the usability of the device is maximized if imaging of the visible light wavelength band and the invisible light wavelength band can be performed simultaneously at once. Furthermore, it is preferable if stereoscopic imaging can be simultaneously performed by contriving apertures of image sensors using principles of the monocular pupil-divided imaging system. At that time, it is an important issue what kind of array structure image sensors has in order to enhance spatial resolution and furthermore to realize stereoscopic vision by using color components in respective visible ranges and band components in the invisible range. It has been unknown what kind of new situation newly emerges, what kind of array structure image sensors should have for imaging, and what kind of development processing should be performed in a case where the system for performing stereoscopic imaging of a subject image in the visible light wavelength band is expanded to the invisible light wavelength band. Among them, in employing a single panel imaging system, influence of multi-band compatibility to include a vast range from the visible range to the invisible range on the optical system characteristics, and influence, that results therefrom, on a stereoscopic image in monocular pupil-divided imaging have been unknown.

Figure 7:
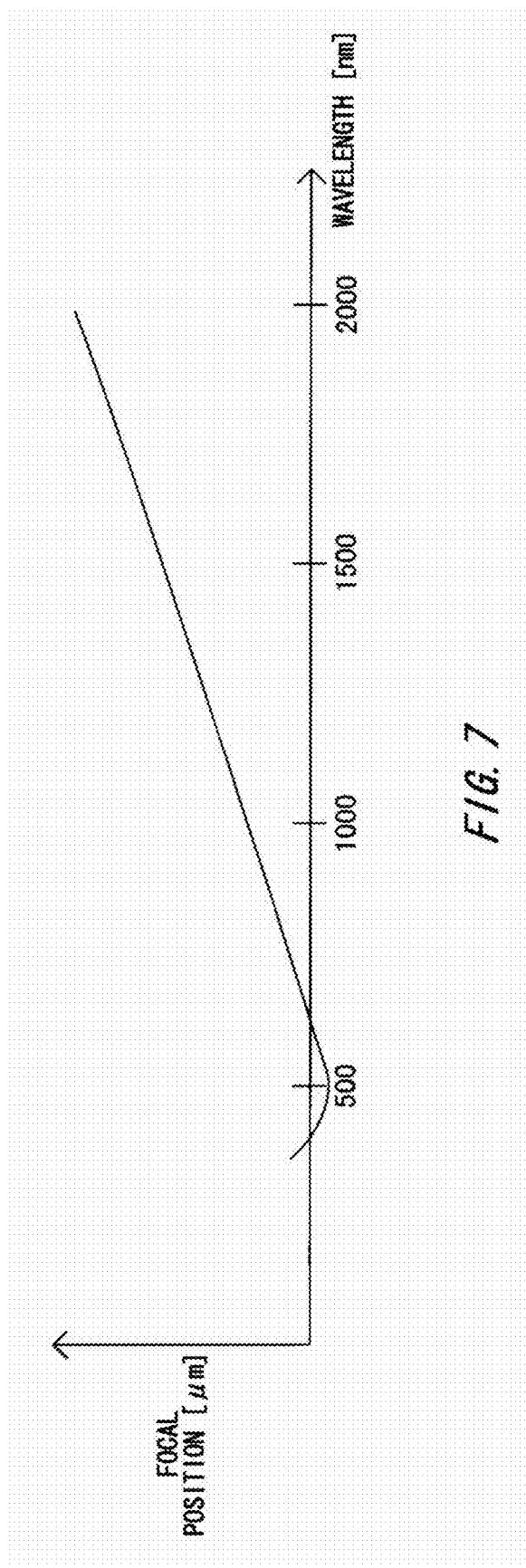
FIG. 7 is a schematic diagram showing wavelength dependency of an image-formed position.

FIG. 7 is a schematic diagram showing wavelength dependency of an image-formed position. The horizontal axis indicates wavelengths [nm], and the vertical axis indicates focal positions [μm]. By using the near-infrared range (the range of approximately 900 nm to 1700 nm) as the invisible range wavelength band to be included by the multi-band compatibility, a conventional monocular optical system for the visible range (400 nm to 700 nm) can be applied. When such a wide band of wavelengths is handled, it is anticipated that even in a single optical system, positions of focal planes on which images are formed become different for the visible range and the invisible range. That is, because generally the refractive angle of a short wavelength is larger than the refractive angle of a long wavelength, as illustrated in the figure, a subject image of near-infrared light becomes a little blurred when the optical system is focused at a subject image of visible light. Commercially available lens groups are generally designed such that when averages among the wavelength bands of three colors, R, G and B in the visible light range are taken, their focal planes coincide as much as possible. The property that visible light focal positions differ from near-infrared focal positions presents a potential as a means to be effectively utilized newly, when applied to monocular stereoscopic imaging.

As previously explained with reference to FIG. 3 and FIG. 4, in the monocular pupil-divided imaging system, the point spread of a left-viewpoint and the point spread of a right-viewpoint are identical for a subject at a focal position, and in contrast, for a subject in an unfocused region, the point spreads spread further, and become more distanced from each other as the distance of the subject from the focal position increases, and a parallax is generated. Also, the point spread of a reference viewpoint equals the point spread obtained by adding together the point spread of a left-viewpoint and the point spread of a right-viewpoint. In other words, an N pixel captures a subject image in a viewpoint direction at the center-of-gravity position of subject images captured by the left and right parallax pixels, respectively.

Such a property of the monocular pupil-divided imaging system manifests itself in the visible light wavelength range. As previously explained, a visible pixel that performs photoelectric conversion on light in the visible range and an invisible pixel that performs photoelectric conversion on light in the near-infrared range are arrayed on a single plane in a single panel image sensor. In more detail, photoelectric converting elements corresponding to respective pixels are arrayed on a single image-formed plane relative to the optical axis direction. Then, even if a subject image in the visible light range is focused at, a subject image in the near-infrared light range becomes a little blurred. That is, even if a parallax is not generated in the subject image in the visible light range, a certain degree of parallax is generated in the subject image in the near-infrared light range. Also, when a subject image of near-infrared light is focused at, the reversed relationship holds. That is, even if the subject image in the near-infrared light range is focused at, the subject image in the visible light range is a little blurred. In order for such a property to not occur, photoelectric converting elements, which are light-receiving units of pixels, may be designed such that their depths are varied so that image-formed positions for all the wavelength ranges coincide, but in the present embodiment, intentionally such designing is not adopted, and the property that visible light focal positions differ a little from near-infrared focal positions is utilized. It becomes possible to make use of such a property in particular if not Example 1 described later, but Example 2 described later is utilized as a method of development processing.

<Fundamental Laws of Pixel Array Configuration, and Relationship of Development Processing>

In the following, it is explained what kind of pixel array structure should be adopted to perform stereoscopic imaging by utilizing the above-mentioned multi-bands including the visible band and the invisible band. In Japanese Patent Application No. 2012-060738 (sparse and isotropic parallax pixel array), full-open non-parallax pixels and half-open left and right parallax pixels are arrayed as visible pixels. If, similarly, full-open parallax pixels and half-open left and right parallax pixels are arrayed as invisible pixels, an issue arises that the pixel density of visible bands lowers, and the spatial resolution capability about the visible range is diminished. That is, attainment of multi-parallax compatibility and multi-band compatibility accompanies an issue about realizing, at the same time, high spatial resolution of each component. In view of this, in the present embodiment, from the following fundamental standpoint, the arrays illustrated in FIG. 8, FIG. 9 and the like are employed.

Figure 8:
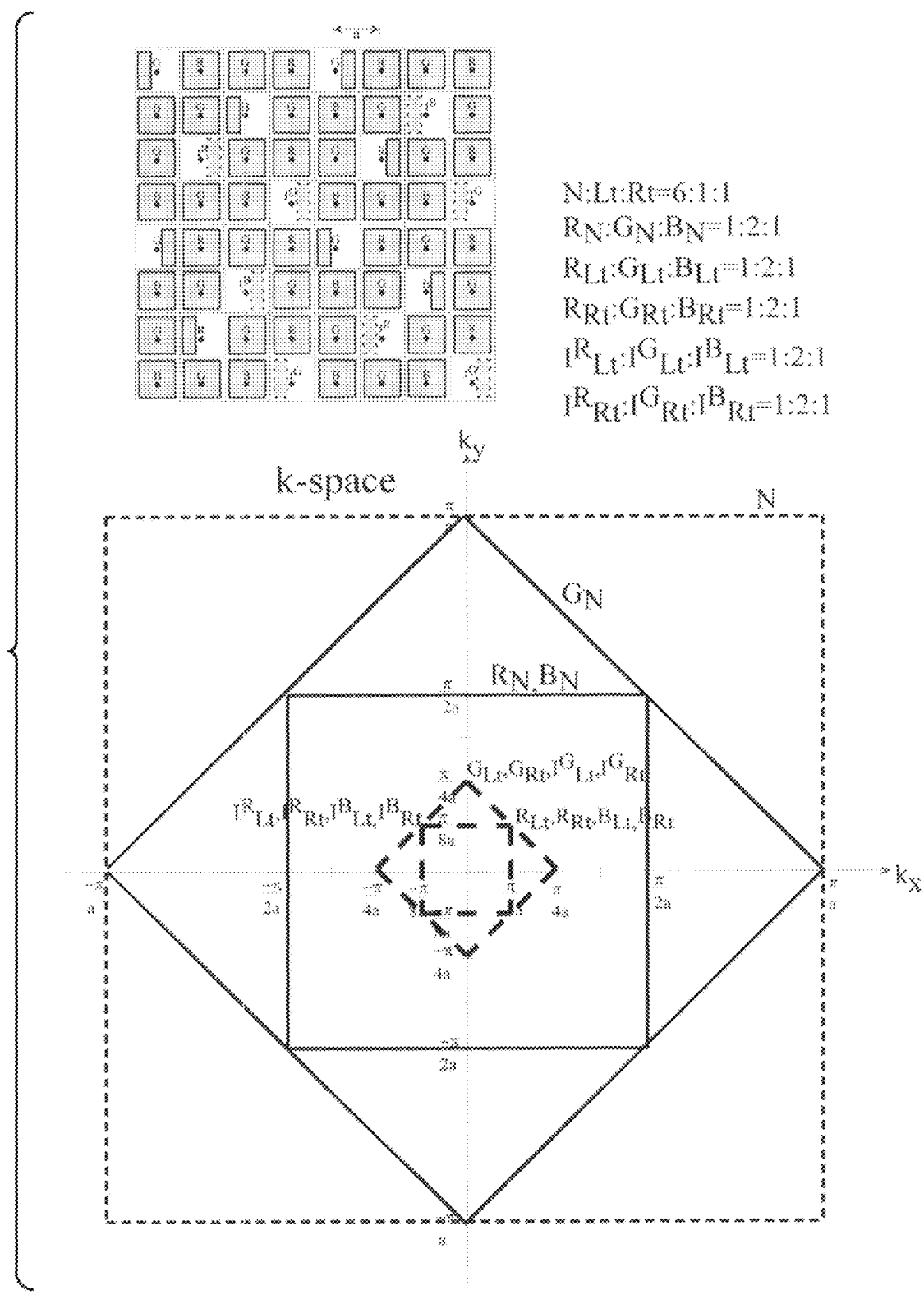
FIG. 8 is a figure that illustrates a real-space array as one example of a pixel array, and a k-space.
Figure 9:
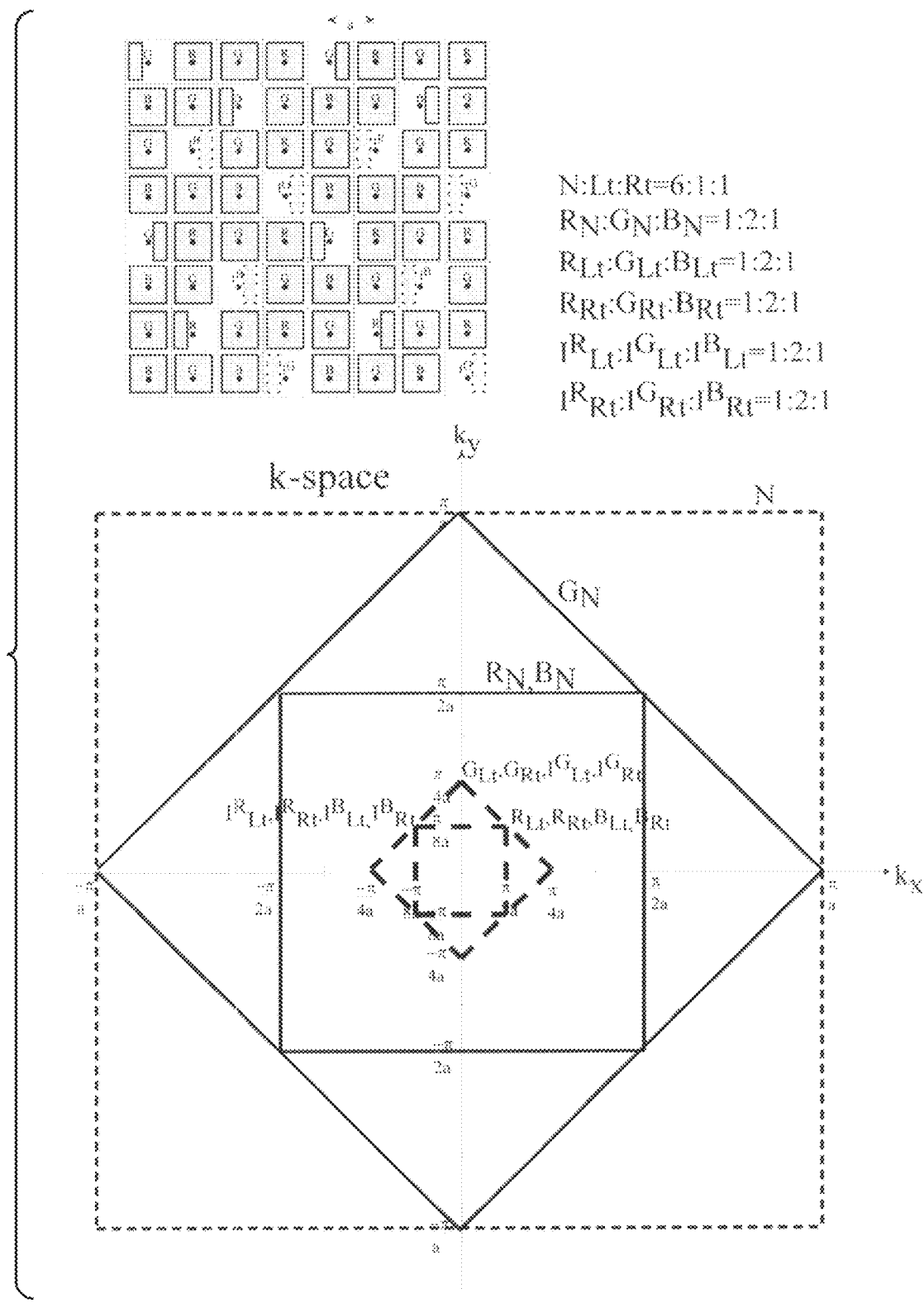
FIG. 9 is a figure that illustrates a real-space array as one example of a pixel array, and a k-space.

FIG. 8 and FIG. 9 are figures that illustrate real-space arrays as examples of pixel arrays, and k-spaces. In the examples shown, image sensors are periodically arranged according to, as the primitive lattices, the array diagrams shown on the upper portions in the respective figures. The frequency resolution region of its reciprocal lattice space also shows combinations of respective colors and respective parallaxes. In an array diagram of each figure, solid-line rectangles indicate visible parallax pixels, and broken-line rectangles indicate invisible parallax pixels. Solid-line squares indicate visible non-parallax pixels.

For 2D imaging of the RGB three colors in the visible range, the Bayer array is effective. This is because by arranging G components, for which the visual sensitivity is high, more densely than R components and B components, the G components are responsible for reference resolution, and additionally can raise the spatial resolution for the R components and the B components by utilizing a correlation among the RGB color components, that is, a relationship that color ratios R/G and R/B are fixed, or color differences R-G and B-G are fixed. Furthermore, for stereoscopic imaging of the RGB three colors in the visible range, the "N:Lt:Rt=6:1:1" array disclosed in Japanese Patent Application No. 2012-060738 is most effective in terms of capturing a 2D-3D seamless image. That is, a 2D image and a 3D image can both be developed at high resolutions. This is because in the monocular stereoscopic imaging system, by utilizing the property that parallaxes occur only in blurred regions, the density of parallax pixels is lowered, the reference resolution is maintained by N pixels, and the high resolution information of an N image (2D image) captured by the N pixels is reflected in a parallax Lt image and a parallax Rt image (3D image). It has been confirmed experimentally that the "N:Lt:Rt=14:1:1" array disclosed in Japanese Patent Application No. 2012-060738 also shows performance effective for capturing of a 2D-3D seamless image. Any array that meets N:Lt:Rt=6 or higher:1:1 may have a potential for performance effective for capturing of a 2D-3D seamless image. An image that can be simultaneously viewed by a viewer wearing 3D glasses and a viewer not wearing 3D glasses is called a 2D-3D seamless image.

In view of this, in the present embodiment, if a pixel array consisting only of visible pixels is expanded to a pixel array to which invisible pixels are added, some visible non-parallax pixels are replaced with invisible parallax pixels while employing N:Lt:Rt=14:1:1 disclosed in Japanese Patent Application No. 2012-060738 as a basic structure. In more detail, while employing an N:Lt:Rt=14:1:1 array (RGB three-color array) of Japanese Patent Application No. 2012-060738 that ensures a 2D-3D seamless high resolution output in the visible range, parallax pixels added to an N:Lt:Rt=6:1:1 array are allocated respectively to near-infrared three-band parallax pixels. By allocating pixels in this manner, as illustrated, the N:Lt:Rt=14:1:1 array is made responsible for a basic resolution of resolving simultaneously a 2D-3D seamless image in the visible light range at a high resolution. On the other hand, non-parallax pixels are not employed as invisible pixels, but only parallax pixels are added. When simultaneously outputting, in such an array, a 2D-3D seamless image in the invisible light range at a high resolution, first, an invisible light non-parallax image is caused to have a high resolution by reflecting information of a visible light non-parallax image. Thereafter, by utilizing information of invisible parallax pixels, an invisible high-resolution stereoscopic image is generated. Accordingly, non-parallax pixels do not have to be provided as invisible pixels.

An array shown in the upper portion of FIG. 8 has a frequency resolution shown in the lower portion of FIG. 8 at the time of sampling. This presents a possibility that at a development processing step, by utilizing information of components that show high resolution to the outermost side, the frequency resolution of other components can be raised to the resolution of the former components. In order to do so, while keeping the densities of visible parallax pixels and invisible parallax pixels low, those pixels may be arranged so as not to gather but to be distanced from each other so that damages to visible non-parallax pixels are minimized. On the other hand, in order for respective colors or bands, and respective components having parallaxes to exhibit the frequency resolution as shown in the lower portion of FIG. 8, respective components need to be arranged isotropically. Simultaneously, the basic structure of the color array is presumed to maintain the Bayer array. In view of this, according to the fundamental law of arrays, in order to arrange respective components isotropically, and at the same time arrange them so as not to gather relative to visible N pixels, one parallax pixel of a wavelength band component is arranged to be isotropic, and additionally arranged to be most distanced from another parallax pixel of the wavelength band. Furthermore, when six wavelength bands are considered collectively without distinguishing between visibility and invisibility, parallax pixels of the same viewpoints are arranged to be most distanced from each other, invisible parallax pixels are arranged to be most distanced from each other, and also visible parallax pixels are arranged to be most distanced from each other. A similar principle applies also to an array shown in the upper portion of FIG. 9. Depending on how the order of priority of the last-mentioned conditions is determined, an array may be the array of FIG. 8 or the array of FIG. 9. The array of FIG. 8 is the one that is adopted when priority is placed on distancing non-parallax pixels from each other. The array of FIG. 9 is the one that is adopted when priority is placed on maximizing the distances among parallax pixels of the same viewpoints.

Figure 11:
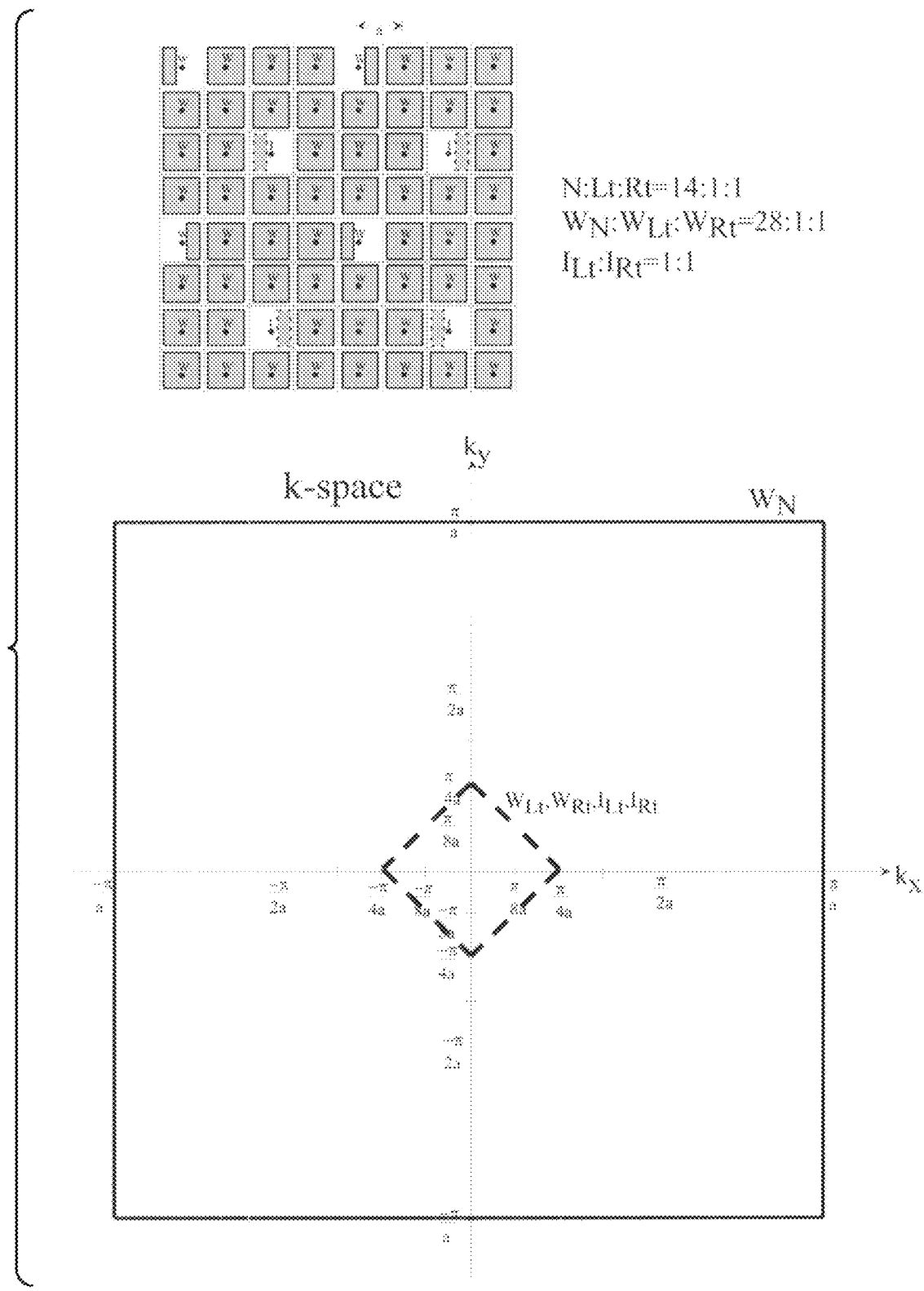
FIG. 11 is a figure that illustrates a real-space array as one example of a pixel array, and a k-space.
Figure 12:
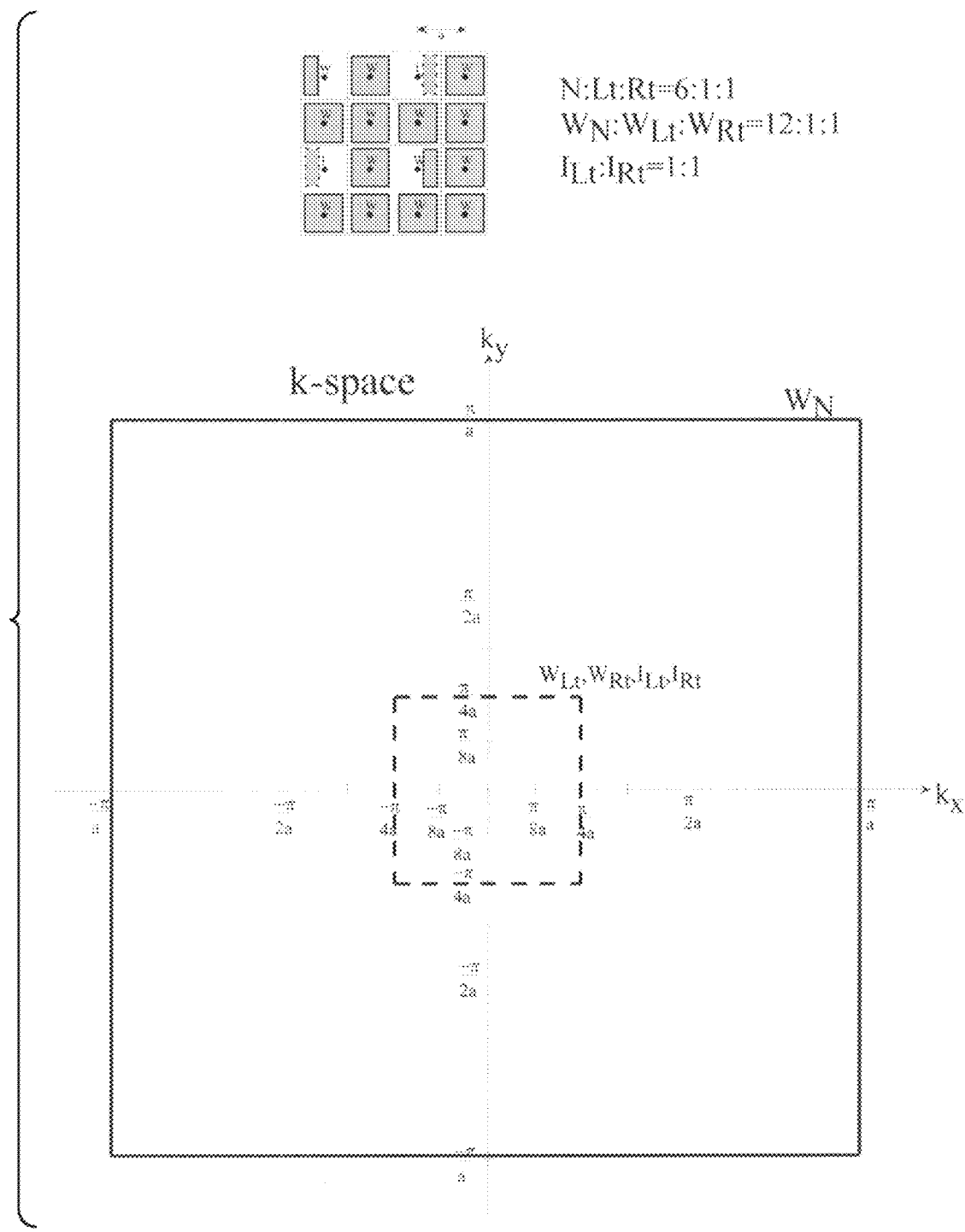
FIG. 12 is a figure that illustrates a real-space array as one example of a pixel array, and a k-space.

As described in detail later, examples of arrays obtained by expanding a monochromatic stereoscopic image sensor into a two-band (visible and near-infrared) stereoscopic image sensor are shown in FIG. 11 and FIG. 12. The pixel arrays shown in FIG. 11 and FIG. 12 conform to the above-mentioned arranges laws.

<Mixed Stereoscopic Development of Visible Wavelength Band and Invisible Wavelength Band>

The following is some more detailed explanation about utilization of the property that positions of image-formed planes for the visible wavelength band and the invisible wavelength band are different from each other even if a single optical system is used. By utilizing this property, a new effect that a parallax is generated newly even at a focal position is created if development processing is performed while providing parallax information of the invisible band to stereoscopic development in the visible band. In a monocular stereoscopic imaging system of only visible pixels, a parallax does not occur in a subject image at a focal position, and parallaxes occur only in subject images at afocal positions. A natural stereoscopic vision can be obtained in this case also, but parallaxes are present in images of focal positions sensed by right and left human eyes. Even so, unfocused portions are recognized only obscurely. Accordingly, by utilizing the property that image-formed positions of invisible light are different, a monocular stereoscopic imaging system that generates a stereoscopic image closer to a stereoscopic image sensed by a visual system can be provided.

On the other hand, in stereoscopic development of the invisible wavelength band, sampling of image-capturing information is performed only at an extremely low resolution. However, there is a demand that a subject image in the invisible wavelengths be viewed as an image with a high spatial resolution, even if such an image is spurious. In view of this, invisible stereoscopic development at a high resolution is made possible by, also in stereoscopic development, supplementing, with sampling information of visible parallax pixels, sampling information that is insufficient with only information of invisible parallax pixels, while reflecting, in 2D development of the invisible wavelength band, 2D resolution of the visible wavelength band.

The following patent documents that were submitted by the same inventor as those of the present application may be referred to in understanding explanation of monocular stereoscopic imaging of the visible range, and its developing method.

Document A1: PCT/JP2013/001811
Document A2: Japanese Patent Application Publication No. 2013-229765
Document A3: PCT/JP2013/001745

Example 1

————Visible+Invisible Six-Band Sparse Parallax Pixel Array————

In the example shown, image sensors are periodically arranged according to, as the primitive lattice, the array diagram shown on the upper portion in FIG. 8. The frequency resolution region of its reciprocal lattice space also shows combinations of respective colors and respective parallaxes. It is described as the k-space of a wavenumber k which is expressed as $k=2\pi f$, assuming that the frequency is f.

Figure 10:
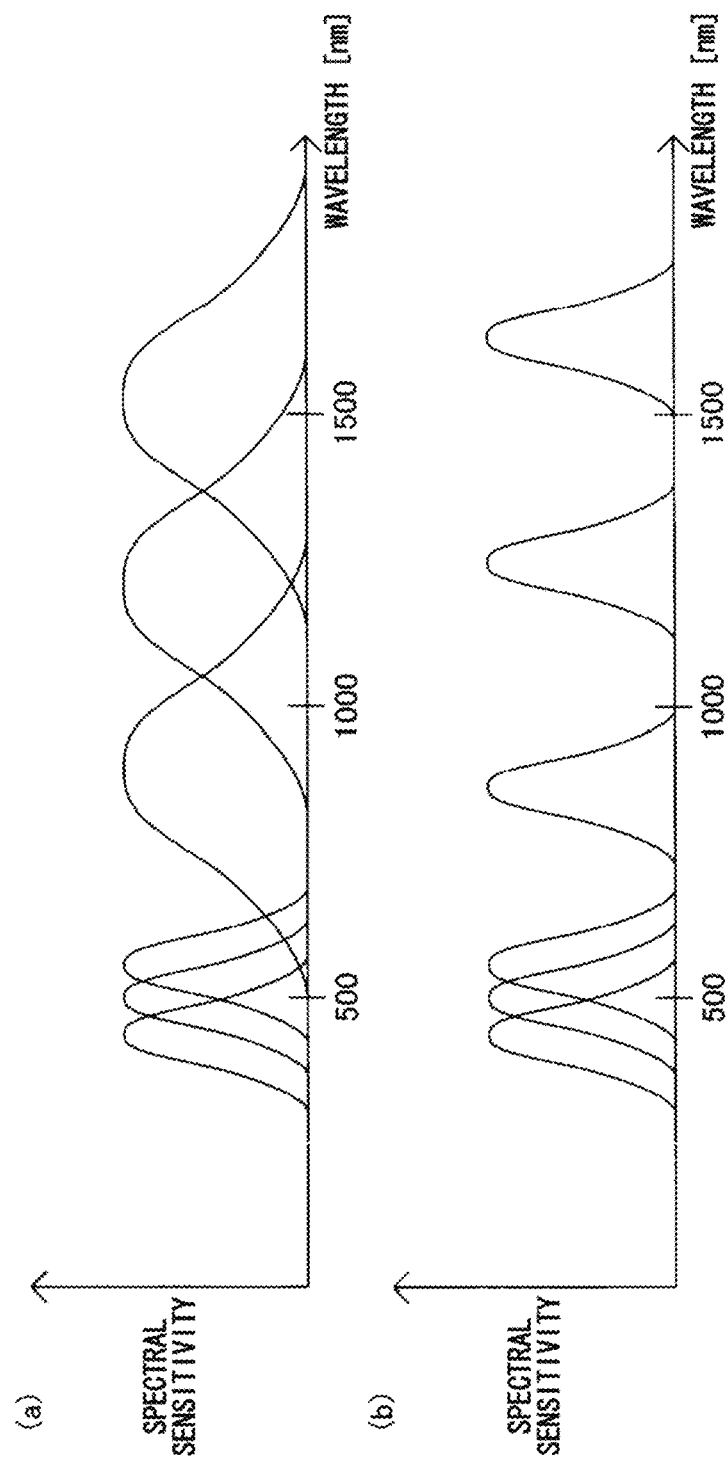
FIG. 10 is a figure for explaining a relationship between wavelength and spectral sensitivity.

FIG. 10 is a figure for explaining a relationship between wavelength and spectral sensitivity. The horizontal axis indicates wavelength [nm], and the vertical axis indicates spectral sensitivity. As illustrated in (a) and (b) of FIG. 10, color filters having generally used spectral characteristics are used as RGB color filter for visible light. On the other hand, as $I_1$, $I_2$ and $I_3$ bandpass filters for near-infrared light, as illustrated in (a) of FIG. 10, bandpass filters that have wide half value widths may be used, or as illustrated in (b) of FIG. 10, bandpass filters that have narrow half value widths and transmit particular wavelengths may be used. As bandpass filters for near-infrared light, bandpass filters of mutually different three bands can be used.

In the following explanation, three colors of visible light and three bands of near-infrared light are sometimes called six bands collectively, for convenience. Also, the color component of visible light and the band components of near-infrared light are sometimes called color band components collectively. Also, symbols B, G, R, $I^B$, $I^G$ and $I^R$ are used, and this order corresponds to the ascending order of wavelength of the bands.

Respective color band components are distinguished as a non-parallax pixel, a left parallax pixel or a right parallax pixel with a subscript suffix N, Lt or Rt, respectively.

Visible non-parallax pixels: $R_N$, $G_N$ and $B_N$
Visible left parallax pixels: $R_{Lt}$, $G_{Lt}$ and $B_{Lt}$ Visible right parallax pixels: $R_{Rt}$, $G_{Rt}$ and $B_{Rt}$ Near-infrared left parallax pixels: $I^R_{Lt}$, $I^G_{Lt}$ and $I^B_{Lt}$ Near-infrared right parallax pixels: $I^R_{Rt}$, $I^G_{Rt}$ and $I^B_{Rt}$ Although, for convenience, $I^B$, $I^G$ and $I^R$ were named based on the ascending order of wavelength, their roles may be replaced actually. That is, a component with a high pixel density may be any of them, and also, the longest wavelength side of the near-infrared three bands is not necessarily positioned in a row where an R pixel is at in FIG. 8.

Visible and invisible unmixed development is explained. A processing procedure is approximately like the one shown below.

1) Input of color/parallax multiplexed mosaic image data
2) Global gain balance correction of color/parallax mosaic image
3) Generation of tentative visible and invisible parallax images
4) Generation of visible non-parallax color mosaic image by correction of left and right local illuminance distributions (Local Gain Balance Correction)
5) Generation of visible non-parallax reference image
6) Generation of invisible non-parallax reference image
7) Generation of actual visible and invisible parallax images
8) Conversion of visible and invisible images into output color space A detailed explanation follows.

1) Input of Color/Parallax Multiplexed Mosaic Image Data

A single panel type mosaic image on which color bands and parallaxes of visible light and near-infrared light in FIG. 8 are multiplexed is expressed by M(x,y). The gradation is assumed to be linear gradation output by A/D conversion. That is, pixel values are proportional to light amount. This is sometimes called RAW data.

2) Global Gain Balance Correction of Color/Parallax Mosaic Image

As the size of the aperture decreases, real issues posed by the illuminance of light entering a left parallax pixel and the illuminance of light entering a right parallax pixel become more significant, and the issues arise not only from simply a difference in relative distributions between left and right, but from a large difference in average signal levels in the entire image. Because of this, gain correction is performed to coordinate the entire brightness at this step. This occurs similarly to both visible light and near-infrared light. For that purpose, by using a captured subject image as it is, the average value of pixel values of non-parallax pixels over the entire image, the average value of pixel values of left parallax pixels over the entire image and the average value of pixel values of right parallax pixels over the entire image are calculated. There are three signal levels in visible light. There are two signal levels in near-infrared light.

First, gain correction is performed so as to match signal levels with the average values as reference points between left and right. This is based on an assumption that signal information necessary for level matching can be obtained from a subject image itself without capturing a solid color surface because even if there is a parallax, left and right parallax pixels capture subject images of a similar range. Gain correction is performed so as to match signal levels with the average values as reference points between left and right. At this time, there are two possible manners of obtaining the reference points which are arithmetic means and geometrical means. Thereafter, for visible light, a geometrical mean between a signal level obtained as an average of left and right and a signal level of a non-parallax pixel is taken, and gain correction is performed to match a signal level to the average value. This procedure is performed for each color band component of R, G, B, $I^R$, $I^G$ and $I^B$. The average value corresponding to each of them is expressed as follows:

$\overline{R}_N, \overline{R}_{Lt}, \overline{R}_{Rt}$, $\overline{G}_N, \overline{G}_{Lt}, \overline{G}_{Rt}$, $\overline{B}_N, \overline{B}_{Lt}, \overline{B}_{Rt}$, $\overline{I}_{Lt}^R, \overline{I}_{Rt}^R$, $\overline{I}_{Lt}^G, \overline{I}_{Rt}^G$, $\overline{I}_{Lt}^B, \overline{I}_{Rt}^B$, The arithmetic mean type system is employed if all non-parallax pixels have full-open masks. The geometrical mean type system is employed if all non-parallax pixels have half-open masks. Accordingly, in the present embodiment, the arithmetic mean type system is employed.

For convenience, in the mosaic image M(x,y):

a signal plane of visible R component non-parallax pixels is denoted as $R_{N\_mosaic}(x,y)$;

a signal plane of visible R component left parallax pixels is denoted as $R_{Lt\_mosaic}(x,y)$;

a signal plane of visible R component right parallax pixels is denoted as $R_{Rt\_mosaic}(x,y)$;

a signal plane of visible G component left parallax pixels is denoted as $G_{N\_mosaic}(x,y)$;

a signal plane of visible G component non-parallax pixels is denoted as $G_{Lt\_mosaic}(x,y)$;

a signal plane of visible G component right parallax pixels is denoted as $G_{Rt\_mosaic}(x,y)$;

a signal plane of visible B component non-parallax pixels is denoted as $B_{N\_mosaic}(x,y)$;

a signal plane of visible B component left parallax pixels is denoted as $B_{Lt\_mosaic}(x,y)$;

a signal plane of visible B component right parallax pixels is $B_{Rt\_mosaic}(x,y)$;

a signal plane of near-infrared $I^R$ component left parallax pixels is denoted as $I^R_{Lt\_mosaic}(x,y)$;

a signal plane of near-infrared $I^R$ component right parallax pixels is denoted as $I^R_{Rt\_mosaic}(x,y)$;

a signal plane of near-infrared $I^G$ component left parallax pixels is denoted as $I^G_{N\_mosaic}(x,y)$;

a signal plane of near-infrared $I^G$ component right parallax pixels is denoted as $I^G_{Rt\_mosaic}(x,y)$;

a signal plane of near-infrared $I^B$ component left parallax pixels is denoted as $I^B_{Lt\_mosaic}(x,y)$; and a signal plane of near-infrared $I^B$ component right parallax pixels is denoted as $I^B_{Rt\_mosaic}(x,y)$.

a) In Case of Arithmetic Means Between Left and Right Average Values $$\overline{m}_R = \sqrt{\overline{R}_N \cdot \frac{\overline{R}_{Lt} + \overline{R}_{Rt}}{2}}$$

$$\overline{m}_G = \sqrt{\overline{G}_N \cdot \frac{\overline{G}_{Lt} + \overline{G}_{Rt}}{2}}$$

$$\overline{m}_B = \sqrt{\overline{B}_N \cdot \frac{\overline{B}_{Lt} + \overline{B}_{Rt}}{2}}$$

-continued $$\overline{m}_{IR} = \frac{\overline{I}_{Lt}^R + \overline{I}_{Rt}^R}{2}$$

$$\overline{m}_{IG} = \frac{\overline{I}_{Lt}^G + \overline{I}_{Rt}^G}{2}$$

$$\overline{m}_{IB} = \frac{\overline{I}_{Lt}^B + \overline{I}_{Rt}^B}{2}$$

Gain Values for Visible Non-Parallax Pixels $$\overline{g}_{R_N} = \frac{\overline{m}_R}{\overline{R}_N} = \sqrt{\frac{\overline{R}_{Lt} + \overline{R}_{Rt}}{2\overline{R}_N}}$$

$$\overline{g}_{G_N} = \frac{\overline{m}_G}{\overline{G}_N} = \sqrt{\frac{\overline{G}_{Lt} + \overline{G}_{Rt}}{2\overline{G}_N}}$$

$$\overline{g}_{B_N} = \frac{\overline{m}_B}{\overline{B}_N} = \sqrt{\frac{\overline{B}_{Lt} + \overline{B}_{Rt}}{2\overline{B}_N}}$$

Gain Values for Visible and Near-Infrared Left Parallax Pixels $$\overline{g}_{R_{Lt}} = \frac{\overline{m}_R}{\overline{R}_{Lt}} = \sqrt{\frac{\overline{R}_N}{\overline{R}_{Lt}} \cdot \frac{\overline{R}_{Lt} + \overline{R}_{Rt}}{2\overline{R}_{Lt}}}$$

$$\overline{g}_{G_{Lt}} = \frac{\overline{m}_G}{\overline{G}_{Lt}} = \sqrt{\frac{\overline{G}_N}{\overline{G}_{Lt}} \cdot \frac{\overline{G}_{Lt} + \overline{G}_{Rt}}{2\overline{G}_{Lt}}}$$

$$\overline{g}_{B_{Lt}} = \frac{\overline{m}_B}{\overline{B}_{Lt}} = \sqrt{\frac{\overline{B}_N}{\overline{B}_{Lt}} \cdot \frac{\overline{B}_{Lt} + \overline{B}_{Rt}}{2\overline{B}_{Lt}}}$$

$$\overline{g}_{I_{Lt}^R} = \frac{\overline{m}_{IR}}{\overline{I}_{Lt}^R} = \frac{\overline{I}_{Lt}^R + \overline{I}_{Rt}^R}{2\overline{I}_{Lt}^R}$$

$$\overline{g}_{I_{Lt}^G} = \frac{\overline{m}_{IG}}{\overline{I}_{Lt}^G} = \frac{\overline{I}_{Lt}^G + \overline{I}_{Rt}^G}{2\overline{I}_{Lt}^G}$$

$$\overline{g}_{I_{Lt}^B} = \frac{\overline{m}_{IB}}{\overline{I}_{Lt}^B} = \frac{\overline{I}_{Lt}^B + \overline{I}_{Rt}^B}{2\overline{I}_{Lt}^B}$$

Gain Values for Visible and Near-Infrared Right Parallax Pixels $$\overline{g}_{R_{Rt}} = \frac{\overline{m}_R}{\overline{R}_{Rt}} = \sqrt{\frac{\overline{R}_N}{\overline{R}_{Rt}} \cdot \frac{\overline{R}_{Lt} + \overline{R}_{Rt}}{2\overline{R}_{Rt}}}$$

$$\overline{g}_{G_{Rt}} = \frac{\overline{m}_G}{\overline{G}_{Rt}} = \sqrt{\frac{\overline{G}_N}{\overline{G}_{Rt}} \cdot \frac{\overline{G}_{Lt} + \overline{G}_{Rt}}{2\overline{G}_{Rt}}}$$

$$\overline{g}_{B_{Rt}} = \frac{\overline{m}_B}{\overline{B}_{Rt}} = \sqrt{\frac{\overline{B}_N}{\overline{B}_{Rt}} \cdot \frac{\overline{B}_{Lt} + \overline{B}_{Rt}}{2\overline{B}_{Rt}}}$$

$$\overline{g}_{I_{Rt}^R} = \frac{\overline{m}_{IR}}{\overline{I}_{Rt}^R} = \frac{\overline{I}_{Lt}^R + \overline{I}_{Rt}^R}{2\overline{I}_{Rt}^R}$$

$$\overline{g}_{I_{Rt}^G} = \frac{\overline{m}_{IG}}{\overline{I}_{Rt}^G} = \frac{\overline{I}_{Lt}^G + \overline{I}_{Rt}^G}{2\overline{I}_{Rt}^G}$$

$$\overline{g}_{I_{Rt}^B} = \frac{\overline{m}_{IB}}{\overline{I}_{Rt}^B} = \frac{\overline{I}_{Lt}^B + \overline{I}_{Rt}^B}{2\overline{I}_{Rt}^B}$$

Global Gain Correction on Visible Non-Parallax Pixels $$R'_{N\_mosaic}(x, y) = R_{N\_mosaic}(x, y) \cdot \overline{g}_{R_N} = R_{N\_mosaic}(x, y) \cdot \sqrt{\frac{\overline{R}_{Lt} + \overline{R}_{Rt}}{2\overline{R}_N}}$$

$$G'_{N\_mosaic}(x, y) = G_{N\_mosaic}(x, y) \cdot \overline{g}_{G_N} = G_{N\_mosaic}(x, y) \cdot \sqrt{\frac{\overline{G}_{Lt} + \overline{G}_{Rt}}{2\overline{G}_N}}$$

$$B'_{N\_mosaic}(x, y) = B_{N\_mosaic}(x, y) \cdot \overline{g}_{B_N} = B_{N\_mosaic}(x, y) \cdot \sqrt{\frac{\overline{B}_{Lt} + \overline{B}_{Rt}}{2\overline{B}_N}}$$

Global Gain Correction on Visible and Near-Infrared Left Parallax Pixels $$R'_{Lt\_mosaic}(x, y) = R_{Lt\_mosaic}(x, y) \cdot \overline{g}_{R_{Lt}} = R_{Lt\_mosaic}(x, y) \cdot \sqrt{\frac{\overline{R}_N}{\overline{R}_{Lt}} \cdot \frac{\overline{R}_{Lt} + \overline{R}_{Rt}}{2\overline{R}_{Lt}}}$$

$$G'_{Lt\_mosaic}(x, y) = G_{Lt\_mosaic}(x, y) \cdot \overline{g}_{G_{Lt}} = G_{Lt\_mosaic}(x, y) \cdot \sqrt{\frac{\overline{G}_N}{\overline{G}_{Lt}} \cdot \frac{\overline{G}_{Lt} + \overline{G}_{Rt}}{2\overline{G}_{Lt}}}$$

$$B'_{Lt\_mosaic}(x, y) = B_{Lt\_mosaic}(x, y) \cdot \overline{g}_{B_{Lt}} = B_{Lt\_mosaic}(x, y) \cdot \sqrt{\frac{\overline{B}_N}{\overline{B}_{Lt}} \cdot \frac{\overline{B}_{Lt} + \overline{B}_{Rt}}{2\overline{B}_{Lt}}}$$

$$I'^R_{Lt\_mosaic}(x, y) = I^R_{Lt\_mosaic}(x, y) \cdot \overline{g}_{I_{Lt}^R} = I^R_{Lt\_mosaic}(x, y) \cdot \frac{\overline{I}_{Lt}^R + \overline{I}_{Rt}^R}{2\overline{I}_{Lt}^R}$$

$$I'^G_{Lt\_mosaic}(x, y) = I^G_{Lt\_mosaic}(x, y) \cdot \overline{g}_{I_{Lt}^G} = I^G_{Lt\_mosaic}(x, y) \cdot \frac{\overline{I}_{Lt}^G + \overline{I}_{Rt}^G}{2\overline{I}_{Lt}^G}$$

$$I'^B_{Lt\_mosaic}(x, y) = I^B_{Lt\_mosaic}(x, y) \cdot \overline{g}_{I_{Lt}^B} = I^B_{Lt\_mosaic}(x, y) \cdot \frac{\overline{I}_{Lt}^B + \overline{I}_{Rt}^B}{2\overline{I}_{Lt}^B}$$

Global Gain Correction on Visible and Near-Infrared Right Parallax Pixels $$R'_{Rt\_mosaic}(x, y) = R_{Rt\_mosaic}(x, y) \cdot \overline{g}_{R_{Rt}} = R_{Rt\_mosaic}(x, y) \cdot \sqrt{\frac{\overline{R}_N}{\overline{R}_{Rt}} \cdot \frac{\overline{R}_{Lt} + \overline{R}_{Rt}}{2\overline{R}_{Rt}}}$$

$$G'_{Rt\_mosaic}(x, y) = G_{Rt\_mosaic}(x, y) \cdot \overline{g}_{G_{Rt}} = G_{Rt\_mosaic}(x, y) \cdot \sqrt{\frac{\overline{G}_N}{\overline{G}_{Rt}} \cdot \frac{\overline{G}_{Lt} + \overline{G}_{Rt}}{2\overline{G}_{Rt}}}$$

$$B'_{Rt\_mosaic}(x, y) = B_{Rt\_mosaic}(x, y) \cdot \overline{g}_{B_{Rt}} = B_{Rt\_mosaic}(x, y) \cdot \sqrt{\frac{\overline{B}_N}{\overline{B}_{Rt}} \cdot \frac{\overline{B}_{Lt} + \overline{B}_{Rt}}{2\overline{B}_{Rt}}}$$

$$I'^R_{Rt\_mosaic}(x, y) = I^R_{Rt\_mosaic}(x, y) \cdot \overline{g}_{I^R_{Rt}} = I^R_{Rt\_mosaic}(x, y) \cdot \frac{\overline{I}^R_{Lt} + \overline{I}^R_{Rt}}{2\overline{I}^R_{Rt}}$$

$$I'^G_{Rt\_mosaic}(x, y) = I^G_{Rt\_mosaic}(x, y) \cdot \overline{g}_{I^G_{Rt}} = I^G_{Rt\_mosaic}(x, y) \cdot \frac{\overline{I}^G_{Lt} + \overline{I}^G_{Rt}}{2\overline{I}^G_{Rt}}$$

$$I'^B_{Rt\_mosaic}(x, y) = I^B_{Rt\_mosaic}(x, y) \cdot \overline{g}_{I^B_{Rt}} = I^B_{Rt\_mosaic}(x, y) \cdot \frac{\overline{I}^B_{Lt} + \overline{I}^B_{Rt}}{2\overline{I}^B_{Rt}}$$

b) In Case of Geometrical Means Between Left and Right Average Values $$\overline{m}_R = \sqrt{\overline{R}_N \cdot \sqrt{\overline{R}_{Lt} \cdot \overline{R}_{Rt}}}$$

$$\overline{m}_G = \sqrt{\overline{G}_N \cdot \sqrt{\overline{G}_{Lt} \cdot \overline{G}_{Rt}}}$$

$$\overline{m}_B = \sqrt{\overline{B}_N \cdot \sqrt{\overline{B}_{Lt} \cdot \overline{B}_{Rt}}}$$

$$\overline{m}_{I^R} = \sqrt{\overline{I}_{Lt}^R \cdot \overline{I}_{Rt}^R}$$

$$\overline{m}_{I^G} = \sqrt{\overline{I}_{Lt}^G \cdot \overline{I}_{Rt}^G}$$

$$\overline{m}_{I^B} = \sqrt{\overline{I}_{Lt}^B \cdot \overline{I}_{Rt}^B}$$

Gain Values for Visible Non-Parallax Pixels $$\overline{g}_{R_N} = \frac{\overline{m}_R}{\overline{R}_N} = \sqrt{\frac{\sqrt{\overline{R}_{Lt} \cdot \overline{R}_{Rt}}}{\overline{R}_N}}$$

$$\overline{g}_{G_N} = \frac{\overline{m}_G}{\overline{G}_N} = \sqrt{\frac{\sqrt{\overline{G}_{Lt} \cdot \overline{G}_{Rt}}}{\overline{G}_N}}$$

$$\overline{g}_{B_N} = \frac{\overline{m}_B}{\overline{B}_N} = \sqrt{\frac{\sqrt{\overline{B}_{Lt} \cdot \overline{B}_{Rt}}}{\overline{B}_N}}$$

Gain Values for Visible and Near-Infrared Left Parallax Pixels $$\overline{g}_{R_{Lt}} = \frac{\overline{m}_R}{\overline{R}_{Lt}} = \sqrt{\frac{\overline{R}_N}{\overline{R}_{Lt}} \cdot \sqrt{\frac{\overline{R}_{Rt}}{\overline{R}_{Lt}}}}$$

$$\overline{g}_{G_{Lt}} = \frac{\overline{m}_G}{\overline{G}_{Lt}} = \sqrt{\frac{\overline{G}_N}{\overline{G}_{Lt}} \cdot \sqrt{\frac{\overline{G}_{Rt}}{\overline{G}_{Lt}}}}$$

$$\overline{g}_{B_{Lt}} = \frac{\overline{m}_B}{\overline{B}_{Lt}} = \sqrt{\frac{\overline{B}_N}{\overline{B}_{Lt}} \cdot \sqrt{\frac{\overline{B}_{Rt}}{\overline{B}_{Lt}}}}$$

$$\overline{g}_{I^R_{Lt}} = \frac{\overline{m}_R}{\overline{I}^R_{Lt}} = \sqrt{\frac{\overline{I}^R_{Rt}}{\overline{I}^R_{Lt}}}$$

$$\overline{g}_{I^G_{Lt}} = \frac{\overline{m}_G}{\overline{I}^G_{Lt}} = \sqrt{\frac{\overline{I}^G_{Rt}}{\overline{I}^G_{Lt}}}$$

$$\overline{g}_{I^B_{Lt}} = \frac{\overline{m}_B}{\overline{I}^B_{Lt}} = \sqrt{\frac{\overline{I}^B_{Rt}}{\overline{I}^B_{Lt}}}$$

Gain Values for Visible and Near-Infrared Right Parallax Pixels $$\overline{g}_{R_{Rt}} = \frac{\overline{m}_R}{\overline{R}_{Rt}} = \sqrt{\frac{\overline{R}_N}{\overline{R}_{Rt}} \cdot \sqrt{\frac{\overline{R}_{Lt}}{\overline{R}_{Rt}}}}$$

$$\overline{g}_{G_{Rt}} = \frac{\overline{m}_G}{\overline{G}_{Rt}} = \sqrt{\frac{\overline{G}_N}{\overline{G}_{Rt}} \cdot \sqrt{\frac{\overline{G}_{Lt}}{\overline{G}_{Rt}}}}$$

$$\overline{g}_{B_{Rt}} = \frac{\overline{m}_B}{\overline{B}_{Rt}} = \sqrt{\frac{\overline{B}_N}{\overline{B}_{Rt}} \cdot \sqrt{\frac{\overline{B}_{Lt}}{\overline{B}_{Rt}}}}$$

$$\overline{g}_{I^R_{Rt}} = \frac{\overline{m}_R}{\overline{I}^R_{Rt}} = \sqrt{\frac{\overline{I}^R_{Lt}}{\overline{I}^R_{Rt}}}$$

$$\overline{g}_{I^G_{Rt}} = \frac{\overline{m}_G}{\overline{I}^G_{Rt}} = \sqrt{\frac{\overline{I}^G_{Lt}}{\overline{I}^G_{Rt}}}$$

$$\overline{g}_{I^B_{Rt}} = \frac{\overline{m}_B}{\overline{I}^B_{Rt}} = \sqrt{\frac{\overline{I}^B_{Lt}}{\overline{I}^B_{Rt}}}$$

Global Gain Correction on Visible Non-Parallax Pixels $$R'_{N\_mosaic}(x, y) = R_{N\_mosaic}(x, y) \cdot \overline{g}_{R_N} = R_{N\_mosaic}(x, y) \cdot \sqrt{\frac{\sqrt{\overline{R}_{Lt} \cdot \overline{R}_{Rt}}}{\overline{R}_N}}$$

$$G'_{N\_mosaic}(x, y) = G_{N\_mosaic}(x, y) \cdot \overline{g}_{G_N} = G_{N\_mosaic}(x, y) \cdot \sqrt{\frac{\sqrt{\overline{G}_{Lt} \cdot \overline{G}_{Rt}}}{\overline{G}_N}}$$

$$B'_{N\_mosaic}(x, y) = B_{N\_mosaic}(x, y) \cdot \overline{g}_{B_N} = B_{N\_mosaic}(x, y) \cdot \sqrt{\frac{\sqrt{\overline{B}_{Lt} \cdot \overline{B}_{Rt}}}{\overline{B}_N}}$$

Global Gain Correction on Visible and Near-Infrared Left Parallax Pixels $$R'_{Lt\_mosaic}(x, y) = R_{Lt\_mosaic}(x, y) \cdot \overline{g}_{R_{Lt}} = R_{Lt\_mosaic}(x, y) \cdot \sqrt{\frac{\overline{R}_N}{\overline{R}_{Lt}} \cdot \sqrt{\frac{\overline{R}_{Rt}}{\overline{R}_{Lt}}}}$$

$$G'_{Lt\_mosaic}(x, y) =$$

$$G_{Lt\_mosaic}(x, y) \cdot \overline{g}_{G_{Lt}} = G_{Lt\_mosaic}(x, y) \cdot \sqrt{\frac{\overline{G}_N}{\overline{G}_{Lt}} \cdot \sqrt{\frac{\overline{G}_{Rt}}{\overline{G}_{Lt}}}}$$

$$B'_{Lt\_mosaic}(x, y) = B_{Lt\_mosaic}(x, y) \cdot \overline{g}_{B_{Lt}} = B_{Lt\_mosaic}(x, y) \cdot \sqrt{\frac{\overline{B}_N}{\overline{B}_{Lt}} \cdot \sqrt{\frac{\overline{B}_{Rt}}{\overline{B}_{Lt}}}}$$

$$I'^R_{Lt\_mosaic}(x, y) = I^R_{Lt\_mosaic}(x, y) \cdot \overline{g}_{I^R_{Lt}} = I^R_{Lt\_mosaic}(x, y) \cdot \sqrt{\frac{\overline{I}^R_{Rt}}{\overline{I}^R_{Lt}}}$$

$$I'^G_{Lt\_mosaic}(x, y) = I^G_{Lt\_mosaic}(x, y) \cdot \overline{g}_{I^G_{Lt}} = I^G_{Lt\_mosaic}(x, y) \cdot \sqrt{\frac{\overline{I}^G_{Rt}}{\overline{I}^G_{Lt}}}$$

-continued $$I'^B_{Lt\_mosaic}(x, y) = I^B_{Lt\_mosaic}(x, y) \cdot \bar{g}_{I^B_{Lt}} = I^B_{Lt\_mosaic}(x, y) \cdot \sqrt{\frac{\bar{I}^B_{Rt}}{\bar{I}^B_{Lt}}}$$

Global Gain Correction on Visible and Near-Infrared Right Parallax Pixels $$R'_{Rt\_mosaic}(x, y) =$$

$$R_{Rt\_mosaic}(x, y) \cdot \bar{g}_{R_{Rt}} = R_{Rt\_mosaic}(x, y) \cdot \sqrt{\frac{\bar{R}_N}{\bar{R}_{Rt}}} \cdot \sqrt{\frac{\bar{R}_{Lt}}{\bar{R}_{Rt}}}$$

$$G'_{Rt\_mosaic}(x, y) = G_{Rt\_mosaic}(x, y) \cdot \bar{g}_{G_{Rt}} =$$

$$G_{Rt\_mosaic}(x, y) \cdot \sqrt{\frac{\bar{G}_N}{\bar{G}_{Rt}}} \cdot \sqrt{\frac{\bar{G}_{Lt}}{\bar{G}_{Rt}}}$$

$$B'_{Rt\_mosaic}(x, y) = B_{Rt\_mosaic}(x, y) \cdot \bar{g}_{B_{Rt}} = B_{Rt\_mosaic}(x, y) \cdot \sqrt{\frac{\bar{B}_N}{\bar{B}_{Rt}}} \cdot \sqrt{\frac{\bar{B}_{Lt}}{\bar{B}_{Rt}}}$$

$$I'^R_{Rt\_mosaic}(x, y) = I^R_{Rt\_mosaic}(x, y) \cdot \bar{g}_{I^R_{Rt}} = I^R_{Rt\_mosaic}(x, y) \cdot \sqrt{\frac{\bar{I}^R_{Lt}}{\bar{I}^R_{Rt}}}$$

$$I'^G_{Rt\_mosaic}(x, y) = I^G_{Rt\_mosaic}(x, y) \cdot \bar{g}_{I^G_{Rt}} = I^G_{Rt\_mosaic}(x, y) \cdot \sqrt{\frac{\bar{I}^G_{Lt}}{\bar{I}^G_{Rt}}}$$

$$I'^B_{Rt\_mosaic}(x, y) = I^B_{Rt\_mosaic}(x, y) \cdot \bar{g}_{I^B_{Rt}} = I^B_{Rt\_mosaic}(x, y) \cdot \sqrt{\frac{\bar{I}^B_{Lt}}{\bar{I}^B_{Rt}}}$$

In the above-mentioned manner, a mosaic image in which non-parallax pixels are corrected by a single gain coefficient, left parallax pixels are corrected by a single gain coefficient and right parallax pixels are corrected by a single gain coefficient is output as M'(x,y).

3) Generation of Tentative Visible and Invisible Parallax Images

A tentative left parallax image and a tentative right parallax image having low spatial frequency resolutions are generated for each of six color bands including visible bands and near-infrared bands. For example, simple average interpolation is performed within a visible G color plane formed by gathering only left parallax pixels of a monochromatic band. For example, linear interpolation is performed according to the ratio of distances by using pixel values that are present nearby.

Similarly, simple average interpolation is performed within a visible G color plane formed by gathering only right parallax pixels of a monochromatic band. Similar processes are performed on six bands of R, G, B, $I^R$, $I^G$ and $I^R$. Furthermore, simple average interpolation is performed within a G color plane formed by gathering only non-parallax pixels of a visible monochromatic band. Similar processes are performed on each of R, G and B. That is, $R_{Lt}(x,y)$ is generated from $R_{Lt\_mosaic}(x,y)$, $R_{Rt}(x,y)$ is generated from $R_{Rt\_mosaic}(x,y)$, and $R_N(x,y)$ is generated from $R_{N\_mosaic}(x,y)$. $G_{Lt}(x,y)$ is generated from $G_{Lt\_mosaic}(x,y)$, $G_{Rt}(x,y)$ is generated from $G_{Rt\_mosaic}(x,y)$, and $G_N(x,y)$ is generated from $G_{N\_mosaic}(x,y)$. $B_{Lt}(x,y)$ is generated from $B_{Lt\_mosaic}(x,y)$, $B_{Rt}(x,y)$ is generated from $B_{Rt\_mosaic}(x,y)$, and $B_N(x,y)$ is generated from $B_{N\_mosaic}(x,y)$. $I^R_{Lt}(x,y)$ is generated from $I^R_{Lt\_mosaic}(x,y)$, $I^R_{Rt}(x,y)$ is generated from $I^R_{Rt\_mosaic}(x,y)$, $I^G_{Lt}(x,y)$ is generated from $I^G_{Lt\_mosaic}(x,y)$, $I^G_{Rt}(x,y)$ is generated from $I^G_{Rt\_mosaic}(x,y)$, $I^B_{Lt}(x,y)$ is generated from $I^B_{Lt\_mosaic}(x,y)$, and $I^B_{Rt}(x,y)$ is generated from $I^B_{Rt\_mosaic}(x,y)$.

A tentative visible R component non-parallax image is denoted as $R_N(x,y)$.

A tentative visible G component non-parallax image is denoted as $G_N(x,y)$.

A tentative visible B component non-parallax image is denoted as $B_N(x,y)$.

A tentative visible R component left parallax image is denoted as $R_{Lt}(x,y)$.

A tentative visible G component left parallax image is denoted as $G_{Lt}(x,y)$.

A tentative visible B component left parallax image is denoted as $B_{Lt}(x,y)$.

A tentative visible R component right parallax image is denoted as $R_{Rt}(x,y)$.

A tentative visible G component right parallax image is denoted as $G_{Rt}(x,y)$.

A tentative visible B component right parallax image is denoted as $B_{Rt}(x,y)$.

A tentative near-infrared $I^R$ component left parallax image is denoted as $I^R_{Lt}(x,y)$.

A tentative near-infrared $I^G$ component left parallax image is denoted as $I^G_{Lt}(x,y)$.

A tentative near-infrared $I^B$ component left parallax image is denoted as $I^B_{Lt}(x,y)$.

A tentative near-infrared $I^R$ component right parallax image is denoted as $I^R_{Rt}(x,y)$.

A tentative near-infrared $I^G$ component right parallax image is denoted as $I^G_{Rt}(x,y)$.

A tentative near-infrared $I^R$ component right parallax image is denoted as $I^B_{Rt}(x,y)$.

When forming tentative visible non-parallax images $R_N(x,y)$, $G_N(x,y)$ and $B_N(x,y)$, direction judgement within a signal plane is preferably introduced to perform the formation at high definition. Also, in a more preferable method of interpolation, if each of tentative parallax images is to be generated, highly symmetric pixels that are surrounded by four upper and lower, and left and right points, or four diagonal points are first interpolated by considering vertical and horizontal correlations or diagonal correlations by using the weighting ratio of the reciprocal of correlation amounts, and this manipulation is successively repeated on remaining pixels in the descending order of symmetricity.

4) Generation of visible non-parallax color mosaic image by correction of left and right illuminance distributions (Local Gain Balance Correction)

Next, in a similar way of thinking to the global gain correction performed in Step 2), only on RGB three bands of a visible image, pixel-by-pixel local gain correction is performed to first match the illuminance of left parallax pixels within a screen with the illuminance of right parallax pixels within the screen. This manipulation extinguishes a parallax between left and right. Then, the illuminances are matched further between a signal plane in which a left and right average has been taken and an imaging signal plane of non-parallax pixels. In this manner, a new Bayer plane having gains that are coordinated among all pixels is created. This is equivalent to replacing with an average value, and a Bayer plane from which a parallax has extinguished can be made. This is denoted as $M_N(x,y)$.

In this case also, there are two types of method as methods to set target values to be matched as a reference point of each pixel and as methods by which a parallax between left and right is extinguished, and those are a method of selecting an arithmetic mean and a method of selecting a geometrical mean. If all non-parallax pixels have full-open mask areas, the arithmetic mean type needs to be selected for matching the blur width of a subject image obtained by extinguishing a parallax between left and right with the full-open blur width. On the other hand, if all non-parallax pixels have half-open mask areas, the geometrical mean type needs to be selected for matching the blur width of a subject image obtained by extinguishing a parallax between left and right with the half-open blur width. Because in the present embodiment, non-parallax pixels are fully open, the arithmetic mean type is employed.

Furthermore, the manipulation of taking an average between a signal plane from which a parallax between left and right has been extinguished and an imaging signal plane of non-parallax pixels needs to maintain the blur widths because both of them are already matched with subject images of the same blur widths. Accordingly, at this time, geometrical means have to be taken in a common manner. Their specific equations are listed as follows.

At that time, a geometrical mean which takes into consideration the density ratio of non-parallax pixels and parallax pixels in an image sensor array is to be taken. That is, the ratio of non-parallax pixels (N), left parallax pixels (Lt) and right parallax pixels (Rt) used in the present example is, when only visible pixels are considered, N:L:R=12:1:1, that is, N:(L+R)=6:1. Accordingly, the weight of the 6/7-th power is given to parallax pixels, and the weight of the 1/7-th power is given to non-parallax pixels so that allocation is performed placing emphasis on highly dense non-parallax pixels.

a) In Case of Arithmetic Mean Between Left and Right
Average Value of Each Pixel of Visible Three Bands $$m_R(x, y) = [R_N(x, y)]^{\frac{6}{7}} \cdot \left[\frac{R_{Lt}(x, y) + R_{Rt}(x, y)}{2}\right]^{\frac{1}{7}}$$

$$m_G(x, y) = [G_N(x, y)]^{\frac{6}{7}} \cdot \left[\frac{G_{Lt}(x, y) + G_{Rt}(x, y)}{2}\right]^{\frac{1}{7}}$$

$$m_B(x, y) = [B_N(x, y)]^{\frac{6}{7}} \cdot \left[\frac{B_{Lt}(x, y) + B_{Rt}(x, y)}{2}\right]^{\frac{1}{7}}$$

Gain Value of Each Pixel for Visible Non-Parallax Pixel $$g_{R_N}(x, y) = \frac{m_R(x, y)}{R_N(x, y)} = \sqrt[7]{\frac{R_{Lt}(x, y) + R_{Rt}(x, y)}{2R_N(x, y)}}$$

$$g_{G_N}(x, y) = \frac{m_G(x, y)}{G_N(x, y)} = \sqrt[7]{\frac{G_{Lt}(x, y) + G_{Rt}(x, y)}{2G_N(x, y)}}$$

$$g_{B_N}(x, y) = \frac{m_B(x, y)}{B_N(x, y)} = \sqrt[8]{\frac{B_{Lt}(x, y) + B_{Rt}(x, y)}{2B_N(x, y)}}$$

Gain Value of Each Pixel for Visible Left Parallax Pixel $$g_{R_{Lt}}(x, y) = \frac{m_R(x, y)}{R_{Lt}(x, y)} = \left[\frac{R_N(x, y)}{R_{Lt}(x, y)}\right]^{\frac{6}{7}} \cdot \left[\frac{R_{Lt}(x, y) + R_{Rt}(x, y)}{2R_{Lt}(x, y)}\right]^{\frac{1}{7}}$$

$$g_{G_{Lt}}(x, y) = \frac{m_G(x, y)}{G_{Lt}(x, y)} = \left[\frac{G_N(x, y)}{G_{Lt}(x, y)}\right]^{\frac{6}{7}} \cdot \left[\frac{G_{Lt}(x, y) + G_{Rt}(x, y)}{2G_{Lt}(x, y)}\right]^{\frac{1}{7}}$$

$$g_{B_{Lt}}(x, y) = \frac{m_B(x, y)}{B_{Lt}(x, y)} = \left[\frac{B_N(x, y)}{B_{Lt}(x, y)}\right]^{\frac{6}{7}} \cdot \left[\frac{B_{Lt}(x, y) + B_{Rt}(x, y)}{2B_{Lt}(x, y)}\right]^{\frac{1}{7}}$$

Gain Value of Each Pixel for Visible Right Parallax Pixel $$g_{R_{Rt}}(x, y) = \frac{m_R(x, y)}{R_{Rt}(x, y)} = \left[\frac{R_N(x, y)}{R_{Rt}(x, y)}\right]^{\frac{6}{7}} \cdot \left[\frac{R_{Lt}(x, y) + R_{Rt}(x, y)}{2R_{Rt}(x, y)}\right]^{\frac{1}{7}}$$

$$g_{G_{Rt}}(x, y) = \frac{m_G(x, y)}{G_{Rt}(x, y)} = \left[\frac{G_N(x, y)}{G_{Rt}(x, y)}\right]^{\frac{6}{7}} \cdot \left[\frac{G_{Lt}(x, y) + G_{Rt}(x, y)}{2G_{Rt}(x, y)}\right]^{\frac{1}{7}}$$

$$g_{B_{Rt}}(x, y) = \frac{m_B(x, y)}{B_{Rt}(x, y)} = \left[\frac{B_N(x, y)}{B_{Rt}(x, y)}\right]^{\frac{6}{7}} \cdot \left[\frac{B_{Lt}(x, y) + B_{Rt}(x, y)}{2B_{Rt}(x, y)}\right]^{\frac{1}{7}}$$

Local Gain Correction of Each Pixel for Visible Non-Parallax Pixel $$R_N(x,y) \cdot g_{R_N}(x,y) = m_R(x,y)$$

$$G_N(x,y) \cdot g_{G_N}(x,y) = m_G(x,y)$$

$$B_N(x,y) \cdot g_{B_N}(x,y) = m_B(x,y)$$

Local Gain Correction of Each Pixel for Visible Left Parallax Pixel $$R_{Lt}(x,y) \cdot g_{R_{Lt}}(x,y) = m_R(x,y)$$

$$G_{Lt}(x,y) \cdot g_{G_{Lt}}(x,y) = m_G(x,y)$$

$$B_{Lt}(x,y) \cdot g_{B_{Lt}}(x,y) = m_B(x,y)$$

Local Gain Correction of Each Pixel for Visible Right Parallax Pixel $$R_{Rt}(x,y) \cdot g_{R_{Rt}}(x,y) = m_R(x,y)$$

$$G_{Rt}(x,y) \cdot g_{G_{Rt}}(x,y) = m_G(x,y)$$

$$B_{Rt}(x,y) \cdot g_{B_{Rt}}(x,y) = m_B(x,y)$$

b) In Case of Geometrical Mean Between Left and Right
Average Value of Each Pixel of Visible Three Bands $$m_R(x, y) = [R_N(x, y)]^{\frac{7}{8}} \cdot \left[\sqrt{R_{Lt}(x, y) \cdot R_{Rt}(x, y)}\right]^{\frac{1}{8}}$$

$$m_G(x, y) = [G_N(x, y)]^{\frac{7}{8}} \cdot \left[\sqrt{G_{Lt}(x, y) \cdot G_{Rt}(x, y)}\right]^{\frac{1}{8}}$$

$$m_B(x, y) = [B_N(x, y)]^{\frac{7}{8}} \cdot \left[\sqrt{B_{Lt}(x, y) \cdot B_{Rt}(x, y)}\right]^{\frac{1}{8}}$$

Gain Value of Each Pixel for Visible Non-Parallax Pixel $$g_{R_N}(x, y) = \frac{m_R(x, y)}{R_N(x, y)} = \sqrt[8]{\frac{\sqrt{R_{Lt}(x, y) \cdot R_{Rt}(x, y)}}{R_N(x, y)}}$$

$$g_{G_N}(x, y) = \frac{m_G(x, y)}{G_N(x, y)} = \sqrt[8]{\frac{\sqrt{G_{Lt}(x, y) \cdot G_{Rt}(x, y)}}{G_N(x, y)}}$$

$$g_{B_N}(x, y) = \frac{m_B(x, y)}{B_N(x, y)} = \sqrt[8]{\frac{\sqrt{B_{Lt}(x, y) \cdot B_{Rt}(x, y)}}{B_N(x, y)}}$$

Gain Value of Each Pixel for Visible Left Parallax Pixel $$g_{R_{Lt}}(x, y) = \frac{m_R(x, y)}{R_{Lt}(x, y)} = \left[\frac{R_N(x, y)}{R_{Lt}(x, y)}\right]^{\frac{7}{8}} \cdot \left[\sqrt{\frac{R_{Rt}(x, y)}{R_{Lt}(x, y)}}\right]^{\frac{1}{8}}$$

$$g_{G_{Lt}}(x, y) = \frac{m_G(x, y)}{G_{Lt}(x, y)} = \left[\frac{G_N(x, y)}{G_{Lt}(x, y)}\right]^{\frac{7}{8}} \cdot \left[\sqrt{\frac{G_{Rt}(x, y)}{G_{Lt}(x, y)}}\right]^{\frac{1}{8}}$$

$$g_{B_{Lt}}(x, y) = \frac{m_B(x, y)}{B_{Lt}(x, y)} = \left[\frac{B_N(x, y)}{B_{Lt}(x, y)}\right]^{\frac{7}{8}} \cdot \left[\sqrt{\frac{B_{Rt}(x, y)}{B_{Lt}(x, y)}}\right]^{\frac{1}{8}}$$

Gain Value of Each Pixel for Visible Right Parallax Pixel $$g_{R_{Rt}}(x, y) = \frac{m_R(x, y)}{R_{Rt}(x, y)} = \left[\frac{R_N(x, y)}{R_{Rt}(x, y)}\right]^{\frac{7}{8}} \cdot \left[\sqrt{\frac{R_{Lt}(x, y)}{R_{Rt}(x, y)}}\right]^{\frac{1}{8}}$$

$$g_{G_{Rt}}(x, y) = \frac{m_G(x, y)}{G_{Rt}(x, y)} = \left[\frac{G_N(x, y)}{G_{Rt}(x, y)}\right]^{\frac{7}{8}} \cdot \left[\sqrt{\frac{G_{Lt}(x, y)}{G_{Rt}(x, y)}}\right]^{\frac{1}{8}}$$

$$g_{B_{Rt}}(x, y) = \frac{m_B(x, y)}{B_{Rt}(x, y)} = \left[\frac{B_N(x, y)}{B_{Rt}(x, y)}\right]^{\frac{7}{8}} \cdot \left[\sqrt{\frac{B_{Lt}(x, y)}{B_{Rt}(x, y)}}\right]^{\frac{1}{8}}$$

Local Gain Correction of Each Pixel for Visible Non-Parallax Pixel $$R_N(x,y) \cdot g_{R_N}(x,y) = m_R(x,y)$$

$$G_N(x,y) \cdot g_{G_N}(x,y) = m_G(x,y)$$

$$B_N(x,y) \cdot g_{B_N}(x,y) = m_B(x,y)$$

Local Gain Correction of Each Pixel for Visible Left Parallax Pixel $$R_{Lt}(x,y) \cdot g_{R_{Lt}}(x,y) = m_R(x,y)$$

$$G_{Lt}(x,y) \cdot g_{G_{Lt}}(x,y) = m_G(x,y)$$

$$B_{Lt}(x,y) \cdot g_{B_{Lt}}(x,y) = m_B(x,y)$$

Local Gain Correction of Each Pixel for Visible Right Parallax Pixel $$R_{Rt}(x,y) \cdot g_{R_{Rt}}(x,y) = m_R(x,y)$$

$$G_{Rt}(x,y) \cdot g_{G_{Rt}}(x,y) = m_G(x,y)$$

$$B_{Rt}(x,y) \cdot g_{B_{Rt}}(x,y) = m_B(x,y)$$

In this manner, about visible light three bands, with a pixel value taken as an average value between an average value of a left-viewpoint image and a right-viewpoint image and a non-parallax reference viewpoint image as a new non-parallax pixel value, data of a Bayer plane is rewritten to output an image $M_N(x,y)$ of a non-parallax Bayer plane. Data original image-capturing pixels of which are near-infrared pixels also is subjected to replacement with the data obtained here according to the rule of colors of the Bayer array.

5) Generation of Visible Non-Parallax Reference Image

In this manner, the balance of illuminances of respective visible RGB color components match, and from a Bayer plane $M_N(x,y)$ from which a parallax has extinguished, a non-parallax color image that has a resolution up to the Nyquist frequency equivalent to the number of pixels that a sensor has can be generated as a 2D image by using a conventional color interpolation technique. For example, the most excellent example of known Bayer interpolation techniques is an interpolation algorithm disclosed in U.S. Pat. No. 8,259,213 submitted by the same inventors as the present application.

The thus-obtained non-parallax RGB color images are denoted as $R_N(x,y)$, $G_N(x,y)$ and $B_N(x,y)$. These are RGB data expressed with linear gradation.

6) Generation of Invisible Non-Parallax Reference Image

Next, a method of generating a 2D image in the near-infrared wavelength band in invisible light at high definition is explained. Images to be generated are denoted as $I^R_N(x,y)$, $I^G_N(x,y)$ and $I^B_N(x,y)$. If they are not to be generated at particularly high definition, these are obtained by the following equations.

$$I^R_N(x, y) = \frac{I^R_{Lt}(x, y) + I^R_{Rt}(x, y)}{2}$$

$$I^G_N(x, y) = \frac{I^G_{Lt}(x, y) + I^G_{Rt}(x, y)}{2}$$

$$I^B_N(x, y) = \frac{I^B_{Lt}(x, y) + I^B_{Rt}(x, y)}{2}$$

However, even a near-infrared image in the invisible range is sometimes desired to generate as a high resolution image even if such an image spuriously reflects how an object is actually captured.

For example, snakes recognize objects by infrared light that is different from visible light that human can visually recognize. In order to form such an image, high frequency information of a high resolution 2D image captured with visible light is added, as a correction term, to near-infrared low resolution data of invisible light. At that time, with the array shown in FIG. 8, by utilizing a difference from parallax pixels of visible light which have a parallax pixel density equal to that for near-infrared light, manipulation to derive high frequency components that are lacking actually is performed. By doing so, there is no risk of a harmful effect like excessive edge enhancement in unnecessary frequency bands, and a natural near-infrared light image can be formed at high resolution.

There are two possible operations as methods for correction. That is, those are a method that is performed by assuming that a relationship between a high-resolution image and a low-resolution image of visible light holds also between a high-resolution image and a low-resolution image of near-infrared light at a fixed ratio therebetween, and a method that is performed by assuming that the relation holds between a high-resolution image and a low-resolution image of near-infrared light with a fixed difference therebetween.

In a case of the fixed-ratio type, a system of the arithmetic mean type is employed if all visible non-parallax pixels have full-open masks. A system of the geometrical mean type is employed if all visible non-parallax pixels have half-open masks. Accordingly, in a case of fixed-ratio, the arithmetic mean type is employed in the present embodiment.

In case of fixed-ratio a) In Case of Arithmetic Mean Between Left and Right $$I^R_N(x, y) = \frac{I^R_{Lt}(x, y) + I^R_{Rt}(x, y)}{2} \cdot \sqrt[4]{\frac{R_N(x, y)}{\frac{R_{Lt}(x, y) + R_{Rt}(x, y)}{2}}}$$

-continued $$I_N^G(x,y) = \frac{I_{Lt}^G(x,y) + I_{Rt}^G(x,y)}{2} \cdot \sqrt{\frac{G_N(x,y)}{\frac{G_{Lt}(x,y)+G_{Rt}(x,y)}{2}}} \cdot \sqrt[4]{\frac{B_N(x,y)}{\frac{B_{Lt}(x,y)+B_{Rt}(x,y)}{2}}}$$

$$I_N^B(x,y) = \frac{I_{Lt}^B(x,y) + I_{Rt}^B(x,y)}{2} \cdot \sqrt{\frac{G_N(x,y)}{\frac{G_{Lt}(x,y)+G_{Rt}(x,y)}{2}}} \cdot \sqrt[4]{\frac{R_N(x,y)}{\frac{R_{Lt}(x,y)+R_{Rt}(x,y)}{2}}}$$

$$\sqrt{\frac{G_N(x,y)}{\frac{G_{Lt}(x,y)+G_{Rt}(x,y)}{2}}} \cdot \sqrt[4]{\frac{B_N(x,y)}{\frac{B_{Lt}(x,y)+B_{Rt}(x,y)}{2}}}$$

b) In Case of Geometrical Mean Between Left and Right $$I_N^R(x,y) = \sqrt{I_{Lt}^R(x,y) \cdot I_{Rt}^R(x,y)} \cdot \sqrt[4]{\frac{R_N(x,y)}{\sqrt{R_{Lt}(x,y) \cdot R_{Rt}(x,y)}}}$$

$$\sqrt{\frac{G_N(x,y)}{\sqrt{G_{Lt}(x,y) \cdot G_{Rt}(x,y)}}} \cdot \sqrt[4]{\frac{B_N(x,y)}{\sqrt{B_{Lt}(x,y) \cdot B_{Rt}(x,y)}}}$$

$$I_N^G(x,y) = \sqrt{I_{Lt}^G(x,y) \cdot I_{Rt}^G(x,y)} \cdot \sqrt[4]{\frac{R_N(x,y)}{\sqrt{R_{Lt}(x,y) \cdot R_{Rt}(x,y)}}}$$

$$\sqrt{\frac{G_N(x,y)}{\sqrt{G_{Lt}(x,y) \cdot G_{Rt}(x,y)}}} \cdot \sqrt[4]{\frac{B_N(x,y)}{\sqrt{B_{Lt}(x,y) \cdot B_{Rt}(x,y)}}}$$

$$I_N^B(x,y) = \sqrt{I_{Lt}^B(x,y) \cdot I_{Rt}^B(x,y)} \cdot \sqrt[4]{\frac{R_N(x,y)}{\sqrt{R_{Lt}(x,y) \cdot R_{Rt}(x,y)}}}$$

$$\sqrt{\frac{G_N(x,y)}{\sqrt{G_{Lt}(x,y) \cdot G_{Rt}(x,y)}}} \cdot \sqrt[4]{\frac{B_N(x,y)}{\sqrt{B_{Lt}(x,y) \cdot B_{Rt}(x,y)}}}$$

In Case of Fixed-Difference $$I_N^R(x,y) = \frac{I_{Lt}^R(x,y) + I_{Rt}^R(x,y)}{2} + \left[\frac{1}{4}\left(R_N(x,y) - \frac{R_{Lt}(x,y)+R_{Rt}(x,y)}{2}\right) + \frac{1}{2}\left(G_N(x,y) - \frac{G_{Lt}(x,y)+G_{Rt}(x,y)}{2}\right) + \frac{1}{4}\left(B_N(x,y) - \frac{B_{Lt}(x,y)+B_{Rt}(x,y)}{2}\right)\right]$$

$$I_N^G(x,y) = \frac{I_{Lt}^G(x,y) + I_{Rt}^G(x,y)}{2} + \left[\frac{1}{4}\left(R_N(x,y) - \frac{R_{Lt}(x,y)+R_{Rt}(x,y)}{2}\right) + \frac{1}{2}\left(G_N(x,y) - \frac{G_{Lt}(x,y)+G_{Rt}(x,y)}{2}\right) + \frac{1}{4}\left(B_N(x,y) - \frac{B_{Lt}(x,y)+B_{Rt}(x,y)}{2}\right)\right]$$

$$I_N^B(x,y) = \frac{I_{Lt}^B(x,y) + I_{Rt}^B(x,y)}{2} + \left[\frac{1}{4}\left(R_N(x,y) - \frac{R_{Lt}(x,y)+R_{Rt}(x,y)}{2}\right) + \frac{1}{2}\left(G_N(x,y) - \frac{G_{Lt}(x,y)+G_{Rt}(x,y)}{2}\right) + \frac{1}{4}\left(B_N(x,y) - \frac{B_{Lt}(x,y)+B_{Rt}(x,y)}{2}\right)\right]$$

However, factors like the ¼-th power or the ½-th power, or ¼-fold or ½-fold are coefficients of reliability that are adopted depending on the degrees of pixel densities of respective color components of an image sensor, that is, weight coefficients.

In a system of fixed-ratio, an operation is generally performed while remaining in a linear gradation space. In the other system of fixed-difference, generally, first, by gamma conversion, the process is performed in a space that resembles logarithmic space where a near-infrared high resolution 2D image is generated while performing correction assuming a fixed difference, and thereafter the process returns to the linear gradation space by reverse gamma conversion. Characteristics of the gamma conversion can be set in any desired manner without being limited to logarithm, and the following gradation characteristics excel. However, it is assumed x denotes an input signal, y denotes an output signal, and it is standardized that x and y are within the ranges of [0,1] and [0,1]. The value of (is set to a value close to zero for a low sensitivity image, and set to be larger as the imaging sensitivity increases. Please refer to U.S. Pat. No. 7,957,588 submitted by the same inventors as the present application.

$$y = \frac{\sqrt{x+\varepsilon} - \sqrt{\varepsilon}}{\sqrt{1+\varepsilon} - \sqrt{\varepsilon}}$$

A logarithm of an equation of the geometrical mean in the system of fixed-ratio matches an equation of the system of fixed-difference.

7) Generation of Actual Visible and Invisible Parallax Images

About visible images, by using the tentative left parallax color images $R_{Lt}(x,y)$, $G_{Lt}(x,y)$ and $B_{Lt}(x,y)$ having low resolving power generated at Step 3), and the non-parallax color images $R_N(x,y)$, $G_N(x,y)$ and $B_N(x,y)$ having high resolving power generated in intermediate processing at Step 5), left parallax color images $R'_{Lt}(x,y)$, $G'_{Lt}(x,y)$ and $B'_{Lt}(x,y)$ having high resolving power to be actually output are generated. Similarly, by using the tentative right parallax color images $R_{Rt}(x,y)$, $G_{Rt}(x,y)$ and $B_{Rt}(x,y)$ having low resolving power generated at Step 3), and non-parallax color images $R_N(x,y)$, $G_N(x,y)$ and $B_N(x,y)$ having high resolving power generated in intermediate processing at Step 5), right parallax color images $R'_{Rt}(x,y)$, $G'_{Rt}(x,y)$ and $B'_{Rt}(x,y)$ having high resolving power to be actually output are generated.

About near-infrared images also, by using the tentative left parallax color images $I^R_{Lt}(x,y)$, $I^G_{Lt}(x,y)$ and $I^B_{Lt}(x,y)$ having low resolving power generated at Step 3), and non-parallax three-band images $I^R_N(x,y)$, $I^G_N(x,y)$ and $I^B_N(x,y)$ having high resolving power generated in intermediate processing at Step 6), left parallax three-band images $I'^R_{Lt}(x,y)$, $I'^G_{Lt}(x,y)$ and $I'^B_{Lt}(x,y)$ having high resolving power to be actually output are generated. Similarly, by using the tentative right parallax color three-band images $I^R_{Rt}(x,y)$, $I^G_{Rt}(x,y)$ and $I^B_{Rt}(x,y)$ having low resolving power generated at Step 3), and non-parallax three-band images $I^R_N(x,y)$, $I^G_N(x,y)$ and $I^B_N(x,y)$ having high resolving power generated in intermediate processing at Step 6), right parallax three-band images $I'^R_{Rt}(x,y)$, $I'^G_{Rt}(x,y)$ and $I'^B_{Rt}(x,y)$ having high resolving power to be actually output are generated.

That is, parallax modulation that is closed independently among visible images and that is closed independently among near-infrared images is performed for visible images and near-infrared images, respectively. However, multicolor parallax modulation is performed in visible wavelengths by performing mixing among wavelength bands. Multiband parallax modulation is performed also in near-infrared wavelengths by performing mixing among wavelength bands. This is a way of thinking that is different from that of Example 2 described below.

As a system of parallax modulation, there are two possible manners which are a method of maintaining a fixed ratio and a method of maintaining a fixed difference. Furthermore, in a case of fixed-ratio, there are two possible manners which are a method of using an arithmetic mean as a reference point and a method of using a geometrical mean as a reference point. Although both of them can provide a parallax modulation effect, if aperture masks of non-parallax pixels of an image sensor are fully open, a system of using an arithmetic mean as a reference point is employed, and if aperture masks of non-parallax pixels are half open like parallax pixels, a system of using a geometrical mean as a reference point is employed. Accordingly, in the present embodiment, a system of using an arithmetic mean as a reference point is used.

Also if parallax modulation is to be performed, a geometrical mean taking into consideration the density ratio of RGB among respective parallax pixels in an image sensor array is taken. That is, because R:G:B=1:2:1 among left parallax pixels, and R:G:B=1:2:1 also among right parallax pixels, in a case of modulation of fixed-ratio, the weight of the ¼-th power is given to parallax modulation by an R component, the weight of the ½-th power is given to parallax modulation by a G component, and the weight of the ¼-th power is given to parallax modulation by a B component so that allocation is performed placing emphasis on parallax modulation by a G component whose density is high. In a case of modulation of fixed-difference, coefficients of ¼-fold, ½-fold and ¼-fold are applied to RGB, respectively. A similar principle applies also to the near-infrared three bands.

In Case of Fixed-Ratio a) Parallax Modulation Using Arithmetic Mean as Reference Point Left Parallax Modulation $$R'_{Lt}(x,y) = R_N(x,y) \sqrt[4]{\frac{2R_{Lt}(x,y)}{R_{Lt}(x,y)+R_{Rt}(x,y)}}$$

$$\sqrt{\frac{2G_{Lt}(x,y)}{G_{Lt}(x,y)+G_{Rt}(x,y)}} \sqrt[4]{\frac{2B_{Lt}(x,y)}{B_{Lt}(x,y)+B_{Rt}(x,y)}}$$

$$G'_{Lt}(x,y) = G_N(x,y) \sqrt[4]{\frac{2R_{Lt}(x,y)}{R_{Lt}(x,y)+R_{Rt}(x,y)}}$$

$$\sqrt{\frac{2G_{Lt}(x,y)}{G_{Lt}(x,y)+G_{Rt}(x,y)}} \sqrt[4]{\frac{2B_{Lt}(x,y)}{B_{Lt}(x,y)+B_{Rt}(x,y)}}$$

$$B'_{Lt}(x,y) = B_N(x,y) \sqrt[4]{\frac{2R_{Lt}(x,y)}{R_{Lt}(x,y)+R_{Rt}(x,y)}}$$

$$\sqrt{\frac{2G_{Lt}(x,y)}{G_{Lt}(x,y)+G_{Rt}(x,y)}} \sqrt[4]{\frac{2B_{Lt}(x,y)}{B_{Lt}(x,y)+B_{Rt}(x,y)}}$$

$$I'^R_{Lt}(x,y) = I^R_N(x,y) \sqrt[4]{\frac{2I^R_{Lt}(x,y)}{I^R_{Lt}(x,y)+I^R_{Rt}(x,y)}}$$

$$\sqrt{\frac{2I^G_{Lt}(x,y)}{I^G_{Lt}(x,y)+I^G_{Rt}(x,y)}} \sqrt[4]{\frac{2I^B_{Lt}(x,y)}{I^B_{Lt}(x,y)+I^B_{Rt}(x,y)}}$$

$$I'^G_{Lt}(x,y) = I^G_N(x,y) \sqrt[4]{\frac{2I^R_{Lt}(x,y)}{I^R_{Lt}(x,y)+I^R_{Rt}(x,y)}}$$

$$\sqrt{\frac{2I^G_{Lt}(x,y)}{I^G_{Lt}(x,y)+I^G_{Rt}(x,y)}} \sqrt[4]{\frac{2I^B_{Lt}(x,y)}{I^B_{Lt}(x,y)+I^B_{Rt}(x,y)}}$$

$$I'^B_{Lt}(x,y) = I^B_N(x,y) \sqrt[4]{\frac{2I^R_{Lt}(x,y)}{I^R_{Lt}(x,y)+I^R_{Rt}(x,y)}}$$

$$\sqrt{\frac{2I^G_{Lt}(x,y)}{I^G_{Lt}(x,y)+I^G_{Rt}(x,y)}} \sqrt[4]{\frac{2I^B_{Lt}(x,y)}{I^B_{Lt}(x,y)+I^B_{Rt}(x,y)}}$$

Right Parallax Modulation $$R'_{Rt}(x,y) = R_N(x,y) \sqrt[4]{\frac{2R_{Rt}(x,y)}{R_{Lt}(x,y)+R_{Rt}(x,y)}}$$

$$\sqrt{\frac{2G_{Rt}(x,y)}{G_{Lt}(x,y)+G_{Rt}(x,y)}} \sqrt[4]{\frac{2B_{Rt}(x,y)}{B_{Lt}(x,y)+B_{Rt}(x,y)}}$$

$$G'_{Rt}(x,y) = G_N(x,y) \sqrt[4]{\frac{2R_{Rt}(x,y)}{R_{Lt}(x,y)+R_{Rt}(x,y)}}$$

$$\sqrt{\frac{2G_{Rt}(x,y)}{G_{Lt}(x,y)+G_{Rt}(x,y)}} \sqrt[4]{\frac{2B_{Rt}(x,y)}{B_{Lt}(x,y)+B_{Rt}(x,y)}}$$

$$B'_{Rt}(x,y) = B_N(x,y) \sqrt[4]{\frac{2R_{Rt}(x,y)}{R_{Lt}(x,y)+R_{Rt}(x,y)}}$$

$$\sqrt{\frac{2G_{Rt}(x,y)}{G_{Lt}(x,y)+G_{Rt}(x,y)}} \sqrt[4]{\frac{2B_{Rt}(x,y)}{B_{Lt}(x,y)+B_{Rt}(x,y)}}$$

$$I'^R_{Rt}(x,y) = I^R_N(x,y) \sqrt[4]{\frac{2I^R_{Rt}(x,y)}{I^R_{Lt}(x,y)+I^R_{Rt}(x,y)}}$$

$$\sqrt{\frac{2I^G_{Rt}(x,y)}{I^G_{Lt}(x,y)+I^G_{Rt}(x,y)}} \sqrt[4]{\frac{2I^B_{Rt}(x,y)}{I^B_{Lt}(x,y)+I^B_{Rt}(x,y)}}$$

$$I'^G_{Rt}(x,y) = I^G_N(x,y) \sqrt[4]{\frac{2I^R_{Rt}(x,y)}{I^R_{Lt}(x,y)+I^R_{Rt}(x,y)}}$$

$$\sqrt{\frac{2I^G_{Rt}(x,y)}{I^G_{Lt}(x,y)+I^G_{Rt}(x,y)}} \sqrt[4]{\frac{2I^B_{Rt}(x,y)}{I^B_{Lt}(x,y)+I^B_{Rt}(x,y)}}$$

$$I'^B_{Rt}(x,y) = I^B_N(x,y) \sqrt[4]{\frac{2I^R_{Rt}(x,y)}{I^R_{Lt}(x,y)+I^R_{Rt}(x,y)}}$$

$$\sqrt{\frac{2I^G_{Rt}(x,y)}{I^G_{Lt}(x,y)+I^G_{Rt}(x,y)}} \sqrt[4]{\frac{2I^B_{Rt}(x,y)}{I^B_{Lt}(x,y)+I^B_{Rt}(x,y)}}$$

b) Parallax Modulation Using Geometrical Mean as Reference Point

Left Parallax Modulation $$R'_{Lt}(x,y) = R_N(x,y) \sqrt[4]{\sqrt{\frac{R_{Lt}(x,y)}{R_{Rt}(x,y)}}} \sqrt{\sqrt{\frac{G_{Lt}(x,y)}{G_{Rt}(x,y)}}} \sqrt[4]{\sqrt{\frac{B_{Lt}(x,y)}{B_{Rt}(x,y)}}}$$

$$G'_{Lt}(x,y) = G_N(x,y) \sqrt[4]{\sqrt{\frac{R_{Lt}(x,y)}{R_{Rt}(x,y)}}} \sqrt{\sqrt{\frac{G_{Lt}(x,y)}{G_{Rt}(x,y)}}} \sqrt[4]{\sqrt{\frac{B_{Lt}(x,y)}{B_{Rt}(x,y)}}}$$

-continued $$B'_{Lt}(x, y) = B_N(x, y) \sqrt[4]{\sqrt{\frac{R_{Lt}(x, y)}{R_{Rt}(x, y)}} \sqrt{\frac{G_{Lt}(x, y)}{G_{Rt}(x, y)}} \sqrt[4]{\frac{B_{Lt}(x, y)}{B_{Rt}(x, y)}}}$$

$$I'^R_{Lt}(x, y) = I^R_N(x, y) \sqrt[4]{\sqrt{\frac{I^R_{Lt}(x, y)}{I^R_{Rt}(x, y)}} \sqrt{\frac{I^G_{Lt}(x, y)}{I^G_{Rt}(x, y)}} \sqrt[4]{\frac{I^B_{Lt}(x, y)}{I^B_{Rt}(x, y)}}}$$

$$I'^G_{Lt}(x, y) = I^G_N(x, y) \sqrt[4]{\sqrt{\frac{I^R_{Lt}(x, y)}{I^R_{Rt}(x, y)}} \sqrt{\frac{I^G_{Lt}(x, y)}{I^G_{Rt}(x, y)}} \sqrt[4]{\frac{I^B_{Lt}(x, y)}{I^B_{Rt}(x, y)}}}$$

$$I'^B_{Lt}(x, y) = I^B_N(x, y) \sqrt[4]{\sqrt{\frac{I^R_{Lt}(x, y)}{I^R_{Rt}(x, y)}} \sqrt{\frac{I^G_{Lt}(x, y)}{I^G_{Rt}(x, y)}} \sqrt[4]{\frac{I^B_{Lt}(x, y)}{I^B_{Rt}(x, y)}}}$$

Right Parallax Modulation $$R'_{Rt}(x, y) = R_N(x, y) \sqrt[4]{\sqrt{\frac{R_{Rt}(x, y)}{R_{Lt}(x, y)}} \sqrt{\frac{G_{Rt}(x, y)}{G_{Lt}(x, y)}} \sqrt[4]{\frac{B_{Rt}(x, y)}{B_{Lt}(x, y)}}}$$

$$G'_{Rt}(x, y) = G_N(x, y) \sqrt[4]{\sqrt{\frac{R_{Rt}(x, y)}{R_{Lt}(x, y)}} \sqrt{\frac{G_{Rt}(x, y)}{G_{Lt}(x, y)}} \sqrt[4]{\frac{B_{Rt}(x, y)}{B_{Lt}(x, y)}}}$$

$$B'_{Rt}(x, y) = B_N(x, y) \sqrt[4]{\sqrt{\frac{R_{Rt}(x, y)}{R_{Lt}(x, y)}} \sqrt{\frac{G_{Rt}(x, y)}{G_{Lt}(x, y)}} \sqrt[4]{\frac{B_{Rt}(x, y)}{B_{Lt}(x, y)}}}$$

$$I'^R_{Rt}(x, y) = I^R_N(x, y) \sqrt[4]{\sqrt{\frac{I^R_{Rt}(x, y)}{I^R_{Lt}(x, y)}} \sqrt{\frac{I^G_{Rt}(x, y)}{I^G_{Lt}(x, y)}} \sqrt[4]{\frac{I^B_{Rt}(x, y)}{I^B_{Lt}(x, y)}}}$$

$$I'^G_{Rt}(x, y) = I^G_N(x, y) \sqrt[4]{\sqrt{\frac{I^R_{Rt}(x, y)}{I^R_{Lt}(x, y)}} \sqrt{\frac{I^G_{Rt}(x, y)}{I^G_{Lt}(x, y)}} \sqrt[4]{\frac{I^B_{Rt}(x, y)}{I^B_{Lt}(x, y)}}}$$

$$I'^B_{Rt}(x, y) = I^B_N(x, y) \sqrt[4]{\sqrt{\frac{I^R_{Rt}(x, y)}{I^R_{Lt}(x, y)}} \sqrt{\frac{I^G_{Rt}(x, y)}{I^G_{Lt}(x, y)}} \sqrt[4]{\frac{I^B_{Rt}(x, y)}{I^B_{Lt}(x, y)}}}$$

In Case of Fixed-Difference

Left Parallax Modulation $$R'_{Lt}(x, y) = R_N(x, y) + \frac{1}{4} \cdot \frac{R_{Lt}(x, y) - R_{Rt}(x, y)}{2} + \frac{1}{2} \cdot \frac{G_{Lt}(x, y) - G_{Rt}(x, y)}{2} + \frac{1}{4} \cdot \frac{B_{Lt}(x, y) - B_{Rt}(x, y)}{2}$$

$$G'_{Lt}(x, y) = G_N(x, y) + \frac{1}{4} \cdot \frac{R_{Lt}(x, y) - R_{Rt}(x, y)}{2} + \frac{1}{2} \cdot \frac{G_{Lt}(x, y) - G_{Rt}(x, y)}{2} + \frac{1}{4} \cdot \frac{B_{Lt}(x, y) - B_{Rt}(x, y)}{2}$$

$$B'_{Lt}(x, y) = B_N(x, y) + \frac{1}{4} \cdot \frac{R_{Lt}(x, y) - R_{Rt}(x, y)}{2} + \frac{1}{2} \cdot \frac{G_{Lt}(x, y) - G_{Rt}(x, y)}{2} + \frac{1}{4} \cdot \frac{B_{Lt}(x, y) - B_{Rt}(x, y)}{2}$$

$$I'^R_{Lt}(x, y) = I^R_N(x, y) + \frac{1}{4} \cdot \frac{I^R_{Lt}(x, y) - I^R_{Rt}(x, y)}{2} + \frac{1}{2} \cdot \frac{I^G_{Lt}(x, y) - I^G_{Rt}(x, y)}{2} + \frac{1}{4} \cdot \frac{I^B_{Lt}(x, y) - I^B_{Rt}(x, y)}{2}$$

$$I'^G_{Lt}(x, y) = I^G_N(x, y) + \frac{1}{4} \cdot \frac{I^R_{Lt}(x, y) - I^R_{Rt}(x, y)}{2} + \frac{1}{2} \cdot \frac{I^G_{Lt}(x, y) - I^G_{Rt}(x, y)}{2} + \frac{1}{4} \cdot \frac{I^B_{Lt}(x, y) - I^B_{Rt}(x, y)}{2}$$

$$I'^B_{Lt}(x, y) = I^B_N(x, y) + \frac{1}{4} \cdot \frac{I^R_{Lt}(x, y) - I^R_{Rt}(x, y)}{2} + \frac{1}{2} \cdot \frac{I^G_{Lt}(x, y) - I^G_{Rt}(x, y)}{2} + \frac{1}{4} \cdot \frac{I^B_{Lt}(x, y) - I^B_{Rt}(x, y)}{2}$$

Right Parallax Modulation $$R'_{Rt}(x, y) = R_N(x, y) + \frac{1}{4} \cdot \frac{R_{Rt}(x, y) - R_{Lt}(x, y)}{2} + \frac{1}{2} \cdot \frac{G_{Rt}(x, y) - G_{Lt}(x, y)}{2} + \frac{1}{4} \cdot \frac{B_{Rt}(x, y) - B_{Lt}(x, y)}{2}$$

$$G'_{Rt}(x, y) = G_N(x, y) + \frac{1}{4} \cdot \frac{R_{Rt}(x, y) - R_{Lt}(x, y)}{2} + \frac{1}{2} \cdot \frac{G_{Rt}(x, y) - G_{Lt}(x, y)}{2} + \frac{1}{4} \cdot \frac{B_{Rt}(x, y) - B_{Lt}(x, y)}{2}$$

$$B'_{Rt}(x, y) = B_N(x, y) + \frac{1}{4} \cdot \frac{R_{Rt}(x, y) - R_{Lt}(x, y)}{2} + \frac{1}{2} \cdot \frac{G_{Rt}(x, y) - G_{Lt}(x, y)}{2} + \frac{1}{4} \cdot \frac{B_{Rt}(x, y) - B_{Lt}(x, y)}{2}$$

$$I'^R_{Rt}(x, y) = I^R_N(x, y) + \frac{1}{4} \cdot \frac{I^R_{Rt}(x, y) - I^R_{Lt}(x, y)}{2} + \frac{1}{2} \cdot \frac{I^G_{Rt}(x, y) - I^G_{Lt}(x, y)}{2} + \frac{1}{4} \cdot \frac{I^B_{Rt}(x, y) - I^B_{Lt}(x, y)}{2}$$

$$I'^G_{Rt}(x, y) = I^G_N(x, y) + \frac{1}{4} \cdot \frac{I^R_{Rt}(x, y) - I^R_{Lt}(x, y)}{2} + \frac{1}{2} \cdot \frac{I^G_{Rt}(x, y) - I^G_{Lt}(x, y)}{2} + \frac{1}{4} \cdot \frac{I^B_{Rt}(x, y) - I^B_{Lt}(x, y)}{2}$$

$$I'^B_{Rt}(x, y) = I^B_N(x, y) + \frac{1}{4} \cdot \frac{I^R_{Rt}(x, y) - I^R_{Lt}(x, y)}{2} + \frac{1}{2} \cdot \frac{I^G_{Rt}(x, y) - I^G_{Lt}(x, y)}{2} + \frac{1}{4} \cdot \frac{I^B_{Rt}(x, y) - I^B_{Lt}(x, y)}{2}$$

The parallax modulation in fixed-ratio is performed remaining in a linear gradation space, and the parallax modulation in fixed-difference is performed in a gamma space. The equations of conversion into a gamma space and inverse conversion are the same as those defined at Step 6).

A logarithm of an equation of the geometrical mean in the system of fixed-ratio matches an equation of the system of fixed-difference.

8) Conversion of Visible and Invisible Images into Output Color Space

The thus-obtained high resolution non-parallax intermediate color images $R_N(x,y)$, $G_N(x,y)$ and $B_N(x,y)$, high resolution left parallax color images $R_{Lt}(x,y)$, $G_{Lt}(x,y)$ and $B_{Lt}(x,y)$, and high resolution right parallax color images $R_{Rt}(x,y)$, $G_{Rt}(x,y)$ and $B_{Rt}(x,y)$ in the visible light wavelength band are respectively subjected to color matrix conversion and gamma conversion from a camera RGB space having spectral characteristics of a sensor into a standard sRGB color space and output as images in the output color space.

On the other hand, because a standard color space about the invisible light wavelength band does not exist, particularly no color conversion needs to be performed for invisible light images. However, if optical spectrums overlap among three bands, and their degree of separation is desired to be raised, a linear operation by using a 3×3 matrix among the invisible light three bands is performed. If the visible light wavelength band and the near-infrared light wavelength band overlap, color space conversion is simultaneously performed by using a 6×6 matrix as illustrated below. In the present embodiment, an IR cut filter is provided corresponding to a visible pixel, and in contrast, is not provided to an invisible pixel. Also, by subtracting a pixel value equivalent to IR in a visible pixel without providing an IR cut filter to the visible pixel, a role comparable to an IR cut filter can be played.

$$\begin{pmatrix} B'(x,y) \\ G'(x,y) \\ R'(x,y) \\ I'^B(x,y) \\ I'^G(x,y) \\ I'^R(x,y) \end{pmatrix} = \begin{pmatrix} M_{11}^{(VV)} & M_{12}^{(VV)} & M_{13}^{(VV)} & M_{14}^{(VI)} & M_{15}^{(VI)} & M_{16}^{(VI)} \\ M_{21}^{(VV)} & M_{22}^{(VV)} & M_{23}^{(VV)} & M_{24}^{(VI)} & M_{25}^{(VI)} & M_{26}^{(VI)} \\ M_{31}^{(VV)} & M_{32}^{(VV)} & M_{33}^{(VV)} & M_{34}^{(VI)} & M_{35}^{(VI)} & M_{36}^{(VI)} \\ M_{41}^{(IV)} & M_{42}^{(IV)} & M_{43}^{(IV)} & M_{44}^{(II)} & M_{45}^{(II)} & M_{46}^{(II)} \\ M_{51}^{(IV)} & M_{52}^{(IV)} & M_{53}^{(IV)} & M_{54}^{(II)} & M_{55}^{(II)} & M_{56}^{(II)} \\ M_{61}^{(IV)} & M_{62}^{(IV)} & M_{63}^{(IV)} & M_{64}^{(II)} & M_{65}^{(II)} & M_{66}^{(II)} \end{pmatrix} \begin{pmatrix} B(x,y) \\ G(x,y) \\ R(x,y) \\ I^B(x,y) \\ I^G(x,y) \\ I^R(x,y) \end{pmatrix}$$

Eventually in this manner, a high resolution 2D image and 3D image are generated as two types of "color" images consisting of visible three colors and near-infrared three bands.

Here, an effect in terms of image quality attained by multicolor parallax modulation is described based on experimental facts. It is assumed here that parallax modulation is performed without using all the three colors, but only with a monochromatic component. In such a case, appropriate parallax displacement cannot be performed in a subject image having color boundaries, and a parallax is overdisplaced or underdisplaced so that an unbalanced color or color darkening phenomenon occur in a stereoscopic image. In particular, a phenomenon in which red subjects are emphasized is recognized extremely noticeably. Also, it has been known that if also monochromatic parallax modulation is performed in a step of generating a stereoscopic image for an image captured by using an optical system whose axial chromatic aberration of a lens is large, a similar phenomenon may occur. In contrast, if multicolor parallax modulation is performed, an extremely noticeable image quality effect of being able to suppress almost completely these phenomena is provided. This is because at color boundary portions, even if a certain color component is subjected to overdisplacement, another color component often is subjected to underdisplacement, and actually, the displacement is offset to a proper parallax displacement amount. Axial chromatic aberration also exist with color components having large blurring and color components having small blurring being mixed, and because of this, if three color components are used, parallax modulation that settles at average blurring of the three colors is performed. Because in monocular stereoscopic imaging, blurring and parallax amounts are in a corresponding relationship, normally, axial chromatic aberration of a lens generates unbalanced color and color darkening phenomena. However, performing multicolor parallax modulation provides an effect of averaging differences in the degrees of blurring present among color components, and solving unbalanced color and color darkening phenomena.

It can be said that the above-mentioned relationship between the issues posed by monochromatic parallax modulation in monocular stereoscopic imaging and the solutions by multicolor parallax modulation exactly appears similarly in the relationship between monochromatic extrapolation and multicolor extrapolation in 2D imaging for example at the time of color interpolation on the Bayer array. In monochromatic extrapolation, for example, when a G component is interpolated to a pixel position of an R component in the Bayer array as shown in U.S. Pat. No. 5,541,653, an interpolation value is calculated by correcting an average value of peripheral G pixels with an extrapolation term consisting of a difference between average values of a central R pixel and peripheral R pixels. U.S. Pat. No. 7,236,628 submitted by the same inventors as the present application describes in detail that if such monochromatic extrapolation is performed, there is an issue that an overshoot due to overcorrection occurs at a color boundary portion, and furthermore, if magnification chromatic aberration exists, a blocking phenomenon occurs. The invention shows that if extrapolation correction by multicolors is performed as a solution for these, these can be all solved. Accordingly, multicolor extrapolation correction in a demosaic process of a 2D image is exactly in a corresponding relationship with multicolor parallax modulation in generation of a 3D image stereoscopic image, and both of them effectively together function to provide a complementary offset effect at color boundary portions, in 2D image generation, provides an effect of preventing influence of magnification chromatic aberration, and in 3D image generation, provides an effect of preventing influence of axial chromatic aberration. The above-mentioned "multicolor" has the same meaning as the meaning of "using a plurality of color components".

A similar thing can be said about the above-mentioned effects even if visible multicolor color components are replaced with a number of invisible band components. As described above, when modulation processing among different bands is to be performed, the modulation processing is performed assuming that images of different bands show mutually similar signal changes, and meet a presumed condition of fixed-difference or fixed-ratio. If this presumption collapses, unnatural false images are generated around boundary portions between regions where the presumption collapsed, and regions where the presumption holds. However, even if a region between a certain band and another certain band is collapsed, other bands are often collapsed in a state different therefrom, and if modulation processing is performed in multi bands, the collapse of the assumption is offset, and an environment where the assumption holds can be constructed in most image regions.

Example 2

————Visible+Invisible Six-Band Sparse Parallax Pixel Array————

In the example shown, image sensors are periodically arranged according to, as the primitive lattice, the array diagram shown on the upper portion in FIG. 8. Here, visible and invisible mutually mixed development is explained. A processing procedure is approximately like the one shown below.

1) Input of color/parallax multiplexed mosaic image data
2) Global gain balance correction of color/parallax mosaic image
3) Generation of tentative visible and invisible parallax images 4) Generation of visible non-parallax color mosaic image by correction of left and right local illuminance distributions (Local Gain Balance Correction)
5) Generation of visible non-parallax reference image
6) Generation of invisible non-parallax reference image
7) Generation of actual visible and invisible parallax images
8) Conversion of visible and invisible images into output color space A detailed explanation follows. The entire processing flow is the same as the flowchart of Example 1. Here, as portions whose processing contents are different, Step 5 and Step 7 are explained.

5) Generation of Visible Non-Parallax Reference Image

After normal Bayer interpolation explained with reference to Example 1, the following correction is applied. This is because if image-capturing information of near-infrared pixels is not used at all, correspondingly, blurring is generated in a developed image no matter how high the performance of performed Bayer interpolation is, as compared with a case where a normal Bayer array is interpolated. Thus, a correction term that is correlated also with a near-infrared signal plane is applied. There are three manners of techniques for it, and they respectively conform to classification of use explained with reference to Example 1.

In case of fixed-ratio a) In Case of Arithmetic Mean Between Left and Right $$R'(x, y) = R(x, y) \cdot \sqrt[4]{\frac{\frac{I_{Lt}^R(x,y) + I_{Rt}^R(x,y)}{2}}{\left\langle \frac{I_{Lt}^R(x,y) + I_{Rt}^R(x,y)}{2} \right\rangle}}$$

$$G'(x, y) = G(x, y) \cdot \sqrt{\sqrt[4]{\frac{\frac{I_{Lt}^G(x,y) + I_{Rt}^G(x,y)}{2}}{\left\langle \frac{I_{Lt}^G(x,y) + I_{Rt}^G(x,y)}{2} \right\rangle}} \cdot \sqrt[4]{\frac{\frac{I_{Lt}^B(x,y) + I_{Rt}^B(x,y)}{2}}{\left\langle \frac{I_{Lt}^B(x,y) + I_{Rt}^B(x,y)}{2} \right\rangle}}}$$

$$\cdot \sqrt[4]{\frac{\frac{I_{Lt}^R(x,y) + I_{Rt}^R(x,y)}{2}}{\left\langle \frac{I_{Lt}^R(x,y) + I_{Rt}^R(x,y)}{2} \right\rangle}}$$

$$B'(x, y) = B(x, y) \cdot \sqrt[4]{\frac{\frac{I_{Lt}^R(x,y) + I_{Rt}^R(x,y)}{2}}{\left\langle \frac{I_{Lt}^R(x,y) + I_{Rt}^R(x,y)}{2} \right\rangle}}$$

$$\cdot \sqrt{\sqrt[4]{\frac{\frac{I_{Lt}^G(x,y) + I_{Rt}^G(x,y)}{2}}{\left\langle \frac{I_{Lt}^G(x,y) + I_{Rt}^G(x,y)}{2} \right\rangle}} \cdot \sqrt[4]{\frac{\frac{I_{Lt}^B(x,y) + I_{Rt}^B(x,y)}{2}}{\left\langle \frac{I_{Lt}^B(x,y) + I_{Rt}^B(x,y)}{2} \right\rangle}}}$$

b) In Case of Geometrical Mean Between Left and Right $$R'(x, y) = R(x, y) \cdot \sqrt[4]{\frac{\sqrt{I_{Lt}^R(x,y) \cdot I_{Rt}^R(x,y)}}{\left\langle \sqrt{I_{Lt}^R(x,y) \cdot I_{Rt}^R(x,y)} \right\rangle}}$$

$$G'(x, y) = G(x, y) \cdot \sqrt{\sqrt[4]{\frac{\sqrt{I_{Lt}^G(x,y) \cdot I_{Rt}^G(x,y)}}{\left\langle \sqrt{I_{Lt}^G(x,y) \cdot I_{Rt}^G(x,y)} \right\rangle}} \cdot \sqrt[4]{\frac{\sqrt{I_{Lt}^B(x,y) \cdot I_{Rt}^B(x,y)}}{\left\langle \sqrt{I_{Lt}^B(x,y) \cdot I_{Rt}^B(x,y)} \right\rangle}}}$$

$$\cdot \sqrt[4]{\frac{\sqrt{I_{Lt}^R(x,y) \cdot I_{Rt}^R(x,y)}}{\left\langle \sqrt{I_{Lt}^R(x,y) \cdot I_{Rt}^R(x,y)} \right\rangle}}$$

$$B'(x, y) = B(x, y) \cdot \sqrt[4]{\frac{\sqrt{I_{Lt}^R(x,y) \cdot I_{Rt}^R(x,y)}}{\left\langle \sqrt{I_{Lt}^R(x,y) \cdot I_{Rt}^R(x,y)} \right\rangle}}$$

$$\cdot \sqrt{\sqrt[4]{\frac{\sqrt{I_{Lt}^G(x,y) \cdot I_{Rt}^G(x,y)}}{\left\langle \sqrt{I_{Lt}^G(x,y) \cdot I_{Rt}^G(x,y)} \right\rangle}} \cdot \sqrt[4]{\frac{\sqrt{I_{Lt}^B(x,y) \cdot I_{Rt}^B(x,y)}}{\left\langle \sqrt{I_{Lt}^B(x,y) \cdot I_{Rt}^B(x,y)} \right\rangle}}}$$

In Case of Fixed-Difference $$R'(x, y) = R(x, y) + \frac{1}{4}\left(\frac{I_{Lt}^R(x,y) + I_{Rt}^R(x,y)}{2} - \left\langle \frac{I_{Lt}^R(x,y) + I_{Rt}^R(x,y)}{2} \right\rangle\right) +$$
$$\frac{1}{2}\left(\frac{I_{Lt}^G(x,y) + I_{Rt}^G(x,y)}{2} - \left\langle \frac{I_{Lt}^G(x,y) + I_{Rt}^G(x,y)}{2} \right\rangle\right) +$$
$$\frac{1}{4}\left(\frac{I_{Lt}^B(x,y) + I_{Rt}^B(x,y)}{2} - \left\langle \frac{I_{Lt}^B(x,y) + I_{Rt}^B(x,y)}{2} \right\rangle\right)$$

$$G'(x, y) = G(x, y) + \frac{1}{4}\left(\frac{I_{Lt}^R(x,y) + I_{Rt}^R(x,y)}{2} - \left\langle \frac{I_{Lt}^R(x,y) + I_{Rt}^R(x,y)}{2} \right\rangle\right) +$$
$$\frac{1}{2}\left(\frac{I_{Lt}^G(x,y) + I_{Rt}^G(x,y)}{2} - \left\langle \frac{I_{Lt}^G(x,y) + I_{Rt}^G(x,y)}{2} \right\rangle\right) +$$
$$\frac{1}{4}\left(\frac{I_{Lt}^B(x,y) + I_{Rt}^B(x,y)}{2} - \left\langle \frac{I_{Lt}^B(x,y) + I_{Rt}^B(x,y)}{2} \right\rangle\right)$$

$$B'(x, y) = B(x, y) + \frac{1}{4}\left(\frac{I_{Lt}^R(x,y) + I_{Rt}^R(x,y)}{2} - \left\langle \frac{I_{Lt}^R(x,y) + I_{Rt}^R(x,y)}{2} \right\rangle\right) +$$
$$\frac{1}{2}\left(\frac{I_{Lt}^G(x,y) + I_{Rt}^G(x,y)}{2} - \left\langle \frac{I_{Lt}^G(x,y) + I_{Rt}^G(x,y)}{2} \right\rangle\right) +$$
$$\frac{1}{4}\left(\frac{I_{Lt}^B(x,y) + I_{Rt}^B(x,y)}{2} - \left\langle \frac{I_{Lt}^B(x,y) + I_{Rt}^B(x,y)}{2} \right\rangle\right)$$

< > denotes a local average. For example, as shown below, a 3×3 isotropic low pass filter is employed. A smoothing filter having a wider range may be employed.

$$\langle \rangle = (1/16) \times \begin{array}{|c|c|c|} \hline 1 & 2 & 1 \\ \hline 2 & 4 & 2 \\ \hline 1 & 2 & 1 \\ \hline \end{array}$$

An edge component of a near-infrared non-parallax image plane generated as an average of near-infrared left and right parallax images extracted as a correction term has a low sampling density.
For this reason, an image region generated by interpolation changes gradually, and thus cannot be extracted, and irregularity information around the sampling position is extracted.

Therefore, image-capturing information sampled by near-infrared pixels is reflected in a result of Bayer interpolation of visible light.

7) Generation of Actual Visible and Invisible Parallax Images

About visible images, by using the tentative left parallax color images $R_{Lt}(x,y)$, $G_{Lt}(x,y)$ and $B_{Lt}(x,y)$ having low resolving power generated at Step 3), and non-parallax color images $R_N(x,y)$, $G_N(x,y)$ and $B_N(x,y)$ having high resolving power generated in intermediate processing at Step 5), and furthermore by using also the tentative left parallax color images $I^R_{Lt}(x,y)$, $I^G_{Lt}(x,y)$ and $I^B_{Lt}(x,y)$ having low resolving power generated at Step 3) for near-infrared images, and the non-parallax three-band images $I^R_N(x,y)$, $I^G_N(x,y)$ and $I^B_N(x,y)$ having high resolving power generated in intermediate processing at Step 6) for near-infrared images, left parallax color images $R'_{Lt}(x,y)$, $G'_{Lt}(x,y)$ and $B'_{Lt}(x,y)$ having high resolving power to be actually output are generated. Similarly, by using the tentative right parallax color images $R_{Rt}(x,y)$, $G_{Rt}(x,y)$ and $B_{Rt}(x,y)$ having low resolving power generated at Step 3), and non-parallax color images $R_N(x,y)$, $G_N(x,y)$ and $B_N(x,y)$ having high resolving power generated in intermediate processing at Step 5), and furthermore by using also the tentative left parallax color images $I^R_{Rt}(x,y)$, $I^G_{Rt}(x,y)$ and $I^B_{Rt}(x,y)$ having low resolving power generated at Step 3) for near-infrared images, and the non-parallax three-band images $I^R_N(x,y)$, $I^G_N(x,y)$ and $I^B_N(x,y)$ having high resolving power generated in intermediate processing at Step 6) for near-infrared images, right parallax color images $R'R_t(x,y)$, $G'R_t(x,y)$ and $B'R_t(x,y)$ having high resolving power to be actually output are generated.

About near-infrared images also, by using the tentative left parallax color images $I^R_{Rt}(x,y)$, $I^G_{Rt}(x,y)$ and $I^B_{Rt}(x,y)$ having low resolving power generated at Step 3), and non-parallax three-band images $I^R_N(x,y)$, $I^G_N(x,y)$ and $I^B_N(x,y)$ having high resolving power generated in intermediate processing at Step 6), and furthermore by using also the tentative left parallax color images $R_{Lt}(x,y)$, $G_{Lt}(x,y)$ and $B_{Lt}(x,y)$ having low resolving power generated at Step 3) for visible images, and the non-parallax color images $R_N(x,y)$, $G_N(x,y)$ and $B_N(x,y)$ having high resolving power generated in intermediate processing at Step 5) for visible images, left parallax three-band images $I'^R_{Lt}(x,y)$, $I'^G_{Lt}(x,y)$ and $I'^B_{Lt}(x,y)$ having high resolving power to be actually output are generated. Similarly, by using the tentative right parallax three-band images $I^R_{Rt}(x,y)$, $I^G_{Rt}(x,y)$ and $I^B_{Rt}(x,y)$ having low resolving power generated at Step 3, and non-parallax three-band images $I^R_N(x,y)$, $I^G_N(x,y)$ and $I^B_N(x,y)$ having high resolving power generated in intermediate processing at Step 6) and furthermore by using also the tentative left parallax color images $R_{Rt}(x,y)$, $G_{Rt}(x,y)$ and $B_{Rt}(x,y)$ having low resolving power generated at Step 3) for visible images, and the non-parallax color images $R_N(x,y)$, $G_N(x,y)$ and $B_N(x,y)$ having high resolving power generated in intermediate processing at Step 5) for visible images, right parallax three-band images $I'^R_{Rt}(x,y)$, $I'^G_{Rt}(x,y)$ and $I'^B_{Rt}(x,y)$ having high resolving power to be actually output are generated.

That is, parallax modulation in which visible images are mixed mutually between visible images and near-infrared images, and near-infrared images also are mutually mixed between near-infrared images and visible images is performed. Additionally, multicolor parallax modulation is also performed in visible wavelengths by also performing mixing among wavelength bands. Multiband parallax modulation is also performed also in near-infrared wavelengths by also performing mixing among wavelength bands. With the above-mentioned processes, the generated stereoscopic images become high resolution visible and near-infrared stereoscopic images in which entire sampling information at the time of image-capturing is reflected.

Also if parallax modulation is to be performed, a geometrical mean taking into consideration the density ratio of RGB and $I^R I^G I^B$ among respective parallax pixels in an image sensor array is taken. That is, because R:G:B:$I^R$:$I^G$:$I^B$=1:2:1:1:2:1 among left parallax pixels, and R:G:B:$I^R$:$I^G$:$I^B$=1:2:1:1:2:1 also among right parallax pixels, in a case of modulation of fixed-ratio, the weight of the ⅛-th power is given to parallax modulation by an R component and an $I^R$ component, the weight of the ¼-th power is given to parallax modulation by a G component and an $I^G$ component, and the weight of the ⅛-th power is given to parallax modulation by a B component and an $I^B$ component so that allocation is performed placing emphasis on parallax modulation by a G component and an $I^G$ component whose density is high. In a case of parallax modulation of fixed-difference, coefficients of ¼-fold, ½-fold and ¼-fold are applied to RGB and $I^R I^G I^B$, respectively. A similar principle applies also to the near-infrared three bands.

In Case of Fixed-Ratio a) Parallax Modulation Using Arithmetic Mean as Reference Point Left Parallax Modulation $$R'_{Lt}(x,y) = R_N(x,y) \sqrt[8]{\frac{2R_{Lt}(x,y)}{R_{Lt}(x,y)+R_{Rt}(x,y)}} \sqrt[4]{\frac{2G_{Lt}(x,y)}{G_{Lt}(x,y)+G_{Rt}(x,y)}}$$

$$\sqrt[8]{\frac{2B_{Lt}(x,y)}{B_{Lt}(x,y)+B_{Rt}(x,y)}} \cdot \sqrt[8]{\frac{2I^R_{Lt}(x,y)}{I^R_{Lt}(x,y)+I^R_{Rt}(x,y)}}$$

$$\sqrt[4]{\frac{2I^G_{Lt}(x,y)}{I^G_{Lt}(x,y)+I^G_{Rt}(x,y)}} \sqrt[8]{\frac{2I^B_{Lt}(x,y)}{I^B_{Lt}(x,y)+I^B_{Rt}(x,y)}}$$

$$G'_{Lt}(x,y) = G_N(x,y) \sqrt[8]{\frac{2R_{Lt}(x,y)}{R_{Lt}(x,y)+R_{Rt}(x,y)}} \sqrt[4]{\frac{2G_{Lt}(x,y)}{G_{Lt}(x,y)+G_{Rt}(x,y)}}$$

$$\sqrt[8]{\frac{2B_{Lt}(x,y)}{B_{Lt}(x,y)+B_{Rt}(x,y)}} \cdot \sqrt[8]{\frac{2I^R_{Lt}(x,y)}{I^R_{Lt}(x,y)+I^R_{Rt}(x,y)}}$$

$$\sqrt[4]{\frac{2I^G_{Lt}(x,y)}{I^G_{Lt}(x,y)+I^G_{Rt}(x,y)}} \sqrt[8]{\frac{2I^B_{Lt}(x,y)}{I^B_{Lt}(x,y)+I^B_{Rt}(x,y)}}$$

$$B'_{Lt}(x,y) = B_N(x,y) \sqrt[8]{\frac{2R_{Lt}(x,y)}{R_{Lt}(x,y)+R_{Rt}(x,y)}} \sqrt[4]{\frac{2G_{Lt}(x,y)}{G_{Lt}(x,y)+G_{Rt}(x,y)}}$$

$$\sqrt[8]{\frac{2B_{Lt}(x,y)}{B_{Lt}(x,y)+B_{Rt}(x,y)}} \cdot \sqrt[8]{\frac{2I^R_{Lt}(x,y)}{I^R_{Lt}(x,y)+I^R_{Rt}(x,y)}}$$

$$\sqrt[4]{\frac{2I^G_{Lt}(x,y)}{I^G_{Lt}(x,y)+I^G_{Rt}(x,y)}} \sqrt[8]{\frac{2I^B_{Lt}(x,y)}{I^B_{Lt}(x,y)+I^B_{Rt}(x,y)}}$$

$$I'^R_{Lt}(x,y) = I^R_N(x,y) \sqrt[8]{\frac{2R_{Lt}(x,y)}{R_{Lt}(x,y)+R_{Rt}(x,y)}} \sqrt[4]{\frac{2G_{Lt}(x,y)}{G_{Lt}(x,y)+G_{Rt}(x,y)}}$$

$$\sqrt[8]{\frac{2B_{Lt}(x,y)}{B_{Lt}(x,y)+B_{Rt}(x,y)}} \cdot \sqrt[8]{\frac{2I^R_{Lt}(x,y)}{I^R_{Lt}(x,y)+I^R_{Rt}(x,y)}}$$

$$\sqrt[4]{\frac{2I^G_{Lt}(x,y)}{I^G_{Lt}(x,y)+I^G_{Rt}(x,y)}} \sqrt[8]{\frac{2I^B_{Lt}(x,y)}{I^B_{Lt}(x,y)+I^B_{Rt}(x,y)}}$$

$$I'^G_{Lt}(x,y) = I^G_N(x,y) \sqrt[8]{\frac{2R_{Lt}(x,y)}{R_{Lt}(x,y)+R_{Rt}(x,y)}} \sqrt[4]{\frac{2G_{Lt}(x,y)}{G_{Lt}(x,y)+G_{Rt}(x,y)}}$$

$$\sqrt[8]{\frac{2B_{Lt}(x,y)}{B_{Lt}(x,y)+B_{Rt}(x,y)}} \cdot \sqrt[8]{\frac{2I^R_{Lt}(x,y)}{I^R_{Lt}(x,y)+I^R_{Rt}(x,y)}}$$

-continued $$\sqrt[4]{\frac{2I_{Lt}^G(x,y)}{I_{Lt}^G(x,y)+I_{Rt}^G(x,y)}} \sqrt[8]{\frac{2I_{Lt}^B(x,y)}{I_{Lt}^B(x,y)+I_{Rt}^B(x,y)}}$$

$$I_{Lt}^{\prime B}(x,y) = I_N^B(x,y) \sqrt[8]{\frac{2R_{Lt}(x,y)}{R_{Lt}(x,y)+R_{Rt}(x,y)}} \sqrt[4]{\frac{2G_{Lt}(x,y)}{G_{Lt}(x,y)+G_{Rt}(x,y)}}$$

$$\sqrt[8]{\frac{2B_{Lt}(x,y)}{B_{Lt}(x,y)+B_{Rt}(x,y)}} \cdot \sqrt[8]{\frac{2I_{Lt}^R(x,y)}{I_{Lt}^R(x,y)+I_{Rt}^R(x,y)}}$$

$$\sqrt[4]{\frac{2I_{Lt}^G(x,y)}{I_{Lt}^G(x,y)+I_{Rt}^G(x,y)}} \sqrt[8]{\frac{2I_{Lt}^B(x,y)}{I_{LtRt}^B(x,y)+I_{Rt}^B(x,y)}}$$

Right Parallax Modulation $$R_{Rt}^{\prime}(x,y) = R_N(x,y) \sqrt[8]{\frac{2R_{Rt}(x,y)}{R_{Lt}(x,y)+R_{Rt}(x,y)}} \sqrt[4]{\frac{2G_{Rt}(x,y)}{G_{Lt}(x,y)+G_{Rt}(x,y)}}$$

$$\sqrt[8]{\frac{2B_{Rt}(x,y)}{B_{Lt}(x,y)+B_{Rt}(x,y)}} \cdot \sqrt[8]{\frac{2I_{Rt}^R(x,y)}{I_{Lt}^R(x,y)+I_{Rt}^R(x,y)}}$$

$$\sqrt[4]{\frac{2I_{Rt}^G(x,y)}{I_{Lt}^G(x,y)+I_{Rt}^G(x,y)}} \sqrt[8]{\frac{2I_{Rt}^B(x,y)}{I_{Lt}^B(x,y)+I_{Rt}^B(x,y)}}$$

$$G_{Rt}^{\prime}(x,y) = G_N(x,y) \sqrt[8]{\frac{2R_{Rt}(x,y)}{R_{Lt}(x,y)+R_{Rt}(x,y)}} \sqrt[4]{\frac{2G_{Rt}(x,y)}{G_{Lt}(x,y)+G_{Rt}(x,y)}}$$

$$\sqrt[8]{\frac{2B_{Rt}(x,y)}{B_{Lt}(x,y)+B_{Rt}(x,y)}} \cdot \sqrt[8]{\frac{2I_{Rt}^R(x,y)}{I_{Lt}^R(x,y)+I_{Rt}^R(x,y)}}$$

$$\sqrt[4]{\frac{2I_{Rt}^G(x,y)}{I_{Lt}^G(x,y)+I_{Rt}^G(x,y)}} \sqrt[8]{\frac{2I_{Rt}^B(x,y)}{I_{Lt}^B(x,y)+I_{Rt}^B(x,y)}}$$

$$B_{Rt}^{\prime}(x,y) = B_N(x,y) \sqrt[8]{\frac{2R_{Rt}(x,y)}{R_{Lt}(x,y)+R_{Rt}(x,y)}} \sqrt[4]{\frac{2G_{Rt}(x,y)}{G_{Lt}(x,y)+G_{Rt}(x,y)}}$$

$$\sqrt[8]{\frac{2B_{Rt}(x,y)}{B_{Lt}(x,y)+B_{Rt}(x,y)}} \cdot \sqrt[8]{\frac{2I_{Rt}^R(x,y)}{I_{Lt}^R(x,y)+I_{Rt}^R(x,y)}}$$

$$\sqrt[4]{\frac{2I_{Rt}^G(x,y)}{I_{Lt}^G(x,y)+I_{Rt}^G(x,y)}} \sqrt[8]{\frac{2I_{Rt}^B(x,y)}{I_{Lt}^B(x,y)+I_{Rt}^B(x,y)}}$$

$$I_{Rt}^{\prime R}(x,y) = I_N^R(x,y) \sqrt[8]{\frac{2R_{Rt}(x,y)}{R_{Lt}(x,y)+R_{Rt}(x,y)}} \sqrt[4]{\frac{2G_{Rt}(x,y)}{G_{Lt}(x,y)+G_{Rt}(x,y)}}$$

$$\sqrt[8]{\frac{2B_{Rt}(x,y)}{B_{Lt}(x,y)+B_{Rt}(x,y)}} \cdot \sqrt[8]{\frac{2I_{Rt}^R(x,y)}{I_{Lt}^R(x,y)+I_{Rt}^R(x,y)}}$$

$$\sqrt[4]{\frac{2I_{Rt}^G(x,y)}{I_{Lt}^G(x,y)+I_{Rt}^G(x,y)}} \sqrt[8]{\frac{2I_{Rt}^B(x,y)}{I_{Lt}^B(x,y)+I_{Rt}^B(x,y)}}$$

$$I_{Rt}^{\prime G}(x,y) = I_N^G(x,y) \sqrt[8]{\frac{2R_{Rt}(x,y)}{R_{Lt}(x,y)+R_{Rt}(x,y)}} \sqrt[4]{\frac{2G_{Rt}(x,y)}{G_{Lt}(x,y)+G_{Rt}(x,y)}}$$

$$\sqrt[8]{\frac{2B_{Rt}(x,y)}{B_{Lt}(x,y)+B_{Rt}(x,y)}} \cdot \sqrt[8]{\frac{2I_{Rt}^R(x,y)}{I_{Lt}^R(x,y)+I_{Rt}^R(x,y)}}$$

$$\sqrt[4]{\frac{2I_{Rt}^G(x,y)}{I_{Lt}^G(x,y)+I_{Rt}^G(x,y)}} \sqrt[8]{\frac{2I_{Rt}^B(x,y)}{I_{Lt}^B(x,y)+I_{Rt}^B(x,y)}}$$

$$I_{Rt}^{\prime B}(x,y) = I_N^B(x,y) \sqrt[8]{\frac{2R_{Rt}(x,y)}{R_{Lt}(x,y)+R_{Rt}(x,y)}} \sqrt[4]{\frac{2G_{Rt}(x,y)}{G_{Lt}(x,y)+G_{Rt}(x,y)}}$$

$$\sqrt[8]{\frac{2B_{Rt}(x,y)}{B_{Lt}(x,y)+B_{Rt}(x,y)}} \cdot \sqrt[8]{\frac{2I_{Rt}^R(x,y)}{I_{Lt}^R(x,y)+I_{Rt}^R(x,y)}}$$

$$\sqrt[4]{\frac{2I_{Rt}^G(x,y)}{I_{Lt}^G(x,y)+I_{Rt}^G(x,y)}} \sqrt[8]{\frac{2I_{Rt}^B(x,y)}{I_{Lt}^B(x,y)+I_{Rt}^B(x,y)}}$$

b) Parallax Modulation Using Geometrical Mean as Reference Point

Left Parallax Modulation $$R_{Lt}^{\prime}(x,y) = R_N(x,y) \cdot \sqrt[8]{\sqrt{\frac{R_{Lt}(x,y)}{R_{Rt}(x,y)}}} \sqrt[4]{\sqrt{\frac{G_{Lt}(x,y)}{G_{Rt}(x,y)}}}$$

$$\sqrt[8]{\sqrt{\frac{B_{Lt}(x,y)}{B_{Rt}(x,y)}}} \cdot \sqrt[8]{\sqrt{\frac{I_{Lt}^R(x,y)}{I_{Rt}^R(x,y)}}} \sqrt[4]{\sqrt{\frac{I_{Lt}^G(x,y)}{I_{Rt}^G(x,y)}}} \sqrt[8]{\sqrt{\frac{I_{Lt}^B(x,y)}{I_{Rt}^B(x,y)}}}$$

$$G_{Lt}^{\prime}(x,y) = G_N(x,y) \cdot \sqrt[8]{\sqrt{\frac{R_{Lt}(x,y)}{R_{Rt}(x,y)}}} \sqrt[4]{\sqrt{\frac{G_{Lt}(x,y)}{G_{Rt}(x,y)}}}$$

$$\sqrt[8]{\sqrt{\frac{B_{Lt}(x,y)}{B_{Rt}(x,y)}}} \cdot \sqrt[8]{\sqrt{\frac{I_{Lt}^R(x,y)}{I_{Rt}^R(x,y)}}} \sqrt[4]{\sqrt{\frac{I_{Lt}^G(x,y)}{I_{Rt}^G(x,y)}}} \sqrt[8]{\sqrt{\frac{I_{Lt}^B(x,y)}{I_{Rt}^B(x,y)}}}$$

$$B_{Lt}^{\prime}(x,y) = B_N(x,y) \cdot \sqrt[8]{\sqrt{\frac{R_{Lt}(x,y)}{R_{Rt}(x,y)}}} \sqrt[4]{\sqrt{\frac{G_{Lt}(x,y)}{G_{Rt}(x,y)}}}$$

$$\sqrt[8]{\sqrt{\frac{B_{Lt}(x,y)}{B_{Rt}(x,y)}}} \cdot \sqrt[8]{\sqrt{\frac{I_{Lt}^R(x,y)}{I_{Rt}^R(x,y)}}} \sqrt[4]{\sqrt{\frac{I_{Lt}^G(x,y)}{I_{Rt}^G(x,y)}}} \sqrt[8]{\sqrt{\frac{I_{Lt}^B(x,y)}{I_{Rt}^B(x,y)}}}$$

$$I_{Lt}^{\prime R}(x,y) = I_N^R(x,y) \cdot \sqrt[8]{\sqrt{\frac{R_{Lt}(x,y)}{R_{Rt}(x,y)}}} \sqrt[4]{\sqrt{\frac{G_{Lt}(x,y)}{G_{Rt}(x,y)}}}$$

$$\sqrt[8]{\sqrt{\frac{B_{Lt}(x,y)}{B_{Rt}(x,y)}}} \cdot \sqrt[8]{\sqrt{\frac{I_{Lt}^R(x,y)}{I_{Rt}^R(x,y)}}} \sqrt[4]{\sqrt{\frac{I_{Lt}^G(x,y)}{I_{Rt}^G(x,y)}}} \sqrt[8]{\sqrt{\frac{I_{Lt}^B(x,y)}{I_{Rt}^B(x,y)}}}$$

$$I_{Lt}^{\prime G}(x,y) = I_N^G(x,y) \cdot \sqrt[8]{\sqrt{\frac{R_{Lt}(x,y)}{R_{Rt}(x,y)}}} \sqrt[4]{\sqrt{\frac{G_{Lt}(x,y)}{G_{Rt}(x,y)}}}$$

$$\sqrt[8]{\sqrt{\frac{B_{Lt}(x,y)}{B_{Rt}(x,y)}}} \cdot \sqrt[8]{\sqrt{\frac{I_{Lt}^R(x,y)}{I_{Rt}^R(x,y)}}} \sqrt[4]{\sqrt{\frac{I_{Lt}^G(x,y)}{I_{Rt}^G(x,y)}}} \sqrt[8]{\sqrt{\frac{I_{Lt}^B(x,y)}{I_{Rt}^B(x,y)}}}$$

$$I_{Lt}^{\prime B}(x,y) = I_N^B(x,y) \cdot \sqrt[8]{\sqrt{\frac{R_{Lt}(x,y)}{R_{Rt}(x,y)}}} \sqrt[4]{\sqrt{\frac{G_{Lt}(x,y)}{G_{Rt}(x,y)}}}$$

$$\sqrt[8]{\sqrt{\frac{B_{Lt}(x,y)}{B_{Rt}(x,y)}}} \cdot \sqrt[8]{\sqrt{\frac{I_{Lt}^R(x,y)}{I_{Rt}^R(x,y)}}} \sqrt[4]{\sqrt{\frac{I_{Lt}^G(x,y)}{I_{Rt}^G(x,y)}}} \sqrt[8]{\sqrt{\frac{I_{Lt}^B(x,y)}{I_{Rt}^B(x,y)}}}$$

Right Parallax Modulation $$R_{Rt}^{\prime}(x,y) = R_N(x,y) \cdot \sqrt[8]{\sqrt{\frac{R_{Rt}(x,y)}{R_{Lt}(x,y)}}} \sqrt[4]{\sqrt{\frac{G_{Rt}(x,y)}{G_{Lt}(x,y)}}}$$

$$\sqrt[8]{\sqrt{\frac{B_{Rt}(x,y)}{B_{Lt}(x,y)}}} \cdot \sqrt[8]{\sqrt{\frac{I_{Rt}^R(x,y)}{I_{Lt}^R(x,y)}}} \sqrt[4]{\sqrt{\frac{I_{Rt}^G(x,y)}{I_{Lt}^G(x,y)}}} \sqrt[8]{\sqrt{\frac{I_{Rt}^B(x,y)}{I_{Lt}^B(x,y)}}}$$

$$G'_{Rt}(x,y) = G_N(x,y) \cdot \sqrt[8]{\sqrt{\frac{R_{Rt}(x,y)}{R_{Lt}(x,y)}}} \sqrt[4]{\frac{G_{Rt}(x,y)}{G_{Lt}(x,y)}}$$

$$\sqrt[8]{\sqrt{\frac{B_{Rt}(x,y)}{B_{Lt}(x,y)}}} \cdot \sqrt[8]{\frac{I_{Rt}^R(x,y)}{I_{Lt}^R(x,y)}} \sqrt[4]{\frac{I_{Rt}^G(x,y)}{I_{Lt}^G(x,y)}} \sqrt[8]{\frac{I_{Rt}^B(x,y)}{I_{Lt}^B(x,y)}}$$

$$B'_{Rt}(x,y) = B_N(x,y) \cdot \sqrt[8]{\sqrt{\frac{R_{Rt}(x,y)}{R_{Lt}(x,y)}}} \sqrt[4]{\frac{G_{Rt}(x,y)}{G_{Lt}(x,y)}}$$

$$\sqrt[8]{\sqrt{\frac{B_{Rt}(x,y)}{B_{Lt}(x,y)}}} \cdot \sqrt[8]{\frac{I_{Rt}^R(x,y)}{I_{Lt}^R(x,y)}} \sqrt[4]{\frac{I_{Rt}^G(x,y)}{I_{Lt}^G(x,y)}} \sqrt[8]{\frac{I_{Rt}^B(x,y)}{I_{Lt}^B(x,y)}}$$

$$I'^R_{Rt}(x,y) = I^R_N(x,y) \cdot \sqrt[8]{\sqrt{\frac{R_{Rt}(x,y)}{R_{Lt}(x,y)}}} \sqrt[4]{\frac{G_{Rt}(x,y)}{G_{Lt}(x,y)}}$$

$$\sqrt[8]{\sqrt{\frac{B_{Rt}(x,y)}{B_{Lt}(x,y)}}} \cdot \sqrt[8]{\frac{I_{Rt}^R(x,y)}{I_{Lt}^R(x,y)}} \sqrt[4]{\frac{I_{Rt}^G(x,y)}{I_{Lt}^G(x,y)}} \sqrt[8]{\frac{I_{Rt}^B(x,y)}{I_{Lt}^B(x,y)}}$$

$$I'^G_{Rt}(x,y) = I^G_N(x,y) \cdot \sqrt[8]{\sqrt{\frac{R_{Rt}(x,y)}{R_{Lt}(x,y)}}} \sqrt[4]{\frac{G_{Rt}(x,y)}{G_{Lt}(x,y)}}$$

$$\sqrt[8]{\sqrt{\frac{B_{Rt}(x,y)}{B_{Lt}(x,y)}}} \cdot \sqrt[8]{\frac{I_{Rt}^R(x,y)}{I_{Lt}^R(x,y)}} \sqrt[4]{\frac{I_{Rt}^G(x,y)}{I_{Lt}^G(x,y)}} \sqrt[8]{\frac{I_{Rt}^B(x,y)}{I_{Lt}^B(x,y)}}$$

$$I'^B_{Rt}(x,y) = I^B_N(x,y) \cdot \sqrt[8]{\sqrt{\frac{R_{Rt}(x,y)}{R_{Lt}(x,y)}}} \sqrt[4]{\frac{G_{Rt}(x,y)}{G_{Lt}(x,y)}}$$

$$\sqrt[8]{\sqrt{\frac{B_{Rt}(x,y)}{B_{Lt}(x,y)}}} \cdot \sqrt[8]{\frac{I_{Rt}^R(x,y)}{I_{Lt}^R(x,y)}} \sqrt[4]{\frac{I_{Rt}^G(x,y)}{I_{Lt}^G(x,y)}} \sqrt[8]{\frac{I_{Rt}^B(x,y)}{I_{Lt}^B(x,y)}}$$

In Case of Fixed-Difference

Left Parallax Modulation $$R'_{Lt}(x,y) = R_N(x,y) + \frac{1}{8} \cdot \frac{R_{Lt}(x,y) - R_{Rt}(x,y)}{2} + \frac{1}{4} \cdot \frac{G_{Lt}(x,y) - G_{Rt}(x,y)}{2} +$$
$$\frac{1}{8} \cdot \frac{B_{Lt}(x,y) - B_{Rt}(x,y)}{2} + \frac{1}{8} \cdot \frac{I^R_{Lt}(x,y) - I^R_{Rt}(x,y)}{2} +$$
$$\frac{1}{4} \cdot \frac{I^G_{Lt}(x,y) - I^G_{Rt}(x,y)}{2} + \frac{1}{8} \cdot \frac{I^B_{Lt}(x,y) - I^B_{Rt}(x,y)}{2}$$

$$G'_{Lt}(x,y) = G_N(x,y) + \frac{1}{8} \cdot \frac{R_{Lt}(x,y) - R_{Rt}(x,y)}{2} +$$
$$\frac{1}{4} \cdot \frac{G_{Lt}(x,y) - G_{Rt}(x,y)}{2} +$$
$$\frac{1}{8} \cdot \frac{B_{Lt}(x,y) - B_{Rt}(x,y)}{2} + \frac{1}{8} \cdot \frac{I^R_{Lt}(x,y) - I^R_{Rt}(x,y)}{2} +$$
$$\frac{1}{4} \cdot \frac{I^G_{Lt}(x,y) - I^G_{Rt}(x,y)}{2} + \frac{1}{8} \cdot \frac{I^B_{Lt}(x,y) - I^B_{Rt}(x,y)}{2}$$

$$B'_{Lt}(x,y) = B_N(x,y) + \frac{1}{8} \cdot \frac{R_{Lt}(x,y) - R_{Rt}(x,y)}{2} +$$
$$\frac{1}{4} \cdot \frac{G_{Lt}(x,y) - G_{Rt}(x,y)}{2} +$$
$$\frac{1}{8} \cdot \frac{B_{Lt}(x,y) - B_{Rt}(x,y)}{2} + \frac{1}{8} \cdot \frac{I^R_{Lt}(x,y) - I^R_{Rt}(x,y)}{2} +$$
$$\frac{1}{4} \cdot \frac{I^G_{Lt}(x,y) - I^G_{Rt}(x,y)}{2} + \frac{1}{8} \cdot \frac{I^B_{Lt}(x,y) - I^B_{Rt}(x,y)}{2}$$

$$I'^R_{Lt}(x,y) = I^R_N(x,y) + \frac{1}{8} \cdot \frac{R_{Lt}(x,y) - R_{Rt}(x,y)}{2} + \frac{1}{4} \cdot \frac{G_{Lt}(x,y) - G_{Rt}(x,y)}{2} +$$
$$\frac{1}{8} \cdot \frac{B_{Lt}(x,y) - B_{Rt}(x,y)}{2} + \frac{1}{8} \cdot \frac{I^R_{Lt}(x,y) - I^R_{Rt}(x,y)}{2} +$$
$$\frac{1}{4} \cdot \frac{I^G_{Lt}(x,y) - I^G_{Rt}(x,y)}{2} + \frac{1}{8} \cdot \frac{I^B_{Lt}(x,y) - I^B_{Rt}(x,y)}{2}$$

$$I'^G_{Lt}(x,y) = I^G_N(x,y) + \frac{1}{8} \cdot \frac{R_{Lt}(x,y) - R_{Rt}(x,y)}{2} + \frac{1}{4} \cdot \frac{G_{Lt}(x,y) - G_{Rt}(x,y)}{2} +$$
$$\frac{1}{8} \cdot \frac{B_{Lt}(x,y) - B_{Rt}(x,y)}{2} + \frac{1}{8} \cdot \frac{I^R_{Lt}(x,y) - I^R_{Rt}(x,y)}{2} +$$
$$\frac{1}{4} \cdot \frac{I^G_{Lt}(x,y) - I^G_{Rt}(x,y)}{2} + \frac{1}{8} \cdot \frac{I^B_{Lt}(x,y) - I^B_{Rt}(x,y)}{2}$$

$$I'^B_{Lt}(x,y) = I^B_N(x,y) + \frac{1}{8} \cdot \frac{R_{Lt}(x,y) - R_{Rt}(x,y)}{2} + \frac{1}{4} \cdot \frac{G_{Lt}(x,y) - G_{Rt}(x,y)}{2} +$$
$$\frac{1}{8} \cdot \frac{B_{Lt}(x,y) - B_{Rt}(x,y)}{2} + \frac{1}{8} \cdot \frac{I^R_{Lt}(x,y) - I^R_{Rt}(x,y)}{2} +$$
$$\frac{1}{4} \cdot \frac{I^G_{Lt}(x,y) - I^G_{Rt}(x,y)}{2} + \frac{1}{8} \cdot \frac{I^B_{Lt}(x,y) - I^B_{Rt}(x,y)}{2}$$

Right Parallax Modulation $$R'_{Rt}(x,y) = R_N(x,y) + \frac{1}{8} \cdot \frac{R_{Rt}(x,y) - R_{Lt}(x,y)}{2} + \frac{1}{4} \cdot \frac{G_{Rt}(x,y) - G_{Lt}(x,y)}{2} +$$
$$\frac{1}{8} \cdot \frac{B_{Rt}(x,y) - B_{Lt}(x,y)}{2} + \frac{1}{8} \cdot \frac{I^R_{Rt}(x,y) - I^R_{Lt}(x,y)}{2} +$$
$$\frac{1}{4} \cdot \frac{I^G_{Rt}(x,y) - I^G_{Lt}(x,y)}{2} + \frac{1}{8} \cdot \frac{I^B_{Rt}(x,y) - I^B_{Lt}(x,y)}{2}$$

$$G'_{Rt}(x,y) = G_N(x,y) + \frac{1}{8} \cdot \frac{R_{Rt}(x,y) - R_{Lt}(x,y)}{2} +$$
$$\frac{1}{4} \cdot \frac{G_{Rt}(x,y) - G_{Lt}(x,y)}{2} +$$
$$\frac{1}{8} \cdot \frac{B_{Rt}(x,y) - B_{Lt}(x,y)}{2} + \frac{1}{8} \cdot \frac{I^R_{Rt}(x,y) - I^R_{Lt}(x,y)}{2} +$$
$$\frac{1}{4} \cdot \frac{I^G_{Rt}(x,y) - I^G_{Lt}(x,y)}{2} + \frac{1}{8} \cdot \frac{I^B_{Rt}(x,y) - I^B_{Lt}(x,y)}{2}$$

$$B'_{Rt}(x,y) = B_N(x,y) + \frac{1}{8} \cdot \frac{R_{Rt}(x,y) - R_{Lt}(x,y)}{2} +$$
$$\frac{1}{4} \cdot \frac{G_{Rt}(x,y) - G_{Lt}(x,y)}{2} +$$
$$\frac{1}{8} \cdot \frac{B_{Rt}(x,y) - B_{Lt}(x,y)}{2} + \frac{1}{8} \cdot \frac{I^R_{Rt}(x,y) - I^R_{Lt}(x,y)}{2} +$$
$$\frac{1}{4} \cdot \frac{I^G_{Rt}(x,y) - I^G_{Lt}(x,y)}{2} + \frac{1}{8} \cdot \frac{I^B_{Rt}(x,y) - I^B_{Lt}(x,y)}{2}$$

$$I'^R_{Rt}(x,y) = I^R_N(x,y) + \frac{1}{8} \cdot \frac{R_{Rt}(x,y) - R_{Lt}(x,y)}{2} + \frac{1}{4} \cdot \frac{G_{Rt}(x,y) - G_{Lt}(x,y)}{2} +$$
$$\frac{1}{8} \cdot \frac{B_{Rt}(x,y) - B_{Lt}(x,y)}{2} + \frac{1}{8} \cdot \frac{I^R_{Rt}(x,y) - I^R_{Lt}(x,y)}{2} +$$
$$\frac{1}{4} \cdot \frac{I^G_{Rt}(x,y) - I^G_{Lt}(x,y)}{2} + \frac{1}{8} \cdot \frac{I^B_{Rt}(x,y) - I^B_{Lt}(x,y)}{2}$$

$$I'^G_{Rt}(x,y) = I^G_N(x,y) + \frac{1}{8} \cdot \frac{R_{Rt}(x,y) - R_{Lt}(x,y)}{2} + \frac{1}{4} \cdot \frac{G_{Rt}(x,y) - G_{Lt}(x,y)}{2} +$$

-continued $$I_{Rt}'^B(x, y) = I_N^B(x, y) + \frac{1}{8} \cdot \frac{B_{Rt}(x, y) - B_{Lt}(x, y)}{2} + \frac{1}{8} \cdot \frac{I_{Rt}^R(x, y) - I_{Lt}^R(x, y)}{2} +$$
$$\frac{1}{4} \cdot \frac{I_{Rt}^G(x, y) - I_{Lt}^G(x, y)}{2} + \frac{1}{8} \cdot \frac{I_{Rt}^B(x, y) - I_{Lt}^B(x, y)}{2} +$$
$$\frac{1}{8} \cdot \frac{R_{Rt}(x, y) - R_{Lt}(x, y)}{2} + \frac{1}{4} \cdot \frac{G_{Rt}(x, y) - G_{Lt}(x, y)}{2} +$$
$$\frac{1}{8} \cdot \frac{B_{Rt}(x, y) - B_{Lt}(x, y)}{2} + \frac{1}{8} \cdot \frac{I_{Rt}^R(x, y) - I_{Lt}^R(x, y)}{2} +$$
$$\frac{1}{4} \cdot \frac{I_{Rt}^G(x, y) - I_{Lt}^G(x, y)}{2} + \frac{1}{8} \cdot \frac{I_{Rt}^B(x, y) - I_{Lt}^B(x, y)}{2}$$

Here, the principle of generating a parallax in a stereoscopic image also for an image formed at a focal position by utilizing the property that image-formed positions of a visible image and a near-infrared image are different from each other is explained once again. For example, in a case of parallax modulation of fixed-difference, all parallax modulation terms become zero in regions of subject images that are focused in visible images. However, because parallax modulation terms of near-infrared light do not become zero, a parallax modulation effect is obtained.

Example 3

———Visible Monochromatic+Invisible One-Band Sparse Parallax Pixel Array———

FIG. 11 and FIG. 12 are figures that illustrate real-space arrays as examples of pixel arrays, and k-spaces. In the examples shown, image sensors are periodically arranged according to, as the primitive lattices, the array diagrams shown on the upper portions in the respective figures. The frequency resolution region of its reciprocal lattice space also shows combinations of respective colors and respective parallaxes. In the primitive lattices of the array diagrams in the upper portions of respective figure, visible light is captured as a monochrome image, and near-infrared light is captured as a one-band image.

This array is applied to a visible+invisible monoband image sensor having a structure in which visible parallax pixels and invisible parallax pixel are arranged to have low densities, and remaining pixels are allocated to visible non-parallax pixels as much as possible by making use of a property that a parallax is generated only in a blurred subject region of a monocular pupil-divided system. The following explanation is about an example of the array of FIG. 12.

Because two bands of visible light and invisible light are considered, here again, in the titles of the flowchart, these are called color for convenience. Here, visible and invisible mutually mixed development is explained. A processing procedure is approximately like the one shown below. Here, the explanation is about the developing method corresponding to Example 2 as an example. A similar principle basically applies also to the developing method corresponding to Example 1.

1) Input of color/parallax multiplexed mosaic image data
2) Global gain balance correction of color/parallax mosaic image
3) Generation of tentative visible and invisible parallax images
4) Generation of visible non-parallax reference image by correction of left and right local illuminance distributions (Local Gain Balance Correction)
5) Generation of invisible non-parallax reference image
6) Generation of actual visible and invisible parallax images
7) Conversion of visible and invisible images into output color space A detailed explanation follows.

1) Input of Color/Parallax Multiplexed Mosaic Image Data

A single panel type visible+invisible mono-band mosaic image on which parallaxes are multiplexed shown in FIG. 12 is expressed by M(x,y). The gradation is assumed to be linear gradation output by A/D conversion.

2) Global gain balance correction of color/parallax mosaic image

By using a captured subject image as it is, the average value $\overline{N}$ of pixel values of non-parallax pixels over the entire image, the average value $\overline{Lt}$ of pixel values of left parallax pixels over the entire image and the average value $\overline{Rt}$ of pixel values of right parallax pixels over the entire image are calculated. Similar to Example 2, there are three signal levels. First, as a reference point between left and right, gain correction is performed to match the signal levels with the average values. At that time, there are two manners of obtaining the reference point, which are an arithmetic mean and a geometrical mean. Thereafter, an arithmetic mean between a left-right averaged signal level and a signal level of a non-parallax pixel is taken, and gain correction is performed to match a signal level with the average value. All of the above-mentioned processes are performed on visible pixels, and an operation only between Lt and Rt is performed on non-parallax pixels.

For convenience, in the mosaic image M(x,y):
a signal plane of visible non-parallax pixels is denoted as $W_{N\_mosaic}(x,y)$;
a signal plane of visible left parallax pixels is denoted as $W_{Lt\_mosaic}(x,y)$;
a signal plane of visible right parallax pixels is denoted as $W_{Rt\_mosaic}(x,y)$;
a signal plane of invisible left parallax pixels is denoted as $I_{Rt\_mosaic}(x,y)$; and
a signal plane of invisible right parallax pixels is denoted as $I_{Rt\_mosaic}(x,y)$.

a) In Case of Arithmetic Means Between Left and Right Average Values $$\overline{m}_W = \sqrt{\overline{W}_N \cdot \frac{\overline{W}_{Lt} + \overline{W}_{Rt}}{2}}$$

$$\overline{m}_I = \frac{\overline{I}_{Lt} + \overline{I}_{Rt}}{2}$$

Gain Values for Visible Non-Parallax Pixels $$\overline{g}_{W_N} = \frac{\overline{m}_W}{\overline{W}_N} = \sqrt{\frac{\overline{W}_{Lt} + \overline{W}_{Rt}}{2\overline{W}_N}}$$

Gain Values for Visible and Near-Infrared Left Parallax Pixels $$\overline{g}_{W_{Lt}} = \frac{\overline{m}_W}{\overline{W}_{Lt}} = \sqrt{\frac{\overline{W}_N}{\overline{W}_{Lt}} \cdot \frac{\overline{W}_{Lt} + \overline{W}_{Rt}}{2\overline{W}_{Lt}}}$$

-continued $$\bar{g}_{l_{Lt}} = \frac{\bar{m}_I}{\bar{I}_{Lt}} = \frac{\bar{I}_{Lt} + \bar{I}_{Rt}}{2\bar{I}_{Lt}}$$

Gain Values for Visible and Near-Infrared Right Parallax Pixels $$\bar{g}_{w_{Rt}} = \frac{\bar{m}_W}{\bar{W}_{Rt}} = \sqrt{\frac{\bar{W}_N}{\bar{W}_{Rt}} \cdot \frac{\bar{W}_{Lt} + \bar{W}_{Rt}}{2\bar{W}_{Rt}}}$$

$$\bar{g}_{l_{Rt}} = \frac{\bar{m}_I}{\bar{I}_{Rt}} = \frac{\bar{I}_{Lt} + \bar{I}_{Rt}}{2\bar{I}_{Rt}}$$

Global Gain Correction on Visible Non-Parallax Pixels $$W'_{N\_mosaic}(x, y) = W_{N\_mosaic}(x, y) \cdot \bar{g}_{W_N} = W_{N\_mosaic}(x, y) \cdot \sqrt{\frac{\bar{W}_{Lt} + \bar{W}_{Rt}}{2\bar{W}_N}}$$

Global Gain Correction on Visible and Near-Infrared Left Parallax Pixels $$W'_{Lt\_mosaic}(x, y) =$$

$$W_{Lt\_mosaic}(x, y) \cdot \bar{g}_{W_{Lt}} = W_{Lt\_mosaic}(x, y) \cdot \sqrt{\frac{\bar{W}_N}{\bar{W}_{Lt}} \cdot \frac{\bar{W}_{Lt} + \bar{W}_{Rt}}{2\bar{W}_{Lt}}}$$

$$I'_{Lt\_mosaic}(x, y) = I_{Lt\_mosaic}(x, y) \cdot \bar{g}_{l_{Lt}} = I_{Lt\_mosaic}(x, y) \cdot \frac{\bar{I}_{Lt} + \bar{I}_{Rt}}{2\bar{I}_{Lt}}$$

Global Gain Correction on Visible and Near-Infrared Right Parallax Pixels $$W'_{Rt\_mosaic}(x, y) =$$

$$W_{Rt\_mosaic}(x, y) \cdot \bar{g}_{W_{Rt}} = W_{Rt\_mosaic}(x, y) \cdot \sqrt{\frac{\bar{W}_N}{\bar{W}_{Rt}} \cdot \frac{\bar{W}_{Lt} + \bar{W}_{Rt}}{2\bar{W}_{Rt}}}$$

$$I'_{Rt\_mosaic}(x, y) = I_{Rt\_mosaic}(x, y) \cdot \bar{g}_{l_{Rt}} = I_{Rt\_mosaic}(x, y) \cdot \frac{\bar{I}_{Lt} + \bar{I}_{Rt}}{2\bar{I}_{Rt}}$$

b) In Case of Geometrical Means Between Left and Right Average Values $$\bar{m}_W = \sqrt{\bar{W}_N \cdot \sqrt{\bar{W}_{Lt} \cdot \bar{W}_{Rt}}}$$

$$\bar{m}_I = \sqrt{\bar{L}_{Lt} \cdot \bar{L}_{Rt}}$$

Gain Values for Visible Non-Parallax Pixels $$\bar{g}_{W_N} = \frac{\bar{m}_W}{\bar{W}_N} = \sqrt{\frac{\sqrt{\bar{W}_{Lt} \cdot \bar{W}_{Rt}}}{\bar{W}_N}}$$

Gain Values for Visible and Near-Infrared Left Parallax Pixels $$\bar{g}_{W_{Lt}} = \frac{\bar{m}_W}{\bar{W}_{Lt}} = \sqrt{\frac{\bar{W}_N}{\bar{W}_{Lt}} \cdot \sqrt{\frac{\bar{W}_{Rt}}{\bar{W}_{Lt}}}}$$

$$\bar{g}_{l_{Lt}} = \frac{\bar{m}_I}{\bar{I}_{Lt}} = \sqrt{\frac{\bar{I}_{Rt}}{\bar{I}_{Lt}}}$$

Gain Values for Visible and Near-Infrared Right Parallax Pixels $$\bar{g}_{W_{Rt}} = \frac{\bar{m}_W}{\bar{W}_{Rt}} = \sqrt{\frac{\bar{W}_N}{\bar{W}_{Rt}} \cdot \sqrt{\frac{\bar{W}_{Lt}}{\bar{W}_{Rt}}}}$$

$$\bar{g}_{l_{Rt}} = \frac{\bar{m}_I}{\bar{I}_{Rt}} = \sqrt{\frac{\bar{I}_{Lt}}{\bar{I}_{Rt}}}$$

Global Gain Correction on Visible Non-Parallax Pixels $$W'_{N\_mosaic}(x, y) = W_{N\_mosaic}(x, y) \cdot \bar{g}_{W_N} = W_{N\_mosaic}(x, y) \cdot \sqrt{\frac{\sqrt{\bar{W}_{Lt} \cdot \bar{W}_{Rt}}}{\bar{W}_N}}$$

Global Gain Correction on Visible and Near-Infrared Left Parallax Pixels $$W'_{Lt\_mosaic}(x, y) =$$

$$W_{LT\_mosaic}(x, y) \cdot \bar{g}_{W_{Lt}} = W_{Lt\_mosaic}(x, y) \cdot \sqrt{\frac{\bar{W}_N}{\bar{W}_{Lt}} \cdot \sqrt{\frac{\bar{W}_{RT}}{\bar{W}_{Lt}}}}$$

$$I'_{Lt\_mosaic}(x, y) = I_{Lt\_mosaic}(x, y) \cdot \bar{g}_{l_{Lt}} = I_{Lt\_mosaic}(x, y) \cdot \sqrt{\frac{\bar{I}_{RT}}{\bar{I}_{Lt}}}$$

Global Gain Correction on Visible and Near-Infrared Right Parallax Pixels $$W'_{Rt\_mosaic}(x, y) =$$

$$W_{RT\_mosaic}(x, y) \cdot \bar{g}_{W_{Rt}} = W_{Rt\_mosaic}(x, y) \cdot \sqrt{\frac{\bar{W}_N}{\bar{W}_{Rt}} \cdot \sqrt{\frac{\bar{W}_{LT}}{\bar{W}_{Rt}}}}$$

$$I'_{Rt\_mosaic}(x, y) = I_{Rt\_mosaic}(x, y) \cdot \bar{g}_{l_{Rt}} = I_{Rt\_mosaic}(x, y) \cdot \sqrt{\frac{\bar{I}_{LT}}{\bar{I}_{Rt}}}$$

A system of the arithmetic mean type is employed if all visible non-parallax pixels have full-open masks. A system of the geometrical mean type is employed if all visible non-parallax pixels have half-open masks. Accordingly, in the present embodiment, the arithmetic mean type is employed. In this manner, a mosaic image in which visible non-parallax pixels are corrected by a single gain coefficient, visible left parallax pixels are corrected by a single gain coefficient, visible right parallax pixels are corrected by a single gain coefficient, invisible left parallax pixels are corrected by a single gain coefficient and invisible right parallax pixels are corrected by a single gain coefficient is output as M'(x,y).

3) Generation of Tentative Visible and Invisible Parallax Images

A tentative left parallax image and a tentative right parallax image having low spatial frequency resolutions are generated for each of two color bands including visible bands and near-infrared bands. For example, simple average interpolation is performed within a signal color plane formed by gathering only left parallax pixels of a monochromatic band. For example, linear interpolation is performed according to the ratio of distances by using pixel values that are present nearby. Similarly, simple average interpolation is performed within a signal plane formed by gathering only right parallax pixels of a monochromatic band. This process is performed on two bands of W and I. Furthermore, simple average interpolation is performed within a signal plane formed by gathering only non-parallax pixels of a visible monochromatic band. That is, $W_{Lt}(x,y)$ is generated from $W_{Lt\_mosaic}(x,y)$, $W_{Rt}(x,y)$ is generated from $W_{Rt\_mosaic}(x,y)$, $R_N(x,y)$ is generated from $W_{N\_mosaic}(x,y)$, $I_{Lt}(x,y)$ is generated from $I_{Lt\_mosaic}(x,y)$, and $I_{Rt}(x,y)$ is generated from $I_{Rt\_mosaic}(x,y)$.

A tentative visible non-parallax image is denoted as $W_N(x,y)$.

A tentative visible left parallax image is denoted as $W_{Lt}(x,y)$.

A tentative visible right parallax image is denoted as $W_{Rt}(x,y)$.

A tentative near-infrared left parallax image is denoted as $I_{Lt}(x,y)$.

A tentative near-infrared right parallax image is denoted as $I_{Rt}(x,y)$.

When generating a tentative visible non-parallax image $W_N(x,y)$, direction judgment within a signal plane is preferably introduced to perform the formation at high definition. Also, in a more preferable method of interpolation, also if each of tentative parallax images is to be generated, highly symmetric pixels that are surrounded by four upper and lower, and left and right points, or four diagonal points are first interpolated by considering vertical and horizontal correlations or diagonal correlations by using the weighting ratio of the reciprocal of correlation amounts, and this manipulation is successively repeated on remaining pixels in the descending order of symmetricity.

4) Generation of Visible Non-Parallax Reference Image by Correction of Left and Right Local Illuminance Distributions (Local Gain Balance Correction)

Next, in a similar way of thinking to the global gain correction performed in Step 2), only on a visible image, pixel-by-pixel local gain correction is performed to first match the illuminance of left parallax pixels within a screen with the illuminance of right parallax pixels within the screen. This manipulation extinguishes a parallax between left and right. Then, the illuminances are matched further between a signal plane in which a left and right average has been taken and an imaging signal plane of non-parallax pixels. In this manner, a new visible non-parallax reference image plane having gains that are coordinated among all pixels is created. This is equivalent to replacing with an average value, and an intermediate image plane from which a parallax has extinguished can be made. This is denoted as $W_N(x,y)$.

At that time, a geometrical mean which takes into consideration the density ratio of non-parallax pixels and parallax pixels in an image sensor array is to be taken. That is, because the ratio among visible non-parallax pixels ($W_N$), visible left parallax pixels ($W_{Lt}$) and visible right parallax pixels ($W_{Rt}$) used in the present example is $W_N:W_{Lt}:W_{Rt}=12:1:1$, that is, $W_N:(W_{Lt}+W_{Rt})=6:1$, the weight of the 6/7-th power is given to parallax pixels, and the weight of the 1/7-th power is given to non-parallax pixels so that allocation is performed placing emphasis on highly dense non-parallax pixels.

a) In Case of Arithmetic Mean Between Left and Right Average Value of Each Pixel of Visible Band $$m_W(x,y) = [W_N(x,y)]^{\frac{6}{7}} \cdot \left[\frac{W_{Lt}(x,y) + W_{Rt}(x,y)}{2}\right]^{\frac{1}{7}}$$

Gain Value of Each Pixel for Visible Non-Parallax Pixel $$g_{W_N}(x,y) = \frac{m_W(x,y)}{W_N(x,y)} = \sqrt[7]{\frac{W_{Lt}(x,y) + W_{Rt}(x,y)}{2W_N(x,y)}}$$

Gain Value of Each Pixel for Visible Left Parallax Pixel $$g_{W_{Lt}}(x,y) = \frac{m_W(x,y)}{W_{Lt}(x,y)} = \left[\frac{W_N(x,y)}{W_{Lt}(x,y)}\right]^{\frac{6}{7}} \cdot \left[\frac{W_{Lt}(x,y) + W_{Rt}(x,y)}{2W_{Lt}(x,y)}\right]^{\frac{1}{7}}$$

Gain Value of Each Pixel for Visible Right Parallax Pixel $$g_{W_{Rt}}(x,y) = \frac{m_W(x,y)}{W_{Rt}(x,y)} = \left[\frac{W_N(x,y)}{W_{Rt}(x,y)}\right]^{\frac{6}{7}} \cdot \left[\frac{W_{Lt}(x,y) + W_{Rt}(x,y)}{2W_{Rt}(x,y)}\right]^{\frac{1}{7}}$$

Local Gain Correction of Each Pixel for Visible Non-Parallax Pixel $$W_N(x,y) \cdot g_{W_N}(x,y) = m_W(x,y)$$

Local Gain Correction of Each Pixel for Visible Left Parallax Pixel $$W_{Lt}(x,y) \cdot g_{W_{Lt}}(x,y) = m_W(x,y)$$

Local Gain Correction of Each Pixel for Visible Right Parallax Pixel $$W_{Rt}(x,y) \cdot g_{W_{Rt}}(x,y) = m_W(x,y)$$

b) In Case of Geometrical Mean Between Left and Right Average Value of Each Pixel of Visible Band $$m_W(x,y) = [W_N(x,y)]^{\frac{6}{7}} \cdot \left[\sqrt{W_{Lt}(x,y) \cdot W_{Rt}(x,y)}\right]^{\frac{1}{7}}$$

Gain Value of Each Pixel for Visible Non-Parallax Pixel $$g_{W_N}(x,y) = \frac{m_W(x,y)}{W_N(x,y)} = \sqrt[7]{\frac{\sqrt{W_{Lt}(x,y) \cdot W_{Rt}(x,y)}}{W_N(x,y)}}$$

Gain Value of Each Pixel for Visible Left Parallax Pixel $$g_{W_{Lt}}(x, y) = \frac{m_W(x, y)}{W_{Lt}(x, y)} = \left[\frac{W_N(x, y)}{W_{Lt}(x, y)}\right]^{\frac{6}{7}} \cdot \left[\sqrt{\frac{W_{Rt}(x, y)}{W_{Lt}(x, y)}}\right]^{\frac{1}{7}}$$

Gain Value of Each Pixel for Visible Right Parallax Pixel $$g_{W_{Rt}}(x, y) = \frac{m_W(x, y)}{W_{Rt}(x, y)} = \left[\frac{W_N(x, y)}{W_{Rt}(x, y)}\right]^{\frac{6}{7}} \cdot \left[\sqrt{\frac{W_{Lt}(x, y)}{W_{Rt}(x, y)}}\right]^{\frac{1}{7}}$$

Local Gain Correction of Each Pixel for Visible Non-Parallax Pixel $W_N(x,y) \cdot g_{W_N}(x,y) = m_W(x,y)$ Local Gain Correction of Each Pixel for Visible Left Parallax Pixel $W_{Lt}(x,y) \cdot g_{W_{Lt}}(x,y) = m_W(x,y)$ Local Gain Correction of Each Pixel for Visible Right Parallax Pixel $W_{Rt}(x,y) \cdot g_{W_{Rt}}(x,y) = m_W(x,y)$ In this manner, with a pixel value obtained as the average value between an average value of a left-viewpoint visible image and a right-viewpoint visible image and a non-parallax visible reference viewpoint image as a new visible non-parallax pixel value, data of a visible single band plane is rewritten to output an image $W_N(x,y)$ of a visible non-parallax single band plane.

In addition to the contents described about Step 5) of Example 2, a process of correcting visible non-parallax images by using a correlation between a visible light plane and a near-infrared light plane of a single band may be added. Which of the processes is to be used is based on the description of next Step 6).

In Case of Fixed-Ratio a) Parallax Modulation Using Arithmetic Mean as Reference Point $$W'(x, y) = W(x, y) \cdot \frac{\frac{I_{Lt}(x, y) + I_{Rt}(x, y)}{2}}{\left(\frac{I_{Lt}(x, y) + I_{Rt}(x, y)}{2}\right)}$$

b) Parallax Modulation Using Geometrical Mean as Reference Point $$W'(x, y) = W(x, y) \cdot \frac{\sqrt{I_{Lt}(x, y) \cdot I_{Rt}(x, y)}}{\left(\sqrt{I_{Lt}(x, y) \cdot I_{Rt}(x, y)}\right)}$$

In Case of Fixed-Difference $$W'(x, y) = W(x, y) + \frac{I_{Lt}(x, y) + I_{Rt}(x, y)}{2} - \left(\frac{I_{Lt}(x, y) + I_{Rt}(x, y)}{2}\right)$$

5) Generation of Invisible Non-Parallax Reference Image

Next, a 2D image in the near-infrared wavelength band in invisible light at high definition is generated. The image to be generated is denoted as $I_N(x,y)$. If they are not to be generated at particularly high definition, these are obtained by the following equation.

$$I_N(x, y) = \frac{I_{Lt}(x, y) + I_{Rt}(x, y)}{2}$$

However, the following correction may be performed to make an invisible image a high-resolution image.

There are two possible operations as methods for correction. They are one that is used in a case of fixed-ratio, and one that is used in a case of fixed-difference.

In a case of fixed-ratio, a system of the arithmetic mean type is employed if all visible non-parallax pixels have full-open masks. A system of the geometrical mean type is employed if all visible non-parallax pixels have half-open masks. Accordingly, in a case of fixed-ratio, the arithmetic mean type is employed in the present embodiment.

In Case of Fixed-Ratio a) In Case of Arithmetic Mean Between Left and Right $$I_N(x, y) = \frac{I_{Lt}(x, y) + I_{Rt}(x, y)}{2} \cdot \frac{W_N(x, y)}{\frac{W_{Lt}(x, y) + W_{Rt}(x, y)}{2}}$$

b) In Case of Geometrical Mean Between Left and Right $$I_N(x, y) = \sqrt{I_{Lt}(x, y) \cdot I_{Rt}(x, y)} \cdot \frac{W_N(x, y)}{\sqrt{W_{Lt}(x, y) \cdot W_{Rt}(x, y)}}$$

In Case of Fixed-Difference $$I_N(x, y) = \frac{I_{Lt}(x, y) + I_{Rt}(x, y)}{2} + \left(W_N(x, y) - \frac{W_{Lt}(x, y) + W_{Rt}(x, y)}{2}\right)$$

6) Generation of Actual Visible and Invisible Parallax Images

About visible images, by using the tentative visible left parallax image $W_{Lt}(x,y)$ having low resolving power generated at Step 3), and the visible non-parallax image $W_N(x,y)$ having high resolving power generated in intermediate processing at Step 4), a visible left parallax image $W_{Lt}'(x,y)$ having high resolving power to be actually output is generated. Similarly, by using the tentative visible right parallax image $W_{Rt}(x,y)$ having low resolving power generated at Step 3), and the visible non-parallax image $W_N(x,y)$ having high resolving power generated in intermediate processing at Step 4), a visible right parallax image $W_{Rt}'(x,y)$ having high resolving power to be actually output is generated.

Also about invisible images, by using the tentative invisible right parallax image $I_{Lt}(x,y)$ having low resolving power generated at Step 3), and the invisible non-parallax image $I_N(x,y)$ having high resolving power generated in intermediate processing at Step 5), an invisible right parallax image $I_{Lt}'(x,y)$ having high resolving power to be actually output is generated. Similarly, by using the tentative invisible right parallax image $I_{Rt}(x,y)$ having low resolving power generated at Step 3), and the invisible non-parallax image $I_N(x,y)$ having high resolving power generated in intermediate processing at Step 5), an invisible right parallax image $I_{Rt}'(x,y)$ having high resolving power to be actually output is generated.

As parallax modulation systems, there are two possible manners which are a method of using an arithmetic mean as a reference point and a method of using a geometrical mean as a reference point. Although both of them can provide a parallax modulation effect, if aperture masks of non-parallax pixels of an image sensor are fully open, a system of using an arithmetic mean as a reference point is employed, and if aperture masks of non-parallax pixels are half open like parallax pixels, a system of using a geometrical mean as a reference point is employed. Accordingly, in the present embodiment, a system of using an arithmetic mean as a reference point is used.

In Case of Fixed-Ratio a) Parallax Modulation Using Arithmetic Mean as Reference Point Left Parallax Modulation $$W'_{Lt}(x, y) = W_N(x, y) \cdot \sqrt{\frac{2W_{Lt}(x, y)}{W_{Lt}(x, y) + W_{Rt}(x, y)}} \cdot \sqrt{\frac{2I_{Lt}(x, y)}{I_{Lt}(x, y) + I_{Rt}(x, y)}}$$

$$I'_{Lt}(x, y) = I_N(x, y) \cdot \sqrt{\frac{2W_{Lt}(x, y)}{W_{Lt}(x, y) + W_{Rt}(x, y)}} \cdot \sqrt{\frac{2I_{Lt}(x, y)}{I_{Lt}(x, y) + I_{Rt}(x, y)}}$$

Right Parallax Modulation $$W'_{Rt}(x, y) = W_N(x, y) \cdot \sqrt{\frac{2W_{Rt}(x, y)}{W_{Lt}(x, y) + W_{Rt}(x, y)}} \cdot \sqrt{\frac{2I_{Rt}(x, y)}{I_{Lt}(x, y) + I_{Rt}(x, y)}}$$

$$I'_{Rt}(x, y) = I_N(x, y) \cdot \sqrt{\frac{2W_{Rt}(x, y)}{W_{Lt}(x, y) + W_{Rt}(x, y)}} \cdot \sqrt{\frac{2I_{Rt}(x, y)}{I_{Lt}(x, y) + I_{Rt}(x, y)}}$$

b) Parallax Modulation Using Geometrical Mean as Reference Point

Left Parallax Modulation $$W'_{Lt}(x, y) = W_N(x, y) \cdot \sqrt{\sqrt{\frac{W_{Lt}(x, y)}{W_{Rt}(x, y)}}} \cdot \sqrt{\sqrt{\frac{I_{Lt}(x, y)}{I_{Rt}(x, y)}}}$$

$$I'_{Lt}(x, y) = I_N(x, y) \cdot \sqrt{\sqrt{\frac{W_{Lt}(x, y)}{W_{Rt}(x, y)}}} \cdot \sqrt{\sqrt{\frac{I_{Lt}(x, y)}{I_{Rt}(x, y)}}}$$

Right Parallax Modulation $$W'_{Rt}(x, y) = W_N(x, y) \cdot \sqrt{\sqrt{\frac{W_{Rt}(x, y)}{W_{Lt}(x, y)}}} \cdot \sqrt{\sqrt{\frac{I_{Rt}(x, y)}{I_{Lt}(x, y)}}}$$

$$I'_{Rt}(x, y) = I_N(x, y) \cdot \sqrt{\sqrt{\frac{W_{Rt}(x, y)}{W_{Lt}(x, y)}}} \cdot \sqrt{\sqrt{\frac{I_{Rt}(x, y)}{I_{Lt}(x, y)}}}$$

In Case of Fixed-Difference

Left Parallax Modulation $$W'_{Lt}(x, y) = W_N(x, y) + \frac{1}{2} \cdot \frac{W_{Lt}(x, y) - W_{Rt}(x, y)}{2} + \frac{1}{2} \cdot \frac{I_{Lt}(x, y) - I_{Rt}(x, y)}{2}$$

-continued $$I'_{Lt}(x, y) = I_N(x, y) + \frac{1}{2} \cdot \frac{W_{Lt}(x, y) - W_{Rt}(x, y)}{2} + \frac{1}{2} \cdot \frac{I_{Lt}(x, y) - I_{Rt}(x, y)}{2}$$

Right parallax modulation $$W'_{Rt}(x, y) = W_N(x, y) + \frac{1}{2} \cdot \frac{W_{Rt}(x, y) - W_{Lt}(x, y)}{2} + \frac{1}{2} \cdot \frac{I_{Rt}(x, y) - I_{Lt}(x, y)}{2}$$

$$I'_{Rt}(x, y) = I_N(x, y) + \frac{1}{2} \cdot \frac{W_{Rt}(x, y) - W_{Lt}(x, y)}{2} + \frac{1}{2} \cdot \frac{I_{Rt}(x, y) - I_{Lt}(x, y)}{2}$$

7) Conversion of Visible and Invisible Images into Output Color Space

The thus-obtained high resolution visible non-parallax image $W_N(x,y)$, high resolution visible left parallax image $W_{Lt}'(x,y)$, high resolution visible right parallax image $W_{Rt}'(x,y)$, high resolution invisible non-parallax image $I_N(x,y)$, high resolution invisible left parallax image $I_{Lt}'(x,y)$, and high resolution invisible right parallax image $I_{Rt}'(x,y)$ are respectively subjected to appropriate gamma conversion and output as images in an output space.

Example 4

A camera system is explained as an imaging device to obtain the most effective action of positions of image-formed planes of visible light and near-infrared light being different from each other as explained with reference to Examples 2 and 3. That is, a camera on which the image sensors described with reference to Example 2 or 3 is incorporated into a generally used optical system for example, a system including a single-lens reflex replaceable lens, and furthermore, an auto focusing function of the camera uses a conventional visible light auto focusing function as it is, and focuses on a main subject of visible light. In doing so, the image processing described with reference to Example 2 or 3 is executed by software within the camera or on an external computer. Here, what is important is that the camera is controlled to focus at a position at which an image of visible light is formed on an imaging plane, and that about near-infrared light, blurring information is captured simultaneously in an amount defined by characteristics of the optical system. This blurring information always provides a shift relative to visible light within a fixed range no matter what optical system is used. Because of this, visible light stereoscopic images that are friendliest to human eyes are generated, and one can enjoy the stereoscopic images which do not cause headache to him/her even if he/she sees or watches them for a long time.

Although in the explanation provided above, the developing method for the array of FIG. 8 was explained, the developing method for the array of FIG. 9 is the same as those of Example 1 and Example 2 previously explained. Also, although an example about the near-infrared wavelength bands as the invisible wavelength band was shown, the near-ultraviolet wavelength band may also be used. Also, instead of a combination of the near-infrared three bands, but the near-infrared bands and the near-ultraviolet bands may be combined.

About Step 5) in Example 2, it was explained that visible non-parallax reference images are subjected to correction by using invisible image information to generate a 2D color image. A case of a visible single band and an invisible single band in Example 3 also was explained similarly in Step 4). All of these are explanations by using image sensors whose invisible pixels are configured only with parallax pixels, but it has been known experimentally that not only the explained effect of complementing insufficiency of sampling, but a beneficial effect can be always achieved between visible and invisible images of 2D images, irrespective of presence or absence of parallax pixels. The reasons for this are explained next.

Figure 13:
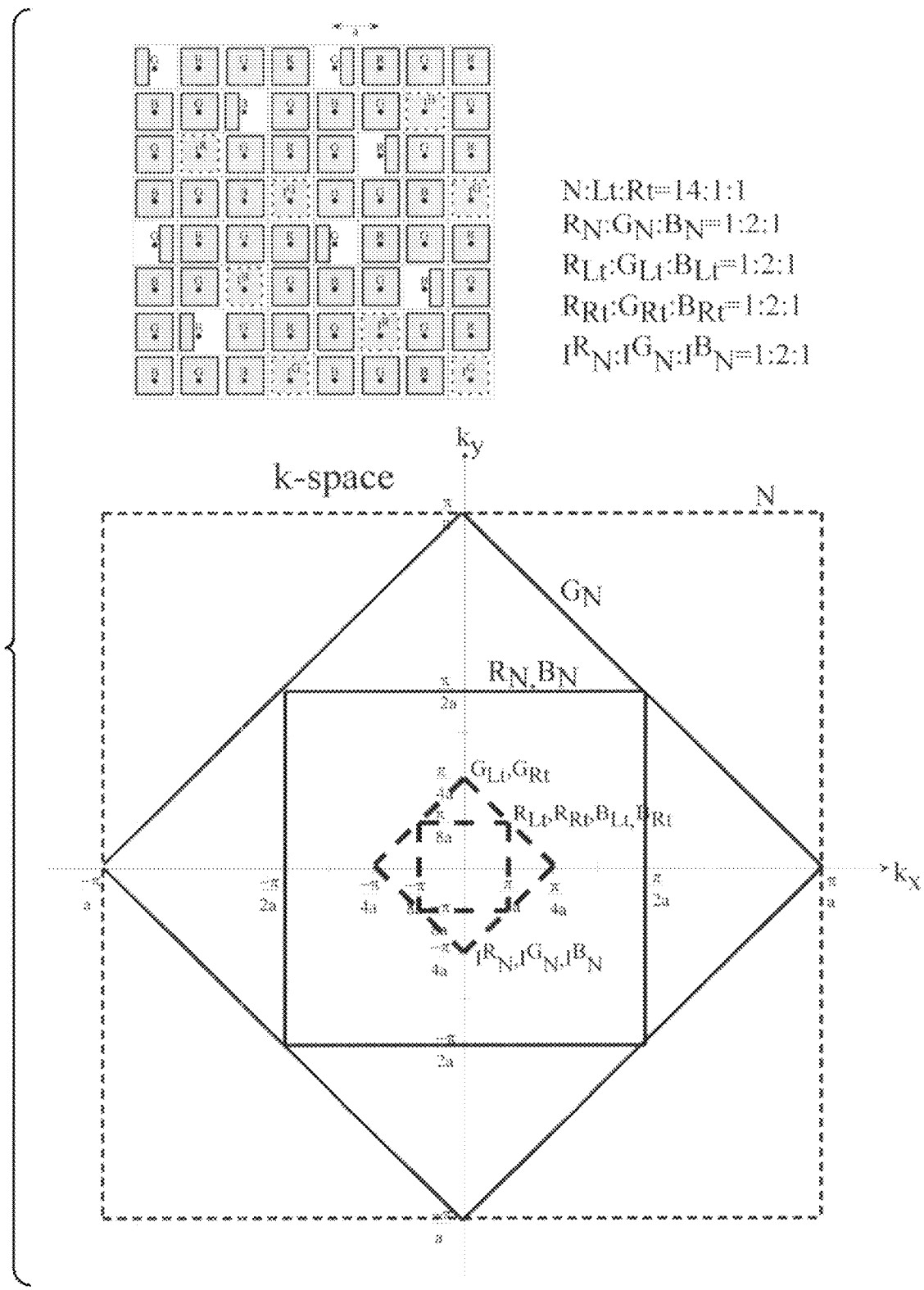
FIG. 13 is a figure that illustrates a real-space array as one example of a pixel array, and a k-space.

FIG. 13 is a figure that illustrates a real-space array as one example of a pixel array, and a k-space.

In the example shown, image sensors are periodically arranged according to, as the primitive lattice, the array diagram shown on the upper portion in FIG. 13. The frequency resolution region of its reciprocal lattice space also shows combinations of respective colors and respective parallaxes. Here, a case where invisible pixels are configured not entirely with parallax pixels, but with non-parallax pixels in the array of FIG. 8 explained with reference to Examples 1 and 2 is shown. Correspondence equations of the operation equations performed at Step 5) of Example 2 on such a pixel array are described.

In Case of Fixed-Ratio $$R'(x,y) = R(x,y) \cdot \sqrt[4]{\frac{I_N^R(x,y)}{\langle I_N^R(x,y)\rangle}} \cdot \sqrt{\frac{I_N^G(x,y)}{\langle I_N^G(x,y)\rangle}} \cdot \sqrt[4]{\frac{I_N^B(x,y)}{\langle I_N^B(x,y)\rangle}}$$

$$G'(x,y) = G(x,y) \cdot \sqrt[4]{\frac{I_N^R(x,y)}{\langle I_N^R(x,y)\rangle}} \cdot \sqrt{\frac{I_N^G(x,y)}{\langle I_N^G(x,y)\rangle}} \cdot \sqrt[4]{\frac{I_N^B(x,y)}{\langle I_N^B(x,y)\rangle}}$$

$$B'(x,y) = B(x,y) \cdot \sqrt[4]{\frac{I_N^R(x,y)}{\langle I_N^R(x,y)\rangle}} \cdot \sqrt{\frac{I_N^G(x,y)}{\langle I_N^G(x,y)\rangle}} \cdot \sqrt[4]{\frac{I_N^B(x,y)}{\langle I_N^B(x,y)\rangle}}$$

In Case of Fixed-Difference $$R'(x,y) = R(x,y) + \frac{1}{4}(I_N^R(x,y) - \langle I_N^R(x,y)\rangle) +$$
$$\frac{1}{2}(I_N^G(x,y) - \langle I_N^G(x,y)\rangle) + \frac{1}{4}(I_N^B(x,y) - \langle I_N^B(x,y)\rangle)$$

$$G'(x,y) = G(x,y) + \frac{1}{4}(I_N^R(x,y) - \langle I_N^R(x,y)\rangle) +$$
$$\frac{1}{2}(I_N^G(x,y) - \langle I_N^G(x,y)\rangle) + \frac{1}{4}(I_N^B(x,y) - \langle I_N^B(x,y)\rangle)$$

$$B'(x,y) = B(x,y) + \frac{1}{4}(I_N^R(x,y) - \langle I_N^R(x,y)\rangle) +$$
$$\frac{1}{2}(I_N^G(x,y) - \langle I_N^G(x,y)\rangle) + \frac{1}{4}(I_N^B(x,y) - \langle I_N^B(x,y)\rangle)$$

< > denotes a local average.

Figure 14:
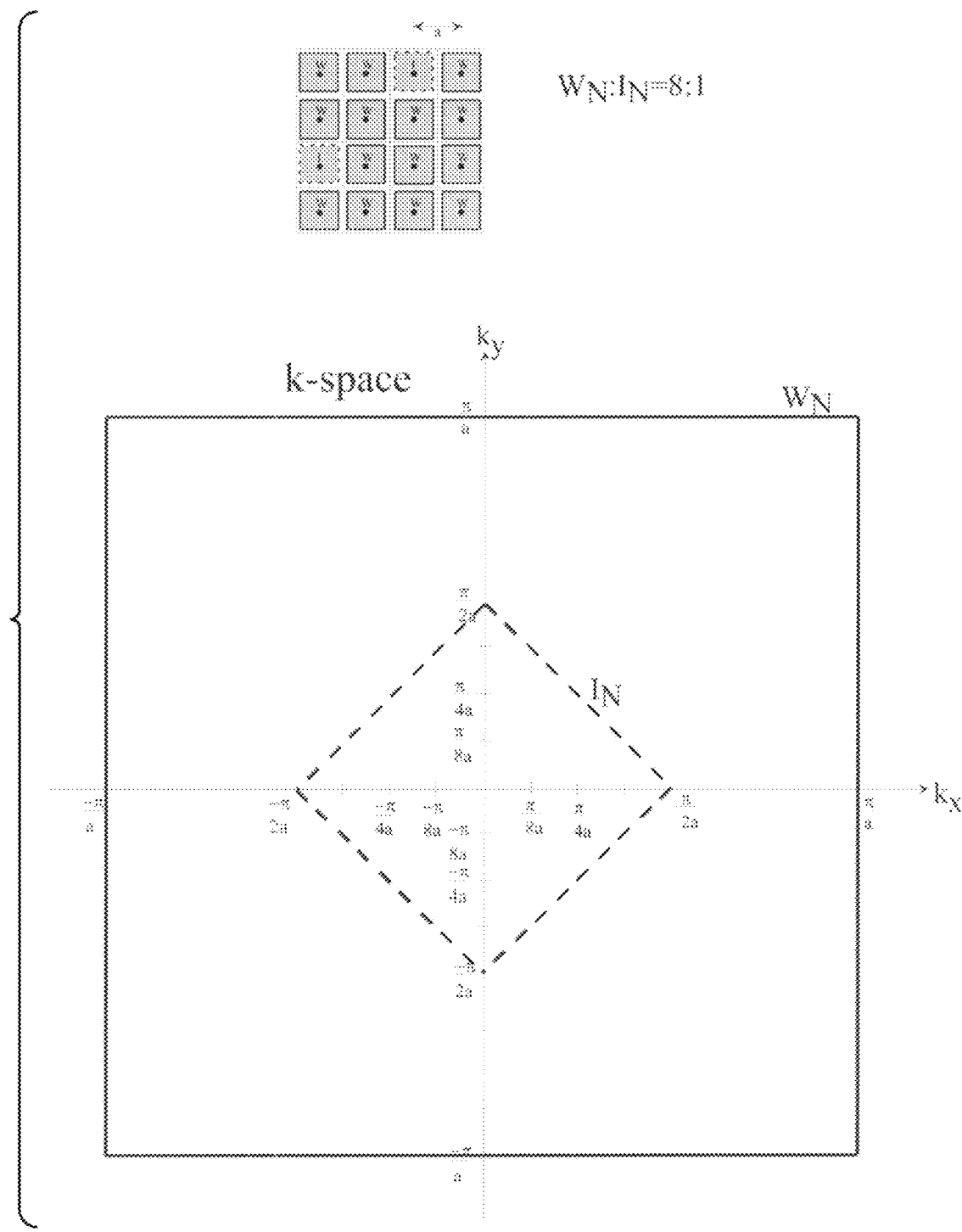
FIG. 14 is a figure that illustrates a real-space array as one example of a pixel array, and a k-space.

FIG. 14 is a figure that illustrates a real-space array as one example of a pixel array, and a k-space.

In the example shown, image sensors are periodically arranged according to, as the primitive lattice, the array diagram shown on the upper portion in FIG. 14. The frequency resolution region of its reciprocal lattice space also shows combinations of respective colors and respective parallaxes. Here, a case where invisible pixels are configured not entirely with parallax pixels, but with non-parallax pixels in the array of FIG. 12 explained with reference to Example 3 is shown. Correspondence equations of the operation equations performed at Step 4) of Example 3 on such a pixel array are described. However, in FIG. 14, parallax pixels of visible pixels also are entirely configured with non-parallax pixels.

In Case of Fixed-Ratio $$W'_N(x,y) = W_N(x,y) \cdot \frac{I_N(x,y)}{\langle I_N(x,y)\rangle}$$

In Case of Fixed-Difference $$W'_N(x,y) = W_N(x,y) + I_N(x,y) - \langle I_N(x,y)\rangle$$

More than merely compensating for insufficiency of sampling that is described above, because visible images and near-infrared images capture subject images at different focal positions, respectively, new optical information whose blurring states are different from each other is acquired. Accordingly, it has been known experimentally that despite the fact that near-infrared images provide blurred information, it has a capability of making visible images which are focused at main subjects very high resolution images. This applies also to a case, for example, where sampling is performed by image-capturing in a two panel systems for both visible images and near-infrared images about all pixels. This is because it can be assumed that an aliasing component of a subject image at a focal position by sampling is not generated in a blurred image, and correction of false information is also performed through correction information of the blurred image. Accordingly, the blurred image includes new beneficial information about subjects not included in focused images.

The concept of mutual modulation between visible images and invisible images newly taken into the image processing of the above-mentioned Examples 1 to 3 is summarized as the following relationship equation by deriving its essential portions as a relationship between images consisting only of visible single bands and invisible single bands for simplicity. However, although in the embodiments, the explanation is about an example where invisible images are generated from imaging of only parallax pixels, here, the following explanation is about an example where invisible images are generated from imaging of parallax pixels and non-parallax pixels. In order to make the explanation easy to understand, only modulation performed by using an arithmetic mean as a reference point in a case of fixed-ratio is representatively explained.

Mutual modulation between visible/invisible bands among 2D images a) Modulation Process by Near-Infrared Image on Visible Images $$W'_N(x,y) = W_N(x,y) \cdot \frac{I_N(x,y)}{\frac{I_{Lt}(x,y) + I_{Rt}(x,y)}{2}}$$

b) Modulation Process by Visible Images on Near-Infrared Image $$I'_N(x,y) = I_N(x,y) \cdot \frac{W_N(x,y)}{\frac{W_{Lt}(x,y) + W_{Rt}(x,y)}{2}}$$

Mutual parallax modulation between visible/invisible bands in generation of 3D images c) Parallax Modulation by Near-Infrared Images on Visible Images $$W'_{Lt}(x, y) = W_N(x, y) \cdot \frac{I_{Lt}(x, y)}{\frac{I_{Lt}(x, y) + I_{Rt}(x, y)}{2}}$$

d) Parallax Modulation by Invisible Images on Near-Infrared Images $$I'_{Lt}(x, y) = I_N(x, y) \cdot \frac{W_{Lt}(x, y)}{\frac{W_{Lt}(x, y) + W_{Rt}(x, y)}{2}}$$

While a new effect confirmed in mutual modulation between visible/invisible bands among 2D images is described above, it has been known experimentally that the following new action is provided by mutual parallax modulation between visible/invisible bands in generation of 3D images. That is, a situation where three objects are arranged at three near, middle and far positions is considered. If monocular stereoscopic imaging is performed by focusing with an optical system at a subject distance of the middle object by using visible light, a parallax of the object is generated as if the entire image rotates about the single axis that transverses vertically within the focal plane at which the middle object is placed. The appearance can be seen if a right parallax image and a left parallax image are displayed alternately. One near-infrared image has its focal plane around the far object because its focal position is shifted toward the far side, and a parallax that appears to image-rotate about the single axis that transverses vertically within the plane is observed between the right parallax image and the left parallax image of the near-infrared image.

Mutual parallax modulation between different bands plays a role of mutually mixing parallaxes of different rotational axes, and this results in a shift from a global parallax in which the entire image rotates like the one mentioned above to a local parallax in which an object-by-object rotation is observed. If a half of modulation is intra-band parallax modulation, and the other half is inter-band parallax modulation, a parallax of global rotation and a parallax of local rotation are obtained simultaneously. If the parallax that shows object-by-object local rotation is actually seen as a stereoscopic vision, it can be recognized normally as a stereoscopic image interestingly. However, while the absolute reference, in terms of distance sense, of the parallax that shows global rotation of the entire image can be identified, the parallax that shows object-by-object local rotation provides a special effect which allows different people to identify the absolute reference at different positions, although the distance sense can be recognized relatively. For example, trimming images in the unit of object results in images from different viewpoints being obtained for a case of only intra-band parallax modulation and for a case of using inter-band parallax modulation.

Equipment such as personal computers may be allowed to function as an image processing device that serves the functions of the image processing unit 205. In this case, the image processing device may receive outputs of image sensors from other devices such as cameras. The image processing device is not limited to a personal computer, but may take various forms. For example, TV, cellular phones, tablet terminals, game machines or the like can be the image processing device. In the above-mentioned explanation, images may sometimes refer to image data, or sometimes refer to subject images themselves that are developed and made visible according to a format. Also, although in the above-mentioned explanation, $I_1:I_2:I_3=1:2:1$ so as to make it correspond to R:G:B=1:2:1, but $I_2$ may be any value equal to or higher than 1. $I_2$ is preferably larger than 1.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: digital camera; 20: imaging lens; 21: optical axis; 100: image sensor; 101: microlens; 102: optical filter.; 103: aperture mask; 104: aperture portion; 105: wiring layer; 106: wire; 107: aperture; 108: photoelectric converting element; 109: substrate; 201: control unit; 202: A/D conversion circuit; 203: memory; 204: drive unit; 205: image processing unit; 207: memory card IF; 208: manipulation unit; 209: display unit; 210: LCD drive circuit; 220: memory card; 322: centerline; 1801: distribution curve; 1802: distribution curve; 1803: distribution curve; 1804: distribution curve; 1805: distribution curve; 1806: synthetic distribution curve; 1807: distribution curve; 1808: distribution curve; 1809: synthetic distribution curve

The invention claimed is:

1. An image sensor comprising:
   a visible parallax pixel that is associated with a visible range light-receiving photoelectric conversion pixel having any of a plurality of types of aperture mask each including an aperture that is positioned to allow passage, to a photoelectric converting element, of a mutually different partial luminous flux of an incident luminous flux in a visible light wavelength band; and
   an invisible parallax pixel that is associated with an invisible range light-receiving photoelectric conversion pixel having any of a plurality of types of aperture mask each including an aperture positioned to allow passage, to the photoelectric converting element, of a mutually different partial luminous flux in an incident luminous flux in an invisible light wavelength band, wherein
   the invisible parallax pixels are arranged at equal intervals in two-dimensional directions,
   the invisible parallax pixel is associated with any of a plurality of types of bandpass filter that allow passage of mutually different wavelength bands, and
   for each type of the associated bandpass filter, the invisible parallax pixels are arranged at equal intervals in the two-dimensional directions, and are arranged such that mutual distances between the invisible parallax pixels with which different types of the aperture masks are associated for each type of the bandpass filter are maximized, and furthermore, the visible parallax pixels are arranged at equal intervals in two-dimensional directions, the visible parallax pixel is associated with any of a plurality of types of color filter that allow passage of mutually different wavelength bands, and for each type of the associated color filter, the visible parallax pixels are arranged at equal intervals in the two-dimensional directions, and are arranged such that mutual distances between the visible parallax pixels with which different types of the aperture masks are associated for each type of the color filter are maximized.

2. The image sensor according to claim 1, wherein the invisible parallax pixels and the visible parallax pixels are arranged such that pixels having a same type of aperture mask are not adjacent to each other.

3. The image sensor according to claim 1, wherein a wavelength band of light received by the invisible parallax pixel is a wavelength band in a near-infrared range.

4. The image sensor according to claim 1, wherein a wavelength band of light received by the invisible parallax pixel is three different types of wavelength band ($I_1$, $I_2$ and $I_3$) in a near-infrared range, and a wavelength band of light received by the visible parallax pixel is three types of wavelength band of red, green and blue (R, G and B) in a visible range.

5. The image sensor according to claim 1, further comprising a non-parallax pixel that guides, to the photoelectric converting element, an incident luminous flux without being limited by the aperture, wherein for each type of the associated aperture mask, the invisible parallax pixel is arranged being sandwiched by any or all of: the invisible parallax pixel with which another one of the aperture masks is associated; the visible parallax pixel; and the non-parallax pixel, and for each type of the associated aperture mask, the visible parallax pixel is arranged being sandwiched by any or all of: the visible parallax pixel with which another one of the aperture masks is associated; the invisible parallax pixel; and the non-parallax pixel.

6. The image sensor according to claim 5, wherein the non-parallax pixel is a visible non-parallax pixel that guides the incident luminous flux in the visible light wavelength band, and is associated with a visible range light-receiving photoelectric conversion pixel.

7. The image sensor according to claim 6, wherein pixel densities of the invisible parallax pixels and the visible parallax pixels arrayed are lower than a pixel density of the visible non-parallax pixels, and a total pixel density of the invisible parallax pixels and the visible parallax pixels is lower than a pixel density of the visible non-parallax pixels.

8. The image sensor according to claim 7, wherein if the invisible parallax pixel and the visible parallax pixel respectively have two types of aperture mask which are a right parallax pixel and a left parallax pixel, a pixel density ratio of left parallax pixels and right parallax pixels relative to the visible non-parallax pixels is 6:1:1.

9. The image sensor according to claim 6, wherein the invisible parallax pixel is: associated with a bandpass filter that allows passage of any of three different types of wavelength band ($I_1$, $I_2$ and $I_3$) in an invisible range; and consists of any of an invisible left parallax pixel having a left-open aperture mask and an invisible right parallax pixel having a right-open aperture mask, the visible parallax pixel and the visible non-parallax pixel are: respectively associated with color filters that allow passage of any of three types of wavelength band of red, green and blue (R, G and B) in a visible range; and if the visible parallax pixel consists of any of a visible left parallax pixel having a left-open aperture mask and a visible right parallax pixel having a right-open aperture mask, a pixel density ratio for each wavelength band between the invisible parallax pixels is $I_1:I_2:I_3=1:2:1$ for both invisible left parallax pixels and invisible right parallax pixels, and a pixel density ratio for each wavelength band between the visible parallax pixels is R:G:B=1:2:1 for all of visible left parallax pixels, visible right parallax pixels and visible non-parallax pixels.

10. The image sensor according to claim 6, wherein in all of the visible parallax pixel, the visible non-parallax pixel and the invisible parallax pixel, photoelectric converting units are arranged at positions on a common imaging plane along an optical axis.

11. An imaging device into which the image sensor according to claim 10 is incorporated, the imaging device comprising:

one optical system that guides the incident luminous flux, wherein the image sensor has a control unit that performs auto focus control for a main subject captured by visible light at a focal position of the optical system.

12. An image sensor comprising:

a visible parallax pixel that is associated with a visible range light-receiving photoelectric conversion pixel having any of a plurality of types of aperture mask each including an aperture that is positioned to allow passage, to a photoelectric converting element, of a mutually different partial luminous flux of an incident luminous flux in a visible light wavelength band;

an invisible parallax pixel that is associated with an invisible range light-receiving photoelectric conversion pixel having any of a plurality of types of aperture mask each including an aperture positioned to allow passage, to the photoelectric converting element, of a mutually different partial luminous flux in an incident luminous flux in an invisible light wavelength band; and a non-parallax pixel that guides, to the photoelectric converting element, an incident luminous flux without being limited by the aperture, wherein for each type of the associated aperture mask, the invisible parallax pixel is arranged being sandwiched by any or all of: the invisible parallax pixel with which another one of the aperture masks is associated; the visible parallax pixel; and the non-parallax pixel, and for each type of the associated aperture mask, the visible parallax pixel is arranged being sandwiched by any or all of: the visible parallax pixel with which another one of the aperture masks is associated; the invisible parallax pixel; and the non-parallax pixel.

13. The image sensor according to claim 12, wherein the non-parallax pixel is a visible non-parallax pixel that guides the incident luminous flux in the visible light wavelength band, and is associated with a visible range light-receiving photoelectric conversion pixel.

14. The image sensor according to claim 13, wherein pixel densities of the invisible parallax pixels and the visible parallax pixels arrayed are lower than a pixel density of the visible non-parallax pixels, and a total pixel density of the invisible parallax pixels and the visible parallax pixels is lower than a pixel density of the visible non-parallax pixels.

15. The image sensor according to claim 14, wherein if the invisible parallax pixel and the visible parallax pixel respectively have two types of aperture mask which are a right parallax pixel and a left parallax pixel, a pixel density ratio of left parallax pixels and right parallax pixels relative to the visible non-parallax pixels is 6:1:1.

16. The image sensor according to claim 13, wherein the invisible parallax pixel is: associated with a bandpass filter that allows passage of any of three different types of wavelength band ($I_1$, $I_2$ and $I_3$) in an invisible range; and consists of any of an invisible left parallax pixel having a left-open aperture mask and an invisible right parallax pixel having a right-open aperture mask, the visible parallax pixel and the visible non-parallax pixel are: respectively associated with color filters that allow passage of any of three types of wavelength band of red, green and blue (R, G and B) in a visible range; and if the visible parallax pixel consists of any of a visible left parallax pixel having a left-open aperture mask and a visible right parallax pixel having a right-open aperture mask, a pixel density ratio for each wavelength band between the invisible parallax pixels is $I_1:I_2:I_3=1:2:1$ for both invisible left parallax pixels and invisible right parallax pixels, and a pixel density ratio for each wavelength band between the visible parallax pixels is R:G:B=1:2:1 for all of visible left parallax pixels, visible right parallax pixels and visible non-parallax pixels.

17. The image sensor according to claim 13, wherein in all of the visible parallax pixel, the visible non-parallax pixel and the invisible parallax pixel, photoelectric converting units are arranged at positions on a common imaging plane along an optical axis.

18. An imaging device into which the image sensor according to claim 17 is incorporated, the imaging device comprising:
one optical system that guides the incident luminous flux, wherein
the image sensor has a control unit that performs auto focus control for a main subject captured by visible light at a focal position of the optical system.

19. An imaging device comprising:
the image sensor according to claim 1; and
an image processing unit that generates, from an output of the image sensor, a plurality of visible parallax image data having parallaxes relative to one another; and a plurality of invisible parallax image data having parallaxes relative to one another.

20. An imaging device comprising:
the image sensor according to claim 12; and
an image processing unit that generates, from an output of the image sensor, a plurality of visible parallax image data having parallaxes relative to one another; and a plurality of invisible parallax image data having parallaxes relative to one another.

* * * * *